US012690381B2

(12) United States Patent
Yan et al.

(10) Patent No.: US 12,690,381 B2
(45) Date of Patent: Jul. 21, 2026

(54) ORGANOMETALLIC COMPOUND AND APPLICATION THEREOF

(71) Applicant: SICHUAN AG-RAY NEW MATERIALS CO., LTD, Meishan (CN)

(72) Inventors: Liangliang Yan, Foshan (CN); Shaofu Chen, Foshan (CN); Lei Dai, Foshan (CN); Lifei Cai, Foshan (CN)

(73) Assignee: SICHUAN AG-RAY NEW MATERIALS CO., LTD, Meishan (CN)

( * ) Notice: Subject to any disclaimer, the term of this patent is extended or adjusted under 35 U.S.C. 154(b) by 264 days.

(21) Appl. No.: 18/289,449

(22) PCT Filed: Jun. 11, 2022

(86) PCT No.: PCT/CN2022/098280
§ 371 (c)(1),
(2) Date: Nov. 3, 2023

(87) PCT Pub. No.: WO2022/262662
PCT Pub. Date: Dec. 22, 2022

(65) Prior Publication Data
US 2024/0284775 A1 Aug. 22, 2024

(30) Foreign Application Priority Data
Jun. 17, 2021 (CN) ......................... 202110670643.7
May 19, 2022 (CN) ......................... 202210543712.2

(51) Int. Cl.
*H10K 85/00* (2023.01)
*C07F 15/00* (2006.01)
*C09K 11/06* (2006.01)
*H10K 85/30* (2023.01)
*H10K 50/12* (2023.01)

(52) U.S. Cl.
CPC ......... *H10K 85/00* (2023.02); *C07F 15/0033* (2013.01); *C09K 11/06* (2013.01); *H10K 85/342* (2023.02); *C09K 2211/1029* (2013.01); *C09K 2211/1033* (2013.01); *C09K 2211/185* (2013.01); *H10K 50/12* (2023.02)

(58) Field of Classification Search
None
See application file for complete search history.

(56) References Cited

U.S. PATENT DOCUMENTS 10,270,046 B2 4/2019 Boudreault et al.
2005/0123798 A1 6/2005 Deaton et al.

FOREIGN PATENT DOCUMENTS

CN 105936640 A 9/2016
CN 107722062 A 2/2018
CN 109608503 A 4/2019
CN 110317231 A 10/2019
CN 111471450 A 7/2020

OTHER PUBLICATIONS

RN2641738-11-4, registry database compound, May 8, 2021.*

* cited by examiner

*Primary Examiner* — Sun Jae Yoo
(74) *Attorney, Agent, or Firm* — Maschoff Brennan

(57) ABSTRACT

The present invention relates to an organometallic compound and application thereof. The organometallic compound has a general formula of Ir(La)(Lb)(Lc), where La is a structure represented by Formula (1), and Lb is a structure represented by Formula (2). The compound provided by the present invention has the advantages of high optical and electrical stability, low sublimation temperature, narrow emission half-peak width, high color saturation, high luminous efficiency, long device service life and the like, and can be used in organic electroluminescent devices. In particular, the compound has the potential for application in the AMOLED industry as a red light-emitting dopant.

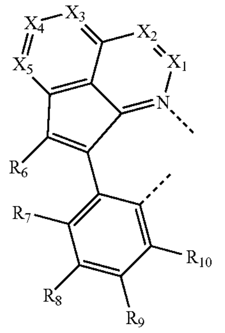

(1)

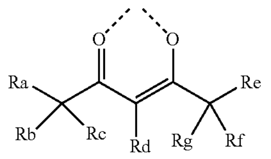

(2)

18 Claims, No Drawings

ORGANOMETALLIC COMPOUND AND APPLICATION THEREOF

TECHNICAL FIELD

The present invention relates to the technical field of organic electroluminescence, in particular to an organic light-emitting material applicable to organic electroluminescent devices, and specially relates to an organometallic compound and application thereof in an organic electroluminescent device.

BACKGROUND

At present, as a new-generation display technology, an organic electroluminescent device (OLED) has attracted more and more attention in display and lighting technologies, thus having a wide application prospect. However, compared with market application requirements, properties, such as luminous efficiency, driving voltage and service life, of the OLED still need to be strengthened and improved.

In generally, the OLED includes various organic functional material films with different functions sandwiched between metal electrodes as a basic structure, which is similar to a sandwich structure. Under the driving of a current, holes and electrons are injected from a cathode and an anode, respectively. After moving to a certain distance, the holes and the electrons are compounded in a light-emitting layer, and then released in the form of light or heat to achieve luminescence of the OLED.

However, organic functional materials are core components of the OLED, and the thermal stability, photochemical stability, electrochemical stability, quantum yield, film forming stability, crystallinity, color saturation and the like of the materials are main factors affecting properties of the device.

Generally, the organic functional materials include fluorescent materials and phosphorescent materials. The fluorescent materials are usually organic small-molecule materials, which can only utilize 25% of a singlet state for luminescence, so that the luminous efficiency is relatively low. Meanwhile, due to an earth-spin orbit coupling effect caused by a heavy atom effect, the phosphorescent materials can utilize 25% of a singlet state and can also utilize 75% of the energy of triplet excitons, so that the luminous efficiency can be improved. However, compared with the fluorescent materials, the phosphorescent materials are developed later, and the thermal stability, service life, color saturation and the like of the materials need to be improved. Thus, the phosphorescent materials have become a challenging topic. Various organometallic compounds have been developed to serve as the phosphorescent materials. For example, a patent document (US20050123798) discloses an iridium-based complex with indole as a ligand

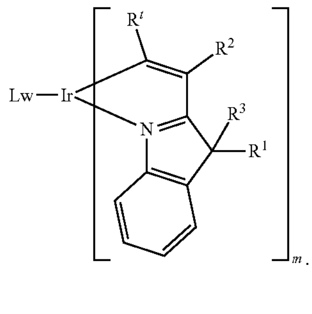

Although the material has a good red emission wavelength, the low device luminous efficiency and color saturation of the material need to be further improved, so as to meet display demands of DCIP3 or even BT2020. A patent document (CN107722062) discloses an iridium-platinum complex composed of acenaphthylene as a unit

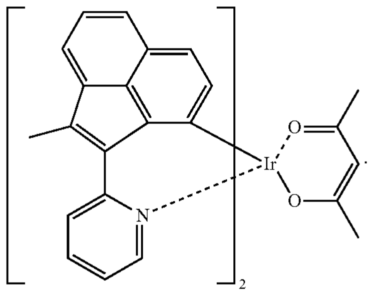

The material emits blue or green light. A patent document (CN110317231) discloses a metal complex composed of acenaphthylene as a unit

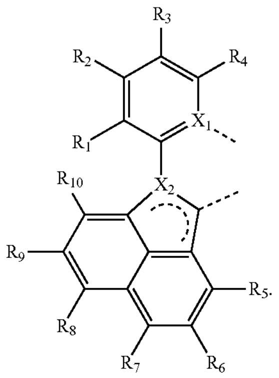

The material emits dark blue light. In order to meet the market demands for higher stability, longer service life, higher saturated color purity and higher luminous efficiency, more new materials need to be developed to meet increasing technical demands of the market.

SUMMARY

In order to overcome the above disadvantages, the present invention provides an organic electroluminescent device with high properties and an organometallic compound material capable of realizing the organic electroluminescent device.

The organometallic compound of the present invention has a general formula of Ir(La)(Lb)(Lc), where La is a structure represented by Formula (1), and Lb is a structure represented by Formula (2). The iridium complex provided by the present invention has the advantages of high optical and electrical stability, low sublimation temperature, narrow emission half-peak width, high color saturation, high luminous efficiency, long device service life and the like, and can be used in organic electroluminescent devices. In particular, the compound has the potential for application in the AMOLED industry as a red light-emitting dopant, especially in display, lighting and automobile taillights.

An organometallic compound has a general formula of Ir(La)(Lb)(Lc), where La is a structure represented by Formula (1):

(1)

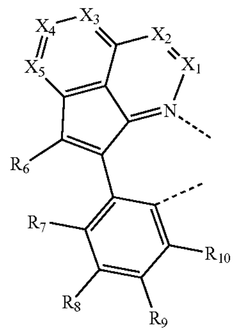

where dotted lines refer to positions connected to the metal Ir;

$X_1$ is N or $CR_1$, $X_2$ is N or $CR_2$, $X_3$ is N or $CR_3$, $X_4$ is N or $CR_4$, and $X_5$ is N or $CR_5$;

at most one of the $X_1$-$X_5$ is N, and when the $X_1$-$X_5$ are $CR_1$-$CR_5$, at least one of the $R_1$-$R_5$ is not H;

$R_1$-$R_{10}$ are independently selected from hydrogen, deuterium, halogen, cyano, hydroxyl, sulfhydryl, amino, substituted or unsubstituted $C_1$-$C_{10}$ alkyl, substituted or unsubstituted $C_1$-$C_{10}$ heteroalkyl, substituted or unsubstituted $C_3$-$C_{20}$ cycloalkyl, substituted or unsubstituted $C_2$-$C_{10}$ alkenyl, substituted or unsubstituted $C_2$-$C_{10}$ alkynyl, substituted or unsubstituted $C_6$-$C_{18}$ aryl, substituted or unsubstituted $C_2$-$C_{17}$ heteroaryl, substituted or unsubstituted tri-$C_1$-$C_{10}$ alkyl silyl, substituted or unsubstituted tri-$C_6$-$C_{12}$ aryl silyl, substituted or unsubstituted di-$C_1$-$C_{10}$ alkyl mono-$C_6$-$C_{30}$ aryl silyl, and substituted or unsubstituted mono-$C_1$-$C_{10}$ alkyl di-$C_6$-$C_{30}$ aryl silyl, or any two adjacent groups of the $R_1$-$R_6$ or $R_7$-$R_{10}$ may be connected to each other to form an aliphatic ring structure or an aromatic ring structure; at least one of the $R_7$-$R_{10}$ is not hydrogen; the "substituted" refers to substitution with deuterium, F, Cl, Br, $C_1$-$C_6$ alkyl, $C_3$-$C_6$ cycloalkyl, amino substituted with $C_1$-$C_6$ alkyl, cyano, isocyano, or phosphino, and the substitution ranges from a single substitution number to a maximum substitution number;

and the heteroalkyl and the heteroaryl at least contain one O, N or S heteroatom;

Lb is a structure represented by Formula (2):

(2)

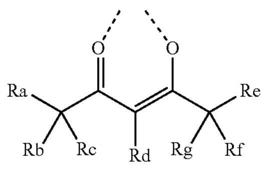

where dotted lines refer to positions connected to the metal Ir;

Ra-Rg are independently selected from hydrogen, deuterium, halogen, substituted or unsubstituted $C_1$-$C_{10}$ alkyl, substituted or unsubstituted $C_3$-$C_{20}$ cycloalkyl, substituted or unsubstituted $C_1$-$C_{10}$ heteroalkyl, and substituted or unsubstituted $C_3$-$C_{20}$ heterocyclic alkyl; or any two of Ra, Rb and Rc are connected to form an aliphatic ring structure, and any two of Re, Rf and Rg are connected o form an aliphatic ring structure; the "substituted" refers to substitution with deuterium, F, Cl, Br, $C_1$-$C_4$ alkyl, $C_1$-$C_4$ alkoxyl, $C_3$-$C_6$ cycloalkyl, amino substituted with $C_1$-$C_4$ alkyl, cyano, isocyano, or phosphino;

and the heteroalkyl and the heterocyclic alkyl at least contain one O, N or S heteroatom;

Lc is a monoanionic bidentate ligand, and the Lc is different from the Lb and is not an OO ligand;

the Lc and the La are the same or different, and the different indicates different parent nuclear structures, a same parent nuclear structure with different substituents, or a same parent nuclear structure with different substituent positions;

and any two or three of the La, the Lb and the Lc are connected to each other to form a polydentate ligand.

As a optional organometallic compound, the La is a structure represented by Formula (3):

(3)

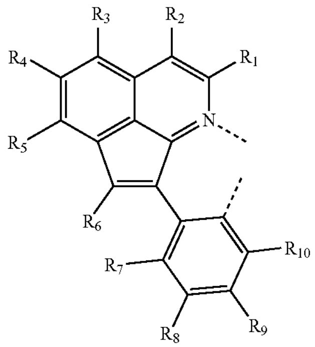

where dotted lines refer to positions connected to the metal Ir;

$R_1$-$R_{10}$ are independently selected from hydrogen, deuterium, halogen, cyano, hydroxyl, sulfhydryl, amino, substituted or unsubstituted $C_1$-$C_{10}$ alkyl, substituted or unsubstituted $C_1$-$C_{10}$ heteroalkyl, substituted or unsubstituted $C_3$-$C_{20}$ cycloalkyl, substituted or unsubstituted $C_2$-$C_{10}$ alkenyl, substituted or unsubstituted $C_2$-$C_{10}$ alkynyl, substituted or unsubstituted $C_6$-$C_{18}$ aryl, substituted or unsubstituted $C_2$-$C_{17}$ heteroaryl, substituted or unsubstituted tri-$C_1$-$C_{10}$ alkyl silyl, substituted or unsubstituted tri-$C_6$-$C_{12}$ aryl silyl, substituted or unsubstituted di-$C_1$-$C_{10}$ alkyl mono-$C_6$-$C_{30}$ aryl silyl, and substituted or unsubstituted mono-$C_1$-$C_{10}$ alkyl di-$C_6$-$C_{30}$ aryl silyl;

or any two adjacent groups of the $R_1$-$R_6$ or $R_7$-$R_{10}$ may be connected to each other to form an aliphatic ring structure or an aromatic ring structure;

at least one of the $R_7$-$R_{10}$ is not hydrogen;

the heteroalkyl and the heteroaryl at least contain one O, N or S heteroatom;

and the "substituted" refers to substitution with deuterium, F, Cl, Br, $C_1$-$C_6$ alkyl, $C_3$-$C_6$ cycloalkyl, amino substituted with $C_1$-$C_6$ alkyl, cyano, isocyano, or phosphino, and the substitution ranges from a single substitution number to a maximum substitution number.

In Formula (3), the $R_1$ and/or the $R_4$ and/or the $R_5$ is not hydrogen.

In Formula (3), the $R_2$ and the $R_3$ are hydrogen.

In Formula (3), the $R_1$, the $R_4$ and the $R_5$ are independently selected from deuterium, halogen, substituted or unsubstituted $C_1$-$C_6$ alkyl, and substituted or unsubstituted $C_3$-$C_{10}$ cycloalkyl, and the "substituted" refers to substitution with deuterium, F, Cl, Br, or $C_1$-$C_4$ alkyl.

In Formula (3), the $R_6$ is selected from deuterium, halogen, substituted or unsubstituted $C_1$-$C_6$ alkyl, and substituted or unsubstituted $C_3$-$C_{10}$ cycloalkyl; and the $R_8$ and/or the $R_{10}$ is not hydrogen.

In Formula (3), the $R_5$ and the $R_{10}$ are independently selected from substituted or unsubstituted $C_1$-$C_6$ alkyl, and substituted or unsubstituted $C_3$-$C_{10}$ cycloalkyl, and the "substituted" refers to substitution with deuterium, F, Cl, Br, or $C_1$-$C_4$ alkyl.

In Formula (3), the $R_7$ and the $R_9$ are H.

The $R_7$ and the $R_8$, the $R_5$ and the $R_9$, or the $R_9$ and the $R_{10}$ are connected to each other to form a structure represented by Formula (4):

(4)

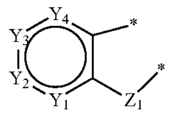

where * indicates a connecting position;

$Y_1$-$Y_4$ are independently $CR_0$ or N;

Z1 is selected from O and S;

$R_0$ is independently hydrogen, deuterium, halogen, cyano, substituted or unsubstituted $C_1$-$C_{10}$ alkyl, substituted or unsubstituted $C_3$-$C_{20}$ cycloalkyl, substituted or unsubstituted $C_2$-$C_{30}$ alkenyl, substituted or unsubstituted $C_2$-$C_{30}$ alkynyl, substituted or unsubstituted $C_6$-$C_{30}$ aryl, substituted or unsubstituted $C_1$-$C_{30}$ heteroaryl, substituted or unsubstituted tri-$C_1$-$C_{10}$ alkyl silyl, substituted or unsubstituted tri-$C_6$-$C_{30}$ aryl silyl, or substituted or unsubstituted di-$C_1$-$C_{10}$ alkyl mono-$C_6$-$C_{30}$ aryl silyl; and the "substituted" refers to substitution with deuterium, F, Cl, Br, $C_1$-$C_4$ alkyl, $C_1$-$C_4$ alkoxyl, $C_3$-$C_6$ cycloalkyl, amino substituted with $C_1$-$C_4$ alkyl, cyano, isocyano, or phosphino.

In Formula (4), the $Y_1$-$Y_4$ are independently $CR_0$, the Z1 is selected from O, and the $R_0$ is independently hydrogen, deuterium, halogen, substituted or unsubstituted $C_1$-$C_6$ alkyl, or substituted or unsubstituted $C_3$-$C_{10}$ cycloalkyl; and the "substituted" refers to substitution with deuterium, F, Cl, Br, or $C_1$-$C_4$ alkyl.

The Lc and the La are the same.

The Lc is a structure represented by Formula (5):

(5)

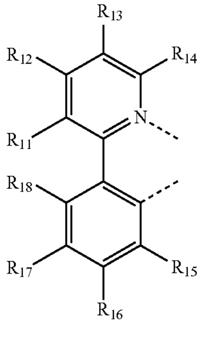

where dotted lines refer to positions connected to the metal Ir;

$R_{11}$-$R_{18}$ are independently selected from hydrogen, deuterium, halogen, cyano, hydroxyl, amino group, amino, substituted or unsubstituted $C_1$-$C_{10}$ alkyl, substituted or unsubstituted $C_1$-$C_{10}$ heteroalkyl, substituted or unsubstituted $C_3$-$C_{20}$ cycloalkyl, substituted or unsubstituted $C_2$-$C_{10}$ alkenyl, substituted or unsubstituted $C_2$-$C_{10}$ alkynyl, substituted or unsubstituted $C_6$-$C_{18}$ aryl, substituted or unsubstituted $C_2$-$C_{17}$ heteroaryl, substituted or unsubstituted tri-$C_1$-$C_{10}$ alkyl silyl, substituted or unsubstituted tri-$C_6$-$C_{12}$ aryl silyl, substituted or unsubstituted di-$C_1$-$C_{10}$ alkyl mono-$C_6$-$C_{30}$ aryl silyl, and substituted or unsubstituted mono-$C_1$-$C_{10}$ alkyl di-$C_6$-$C_{30}$ aryl silyl; at least two of the $R_{15}$-$R_{18}$ are not hydrogen;

at least two adjacent groups of the $R_{11}$-$R_{14}$ form aromatic ring structure represented by the following Formula (6):

(6)

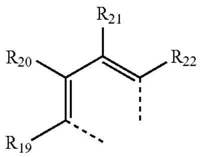

where dotted lines refer to positions connected to a pyridine ring;

$R_{19}$-$R_{22}$ are independently selected from hydrogen, deuterium, halogen, cyano, substituted or unsubstituted $C_1$-$C_{10}$ alkyl, substituted or unsubstituted $C_1$-$C_{10}$ heteroalkyl, substituted or unsubstituted $C_3$-$C_{20}$ cycloalkyl, substituted or unsubstituted $C_2$-$C_{10}$ alkenyl, substituted or unsubstituted $C_2$-$C_{10}$ alkynyl, substituted or unsubstituted $C_6$-$C_{18}$ aryl, substituted or unsubstituted $C_2$-$C_{17}$ heteroaryl, substituted or unsubstituted tri-$C_1$-$C_{10}$ alkyl silyl, substituted or unsubstituted tri-$C_6$-$C_{12}$ aryl silyl, substituted or unsubstituted di-$C_1$-$C_{10}$ alkyl mono-$C_6$-$C_{30}$ aryl silyl, and substituted or unsubstituted mono-$C_1$-$C_{10}$ alkyl di-$C_6$-$C_{30}$ aryl silyl, or any two adjacent groups of the $R_{19}$-$R_{22}$ are connected to each other to form an aliphatic ring structure or an aromatic ring structure;

and the "substituted" refers to substitution with deuterium, F, Cl, Br, $C_1$-$C_4$ alkyl, $C_1$-$C_4$ alkoxyl, $C_3$-$C_6$ cycloalkyl, amino substituted with $C_1$-$C_4$ alkyl, cyano, isocyano, or phosphino.

The $R_{15}$ and the $R_{17}$ are deuterium, halogen, substituted or unsubstituted $C_1$-$C_6$ alkyl, or substituted or unsubstituted $C_3$-$C_{10}$ cycloalkyl, two adjacent groups of the $R_{11}$-$R_{14}$ form an aromatic ring structure represented by Formula (6), and the other two groups are independently selected from hydrogen, deuterium, halogen, substituted or unsubstituted $C_1$-$C_6$ alkyl, and substituted or unsubstituted $C_3$-$C_{10}$ cycloalkyl;

the $R_{19}$-$R_{22}$ are independently selected from hydrogen, deuterium, halogen, substituted or unsubstituted $C_1$-$C_6$ alkyl, and substituted or unsubstituted $C_3$-$C_{10}$ cycloalkyl; and the "substituted" refers to substitution with deuterium, F, Cl, Br, or $C_1$-$C_4$ alkyl.

As a optional organometallic compound, the La optionally has one of the following structural formulas, or is partially or completely deuterated or fluorinated correspondingly, La001
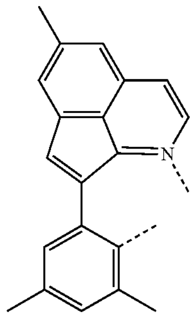
La002
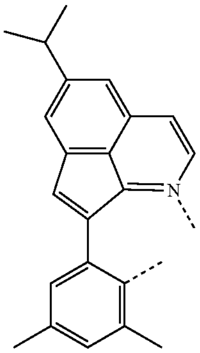
La003
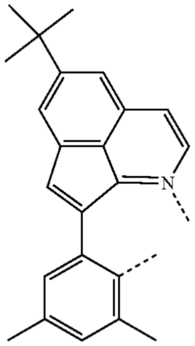
La004
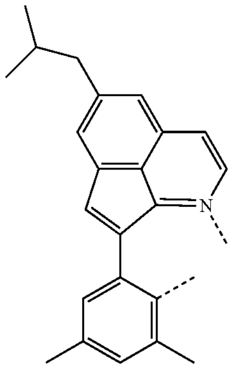
-continued
La005
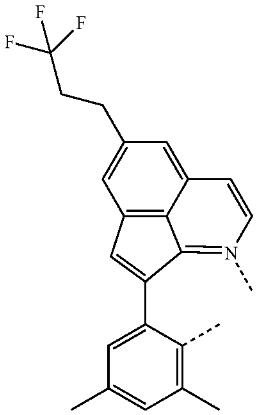
La006
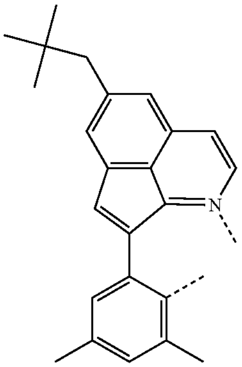
La007
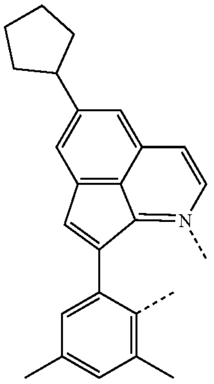
La008
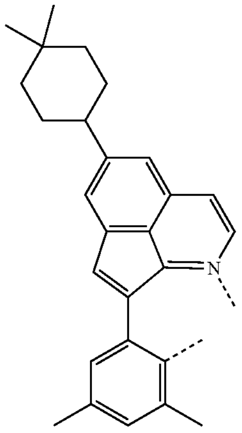

-continued
La009
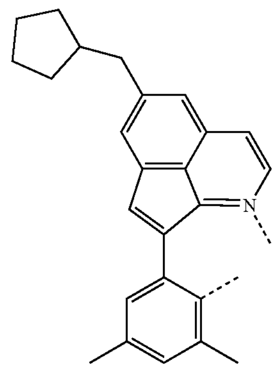
La010
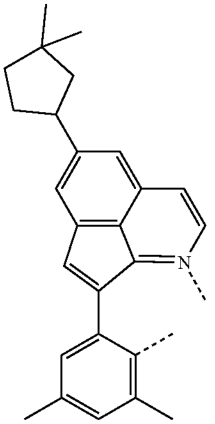
La011
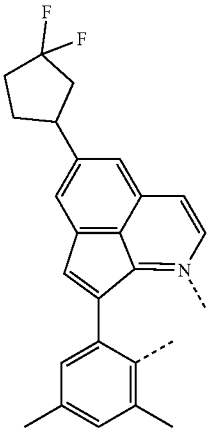
-continued
La012
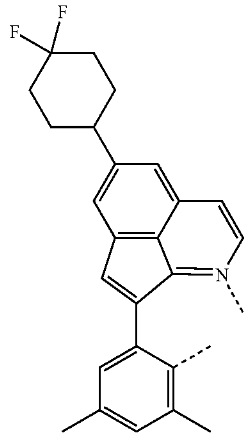
La013
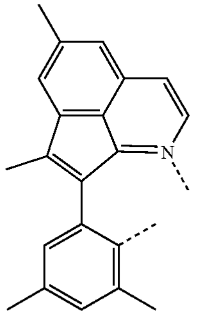
La014
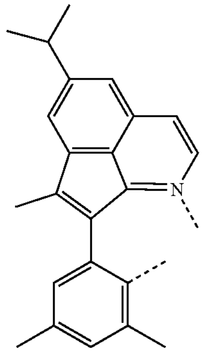
La015
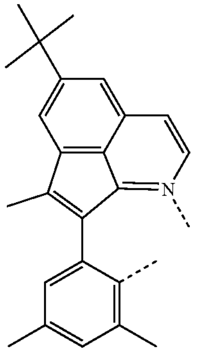

-continued
La016
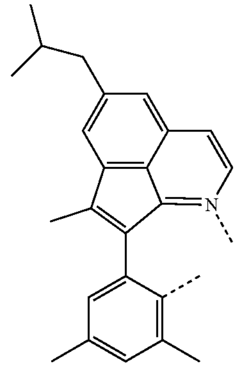
La017
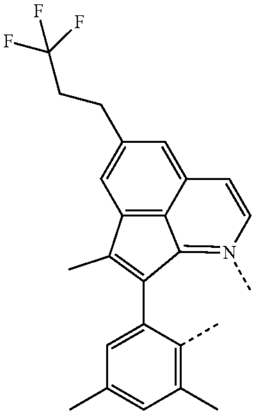
La018
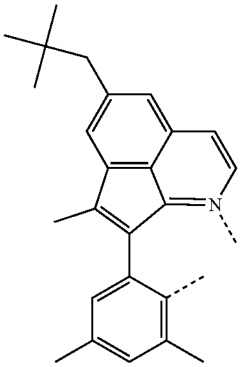
La019
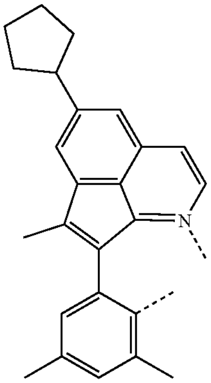
-continued
La020
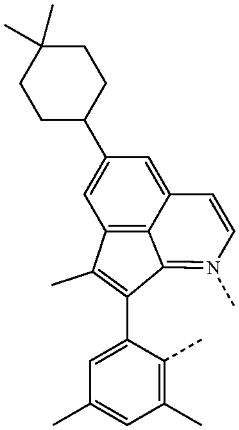
La021
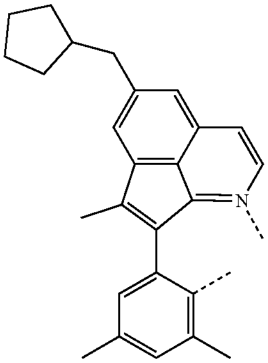
La022
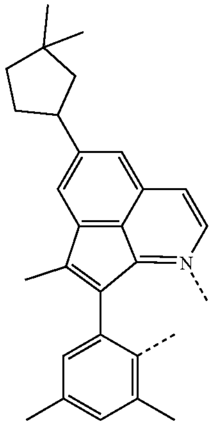
La023
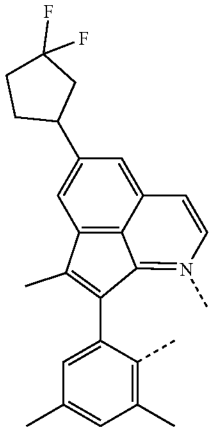

-continued
La024
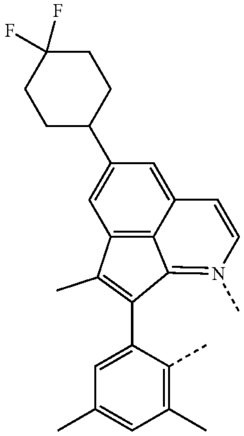
La025
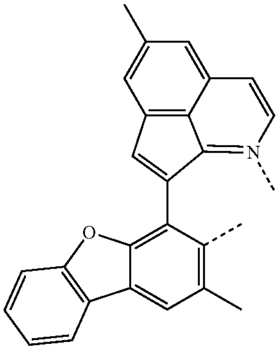
La026
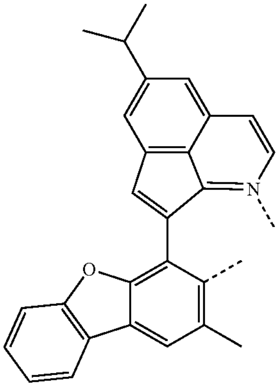
La027
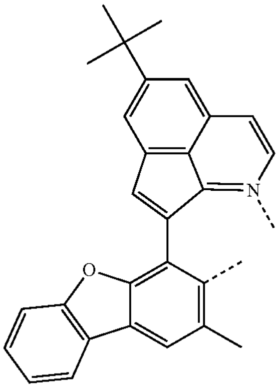
-continued
La028
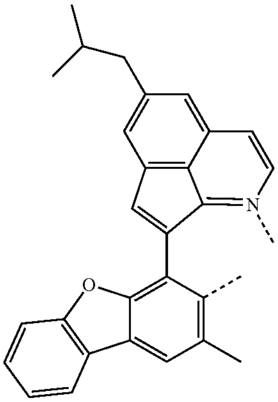
La029
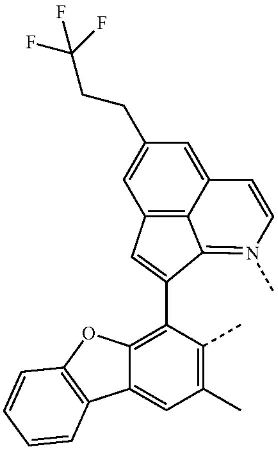
La030
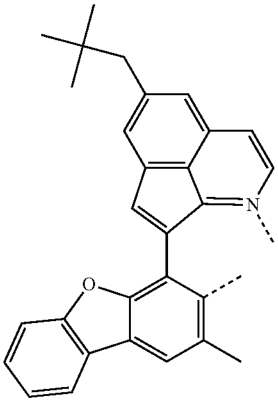

-continued
La031
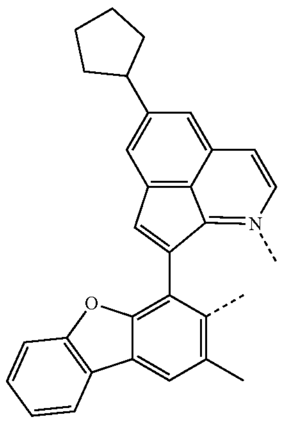
La032
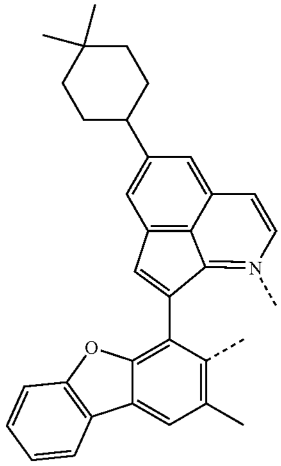
La033
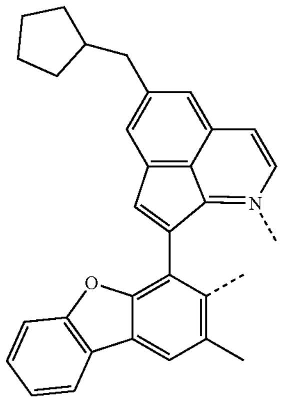
-continued
La034
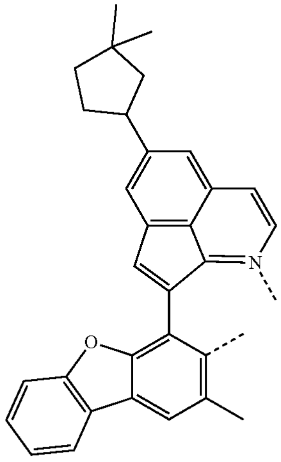
La035
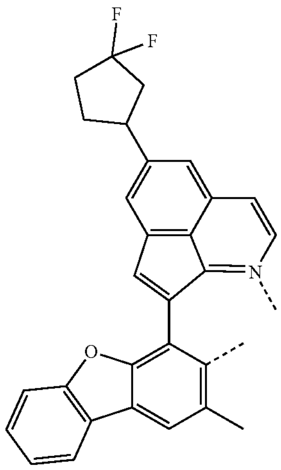
La036
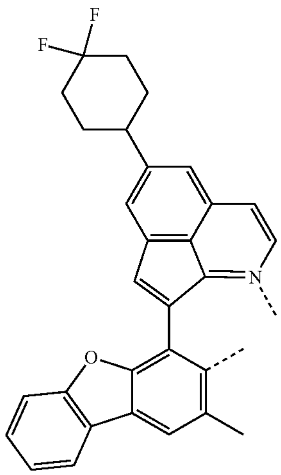

-continued
La037
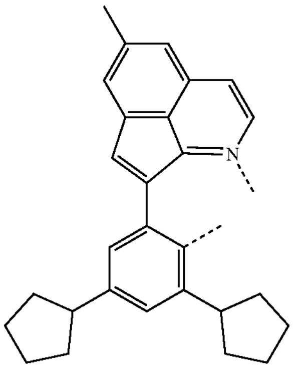
La038
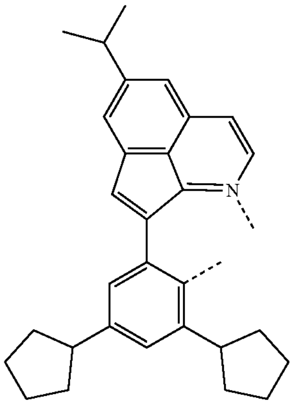
La039
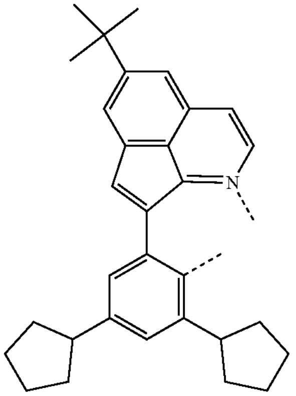
La040
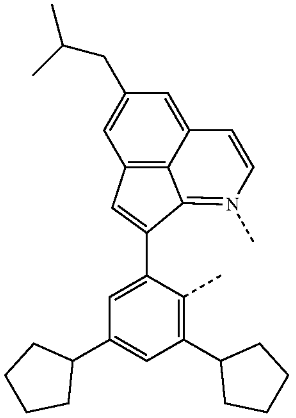
-continued
La041
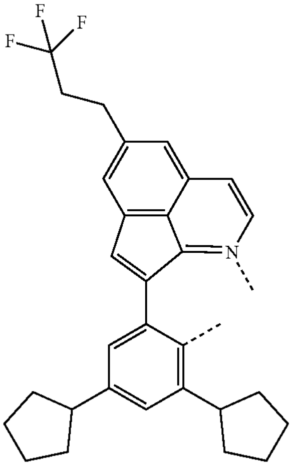
La042
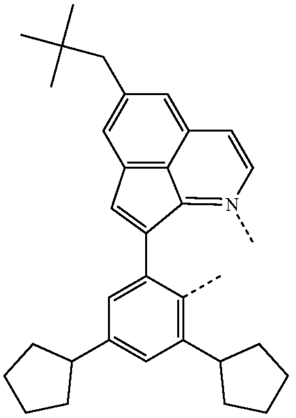
La043
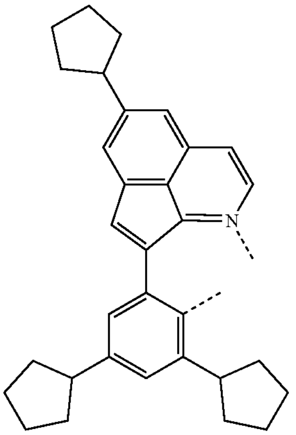

-continued
La044
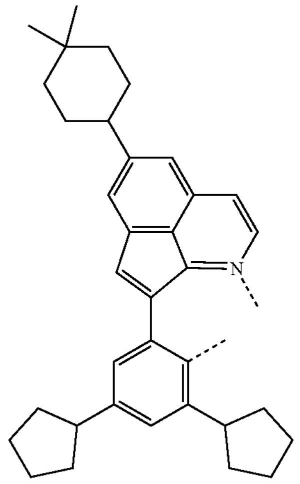
La045
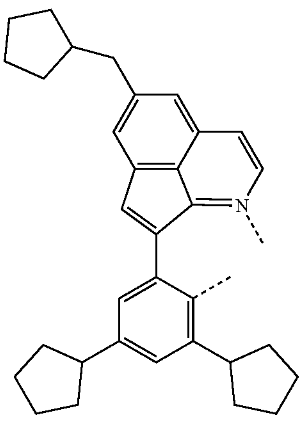
La046
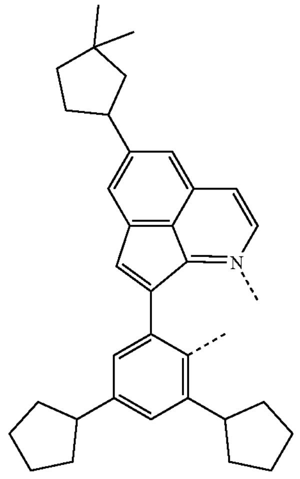
-continued
La047
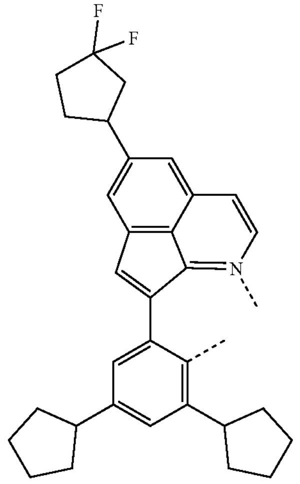
La048
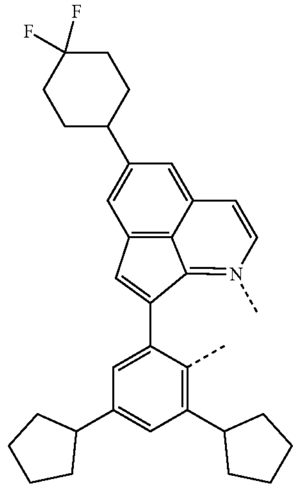
La049
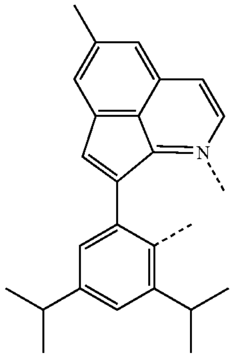

-continued
La050
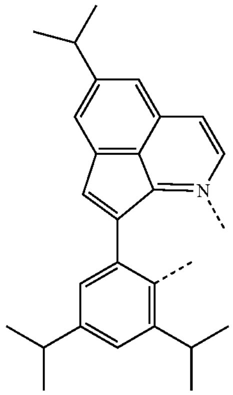
La051
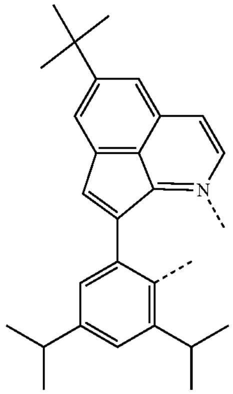
La052
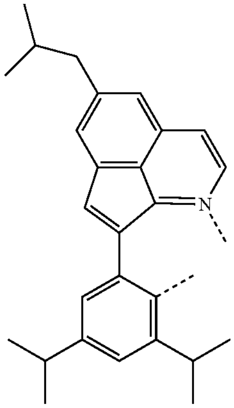
-continued
La053
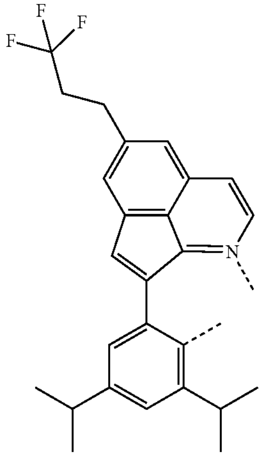
La054
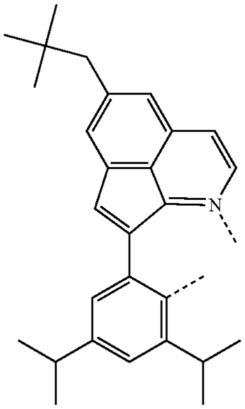
La055
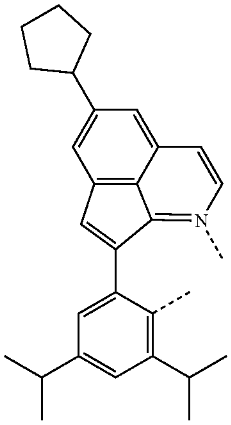

La056
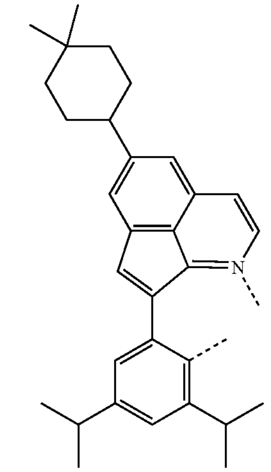
La057
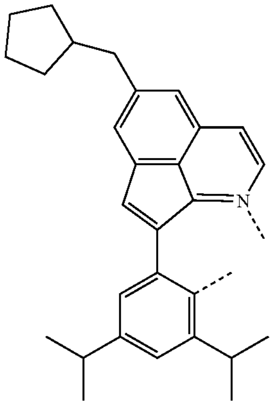
La058
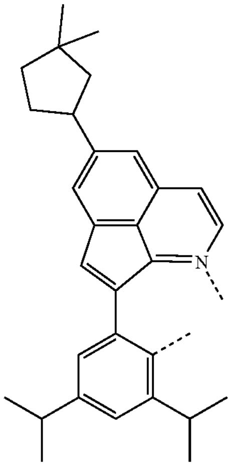
La059
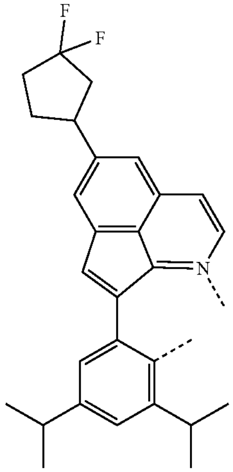
La060
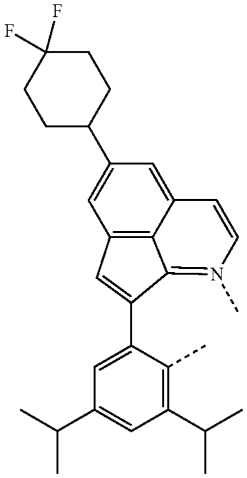
La061
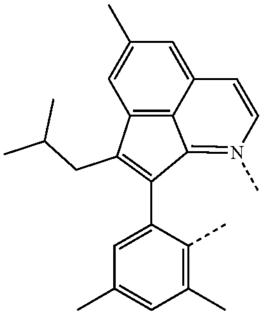
La062
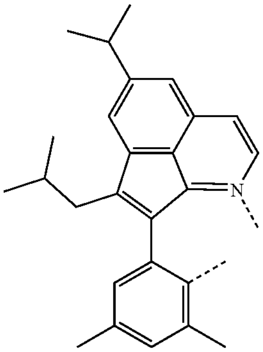

-continued
La063
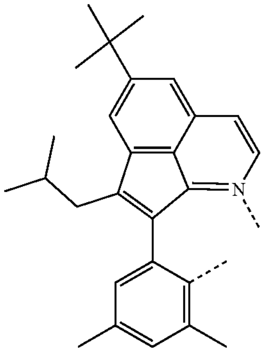
La064
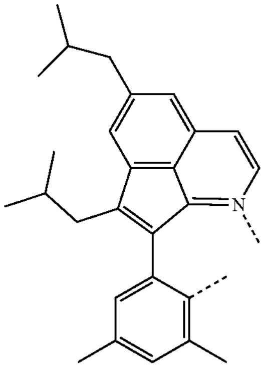
La065
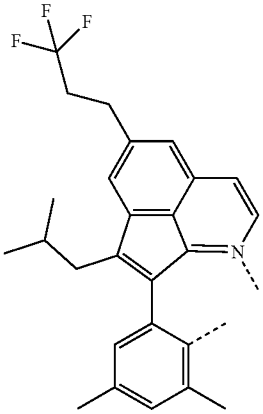
La066
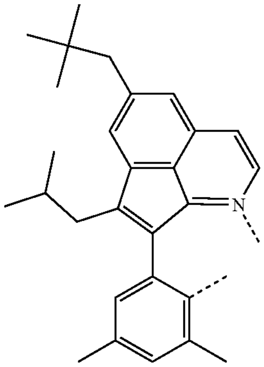
-continued
La067
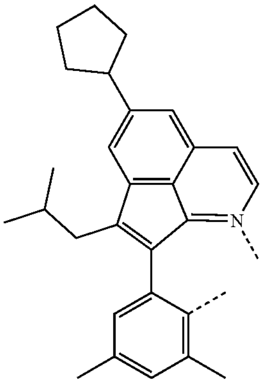
La068
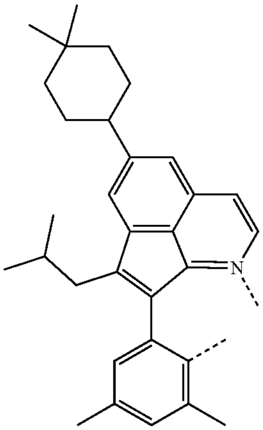
La069
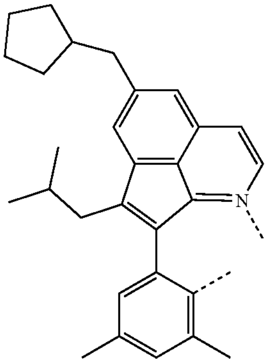
La070
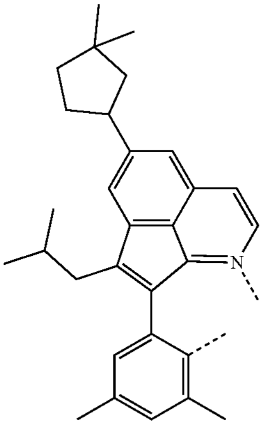

-continued
La071
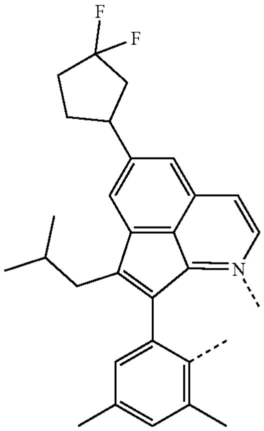
La072
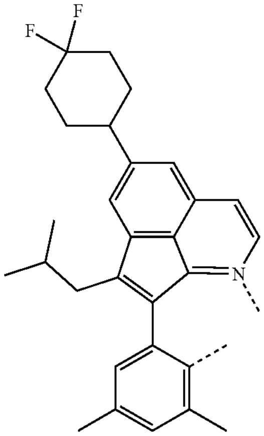
La073
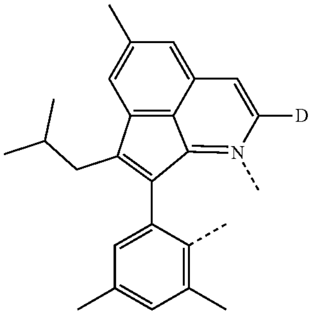
La074
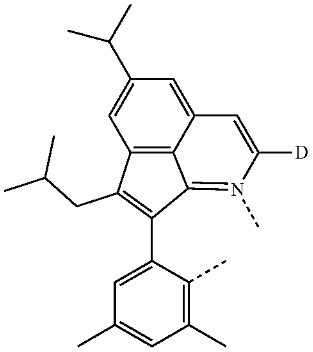
-continued
La075
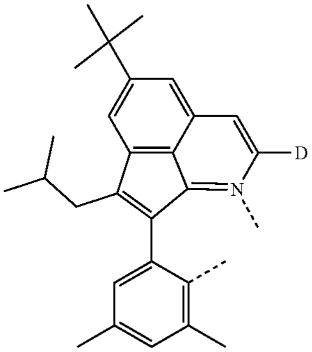
La076
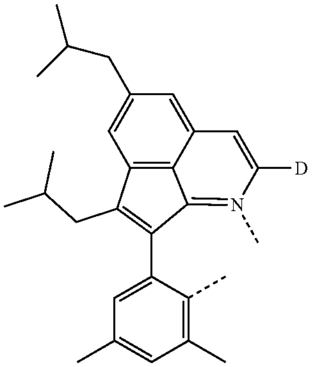
La077
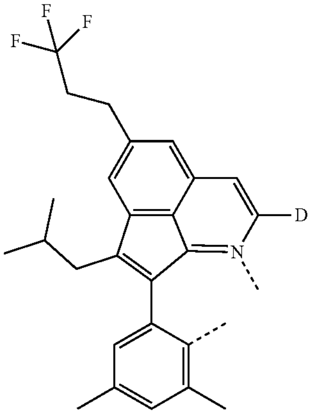
La078
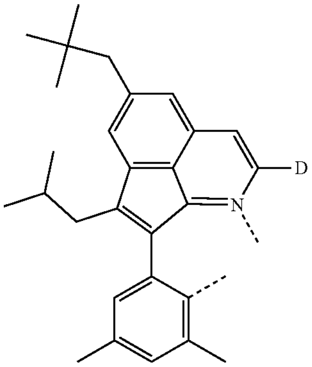

-continued
La079
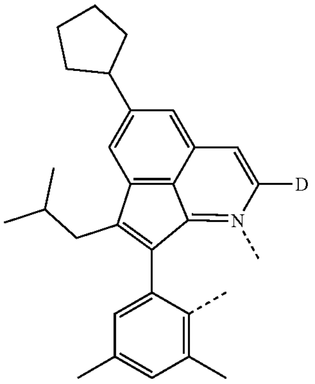
La080
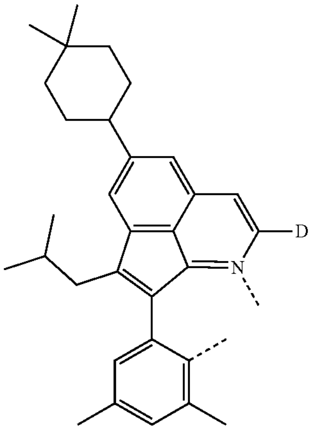
La081
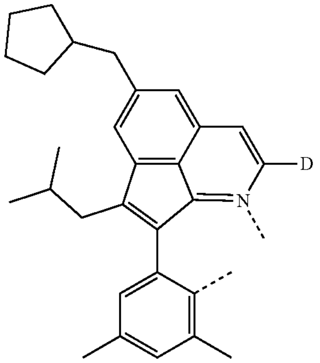
La082
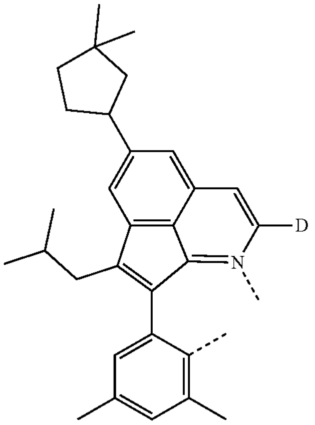
-continued
La083
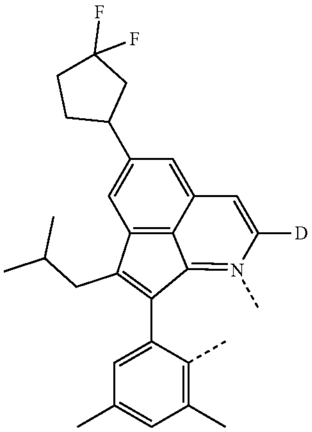
La084
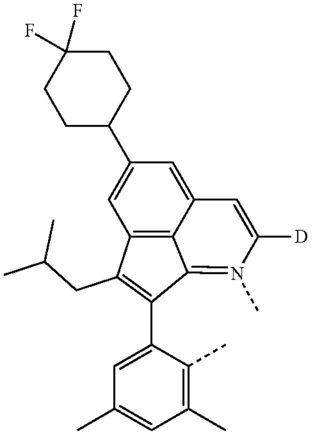
La085
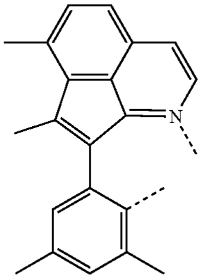
La086
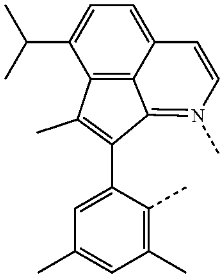

-continued
La087
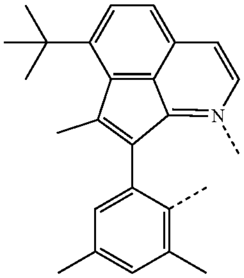
La088
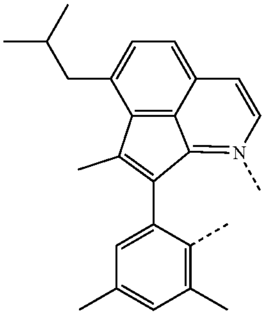
La089
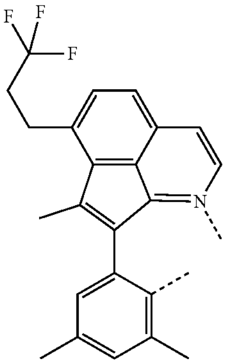
La090
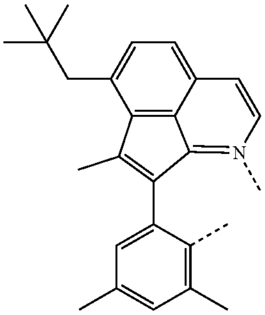
La091
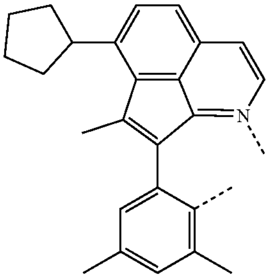
-continued
La092
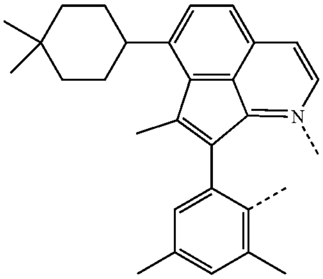
La093
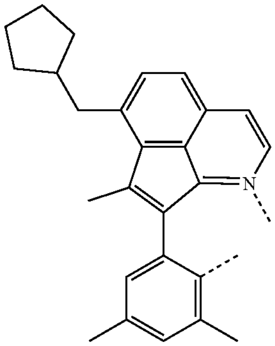
La094
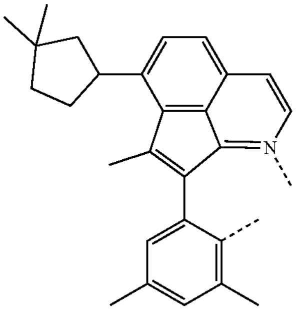
La095
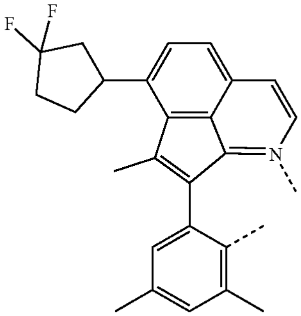
La096
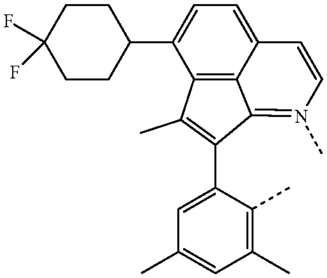

-continued
La097
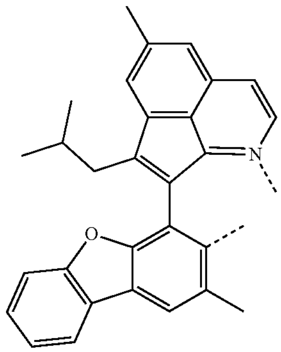
La098
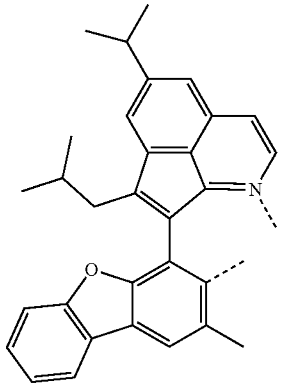
La099
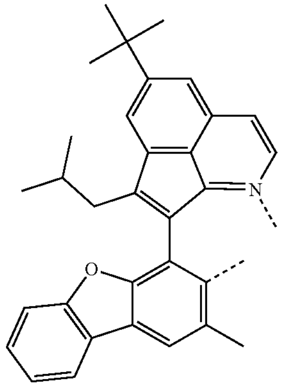
La100
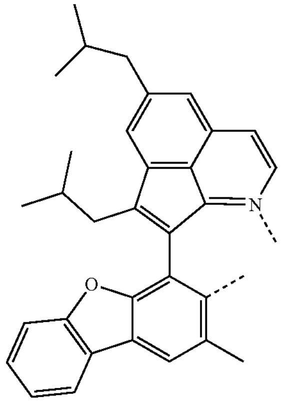
-continued
La101
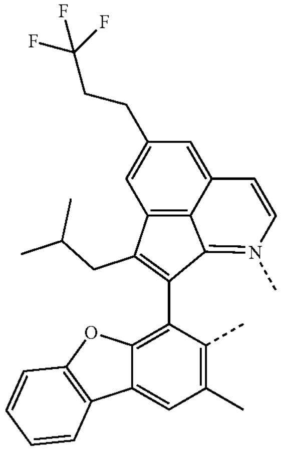
La102
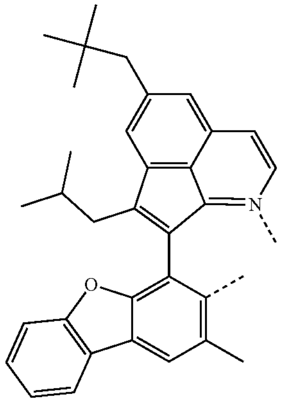
La103
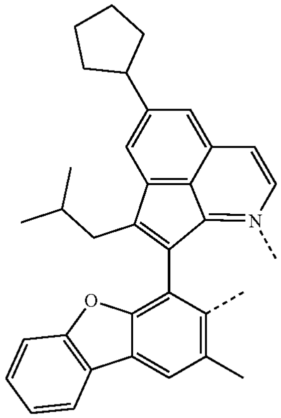

-continued
La104
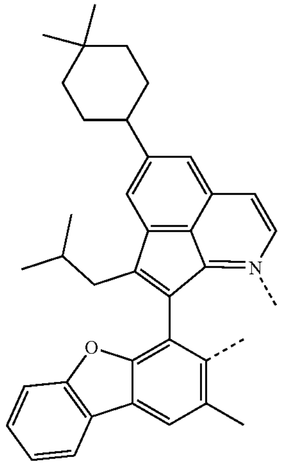
La105
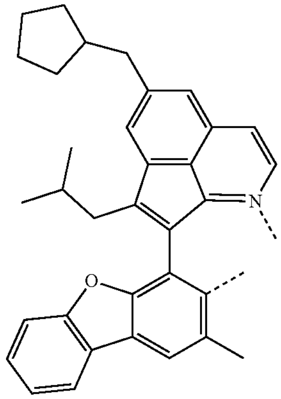
La106
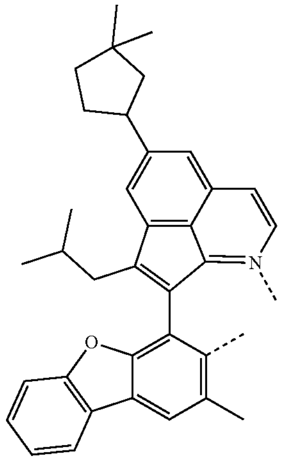
-continued
La107
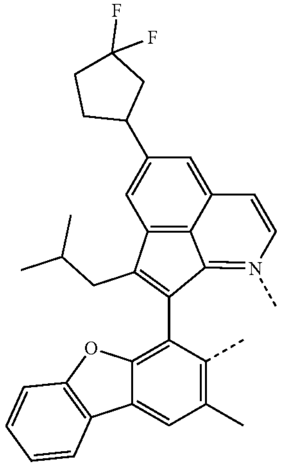
La108
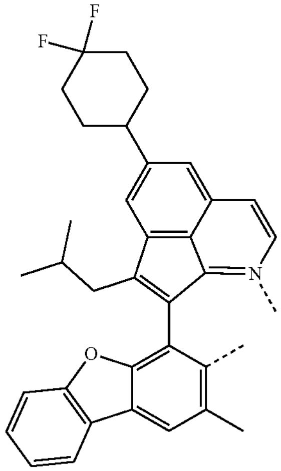
La109
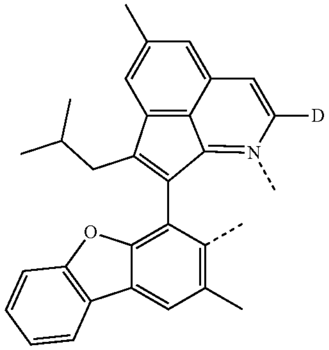

-continued
La110
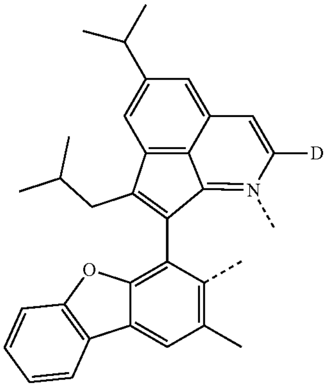
La111
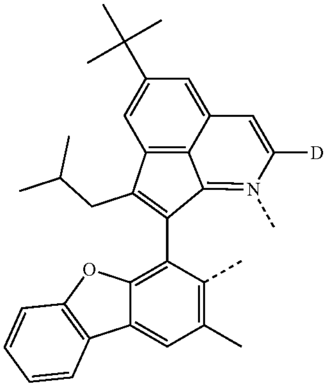
La112
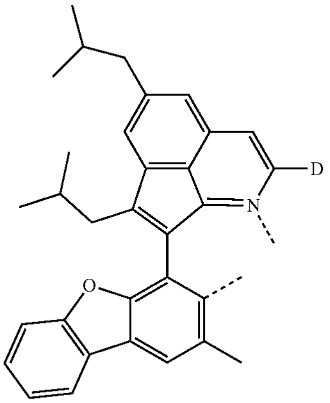
La113
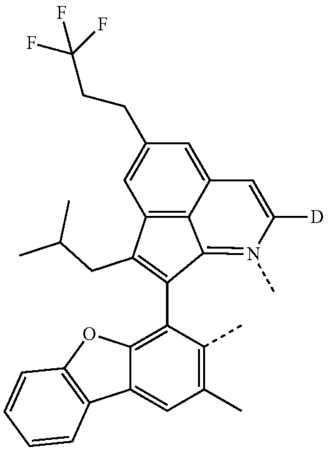
-continued
La114
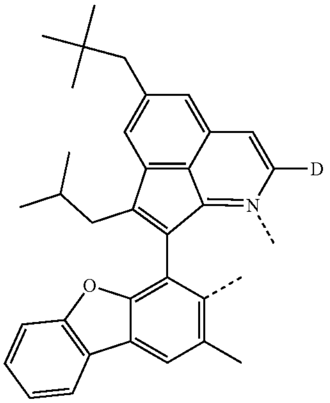
La115
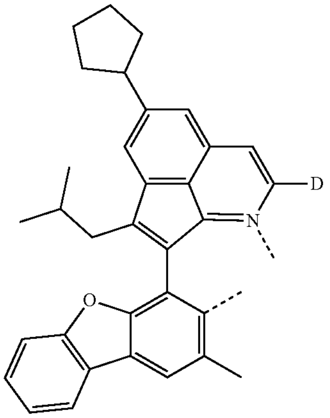
La116
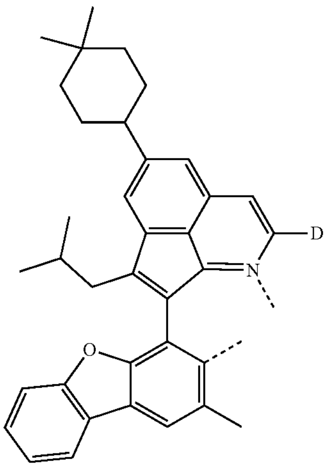

-continued
La117
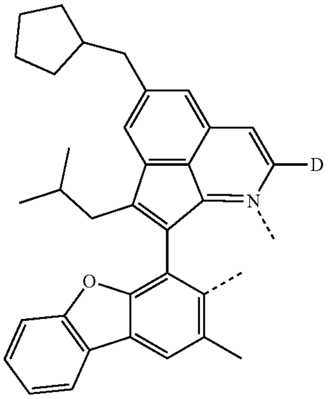
La118
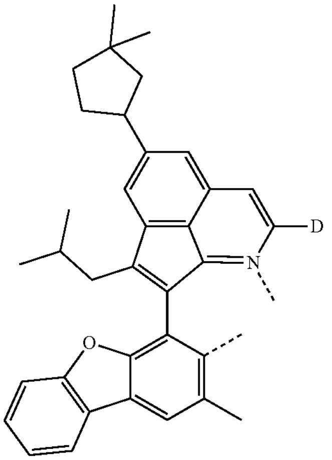
La119
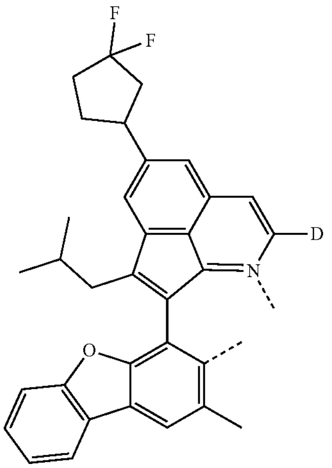
-continued
La120
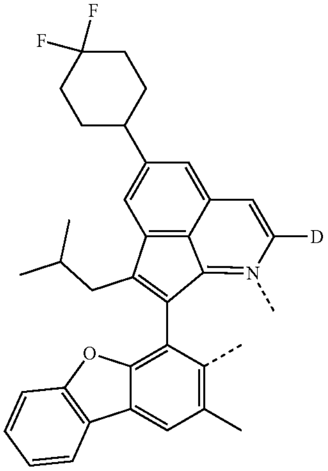
As a optional organometallic compound, the Lb optionally has one of the following structural formulas, or is partially or completely deuterated or fluorinated correspondingly,
Lb001
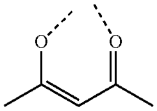
Lb002
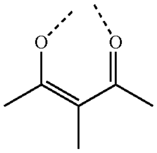
Lb003
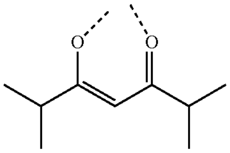
Lb004
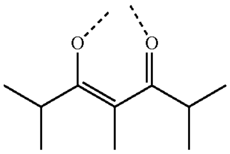
Lb005
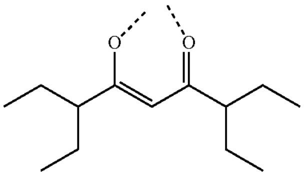
Lb006
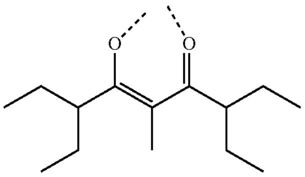

-continued
Lb007
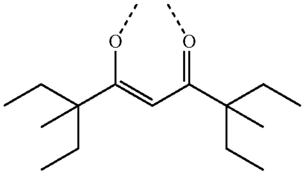
Lb008
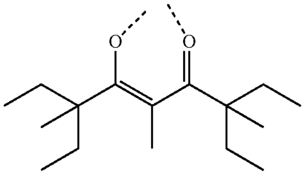
Lb009
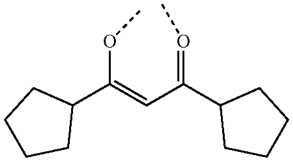
Lb010
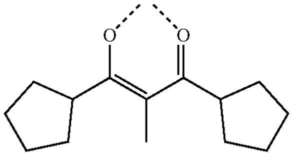
Lb011
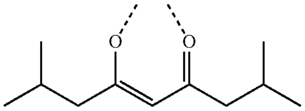
Lb012
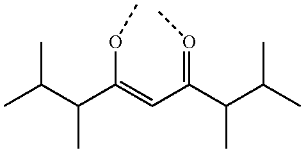
Lb013
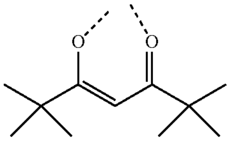
Lb014
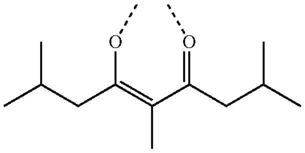
Lb015
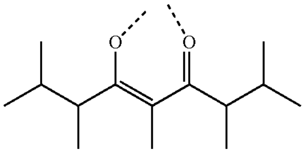
-continued
Lb016
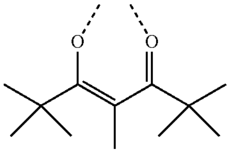
Lb017
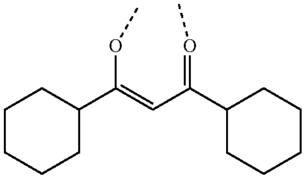
Lb018
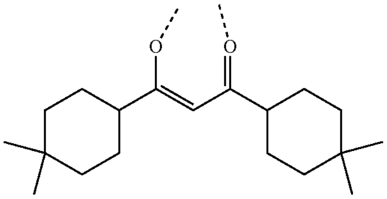
Lb019
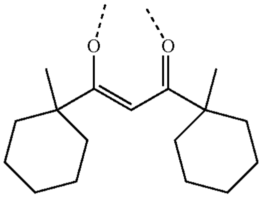
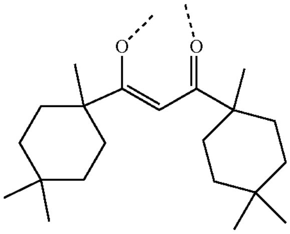
Lb021
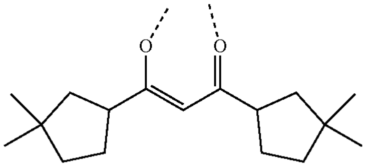
Lb022
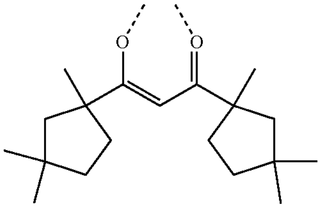
Lb023
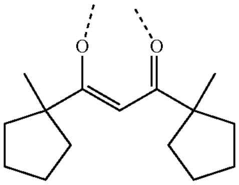

-continued
Lb024
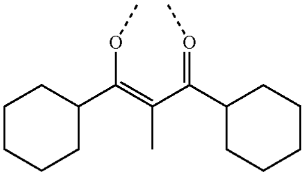
Lb025
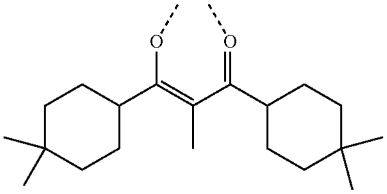
Lb026
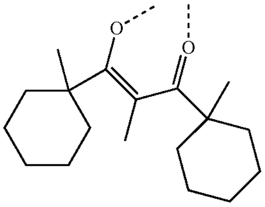
Lb027
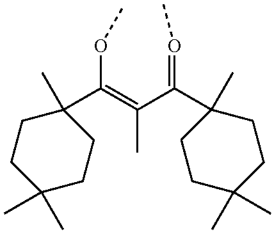
Lb028
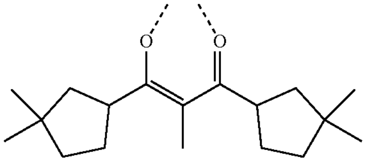
Lb029
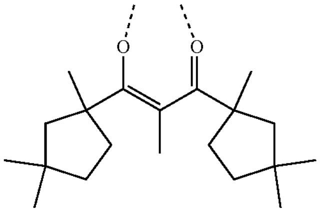
Lb030
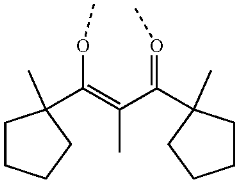
-continued
Lb031
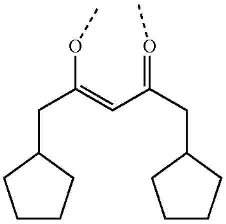
Lb032
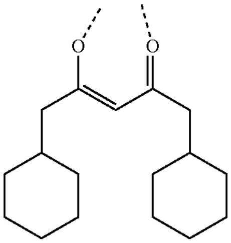
Lb033
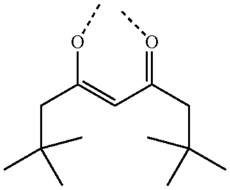
Lb034
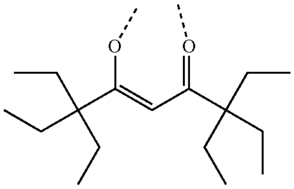
Lb035
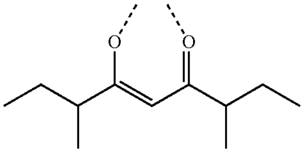
Lb036
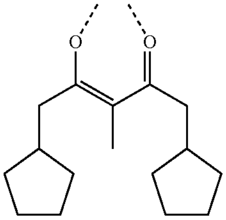
Lb037
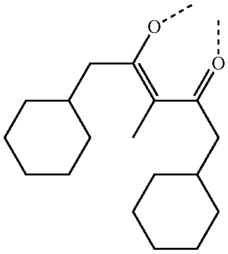

-continued
Lb038
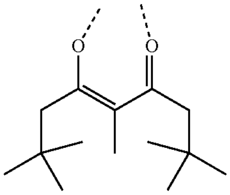
Lb039
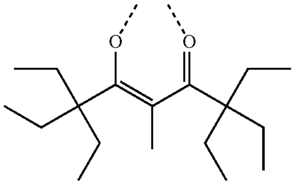
Lb040
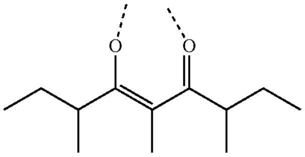
As a optional organometallic compound, the Lc optionally has one of the following structural formulas, or is partially or completely deuterated or fluorinated correspondingly,
Lc001
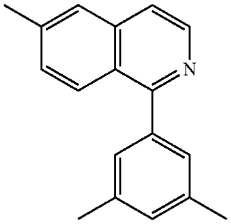
Lc002
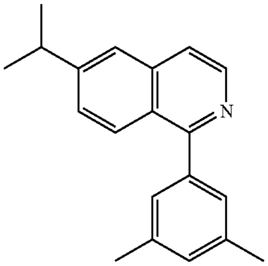
Lc003
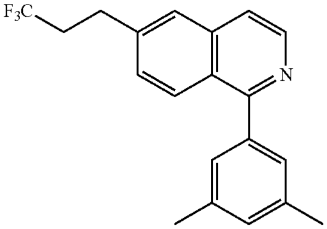
-continued
Lc004
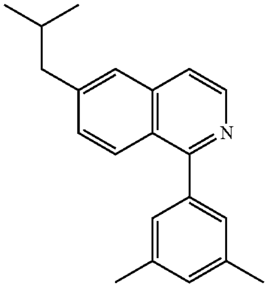
Lc005
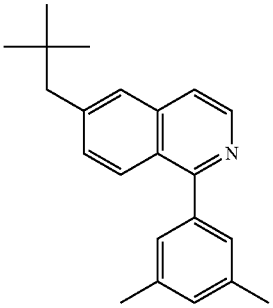
Lc006
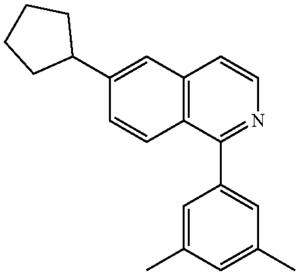
Lc007
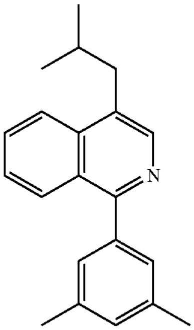
Lc008
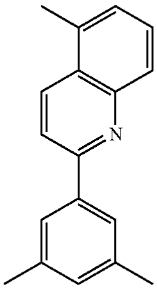

-continued
Lc009
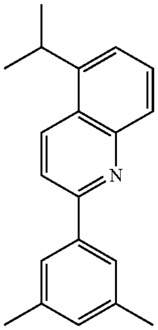
Lc010
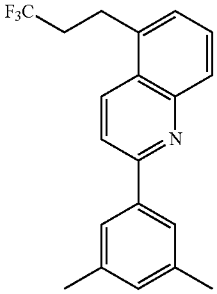
Lc011
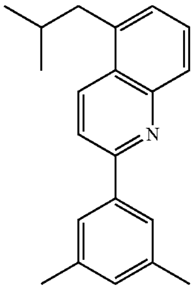
Lc012
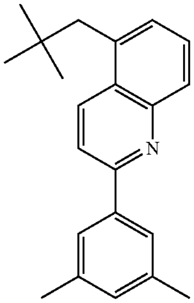
Lc013
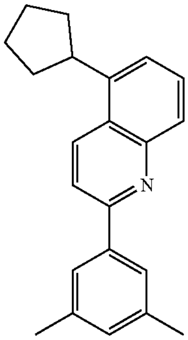
-continued
Lc014
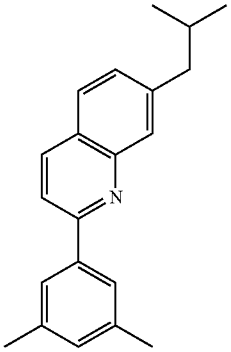
Lc015
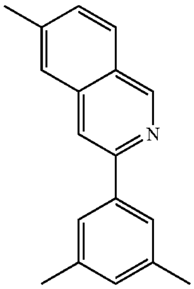
Lc016
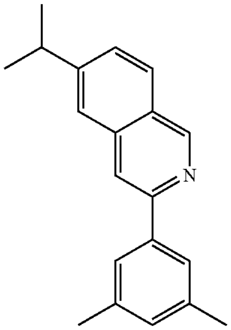
Lc017
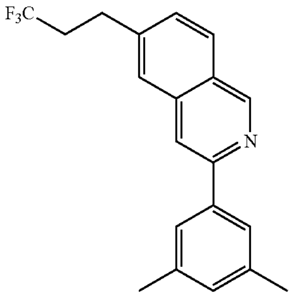
Lc018
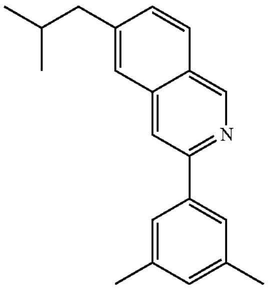

-continued

Lc019

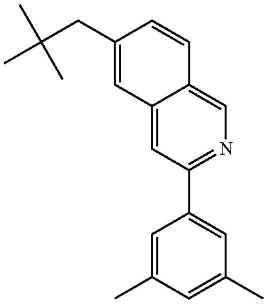

Lc020

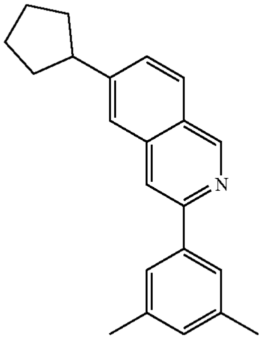

Lc021

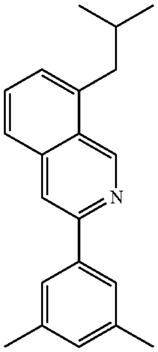

Lc022

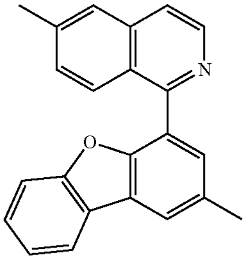

Lc023

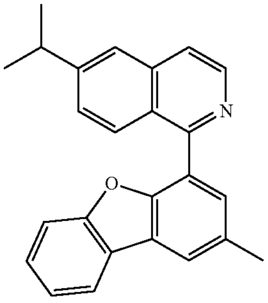

-continued

Lc024

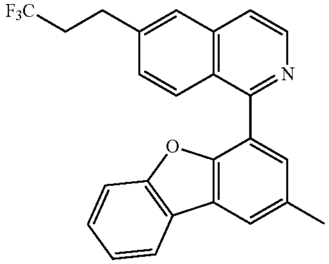

Application of the organometallic compound in an organic electroluminescent device is provided.

According to the application, the organometallic compound is used as a red light-emitting doping material for a light-emitting layer in the organic electroluminescent device.

The material of the present invention has the advantages of high optical and electrical stability, low sublimation temperature, narrow emission half-peak width, high color saturation, high luminous efficiency, long device service life and the like. As a phosphorescent material, the material of the present invention can convert a triplet state into light, thereby improving the luminous efficiency of organic electroluminescent devices and reducing energy consumption. In particular, the compound has the potential for application in the AMOLED industry as a red light-emitting dopant.

DETAILED DESCRIPTION OF EMBODIMENTS

The present invention is further descried in detailed below in combination with embodiments.

A compound of the present invention is an organometallic compound having a general formula of Ir(La)(Lb)(Lc), where La is a structure represented by Formula (1):

(1)

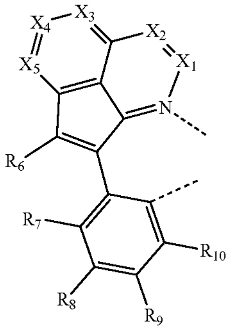

where dotted lines refer to positions connected to the metal Ir;

$X_1$ is N or $CR_1$, $X_2$ is N or $CR_2$, $X_3$ is N or $CR_3$, $X_4$ is N or $CR_4$, and $X_5$ is N or $CR_5$;

at most one of the $X_1$-$X_5$ is N, and when the $X_1$-$X_5$ are $CR_1$-$CR_5$, at least one of the $R_1$-$R_5$ is not H; at least one of $R_7$-$R_{10}$ is not hydrogen;

$R_1$-$R_{10}$ are independently selected from hydrogen, deuterium, halogen, cyano, hydroxyl, sulfhydryl, amino, substituted or unsubstituted $C_1$-$C_{10}$ alkyl, substituted or unsubstituted $C_1$-$C_{10}$ heteroalkyl, substituted or unsubstituted $C_3$-$C_{20}$ cycloalkyl, substituted or unsubstituted $C_2$-$C_{10}$ alkenyl, substituted or unsubstituted $C_2$-$C_{10}$ alkynyl, substituted or unsubstituted $C_6$-$C_{18}$ aryl, substituted or unsubstituted $C_2$-$C_{17}$ heteroaryl, substituted or unsubstituted tri-$C_1$-$C_{10}$ alkyl silyl, substituted or unsubstituted tri-$C_6$-$C_{12}$ aryl silyl, substituted or unsubstituted di-$C_1$-$C_{10}$ alkyl mono-$C_6$-$C_{30}$ aryl silyl, and substituted or unsubstituted mono-$C_1$-$C_{10}$ alkyl di-$C_6$-$C_{30}$ aryl silyl; any two adjacent groups of the $R_1$-$R_6$ or $R_7$-$R_{10}$ may be connected to each other to form an aliphatic ring structure or an aromatic ring structure;

the heteroalkyl and the heteroaryl at least contain one O, N or S heteroatom;

and the "substituted" refers to substitution with deuterium, F, Cl, Br, $C_1$-$C_6$ alkyl, $C_3$-$C_6$ cycloalkyl, amino substituted with $C_1$-$C_6$ alkyl, cyano, isocyano, or phosphino, and the substitution ranges from a single substitution number to a maximum substitution number;

Lb is a structure represented by Formula (2):

Formula (2)

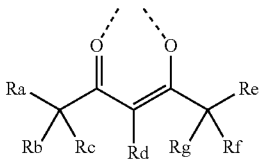

where dotted lines refer to positions connected to the metal Ir;

Ra-Rg are independently selected from hydrogen, deuterium, halogen, substituted or unsubstituted $C_1$-$C_{10}$ alkyl, substituted or unsubstituted $C_3$-$C_{20}$ cycloalkyl, substituted or unsubstituted $C_1$-$C_{10}$ heteroalkyl, and substituted or unsubstituted $C_3$-$C_{20}$ heterocyclic alkyl; any two of Ra, Rb and Rc are connected to form an aliphatic ring structure, and any two of Re, Rf and Rg are connected o form an aliphatic ring structure;

the heteroalkyl and the heterocyclic alkyl at least contain one O, N or S heteroatom;

and the "substituted" refers to substitution with deuterium, F, Cl, Br, $C_1$-$C_4$ alkyl, $C_1$-$C_4$ alkoxyl, $C_3$-$C_6$ cycloalkyl, amino substituted with $C_1$-$C_4$ alkyl, cyano, isocyano, or phosphino;

Lc is a monoanionic bidentate ligand, and the Lc is different from the Lb and is not an OO ligand;

the Lc and the La are the same or different, and the different indicates different parent nuclear structures, a same parent nuclear structure with different substituents, or a same parent nuclear structure with different substituent positions;

and any two or three of the La, the Lb and the Lc are connected to each other to form a polydentate ligand.

Examples of various groups of compounds represented by Formula (1) to Formula (5) are described below.

It is to be noted that in the specification, "$C_a$-$C_b$" in the term "substituted or unsubstituted $C_a$-$C_b$ X group" refers to the number of carbons when the X group is unsubstituted, excluding the number of carbons of a substituent when the X group is substituted.

As a linear or branched alkyl, the $C_1$-$C_{10}$ alkyl specifically includes methyl, ethyl, propyl, isopropyl, n-butyl, isobutyl, sec-butyl, tert-butyl, n-pentyl and isomers thereof, n-hexyl and isomers thereof, n-heptyl and isomers thereof, n-octyl and isomers thereof, n-nonyl and isomers thereof, and n-decyl and isomers thereof, optionally includes methyl, ethyl, propyl, isopropyl, n-butyl, isobutyl, sec-butyl, and tert-butyl, and more optionally includes propyl, isopropyl, isobutyl, sec-butyl, and tert-butyl.

The $C_3$-$C_{20}$ cycloalkyl may include cyclopropyl, cyclobutyl, cyclopentyl, cyclohexyl, 1-adamantyl, 2-adamantyl, 1-norbornyl, and 2-norbornyl, and optionally includes cyclopentyl and cyclohexyl.

The $C_2$-$C_{10}$ alkenyl may include vinyl, propenyl, allyl, 1-butadienyl, 2-butadienyl, 1-hexatrienyl, 2-hexatrienyl, and 3-hexatrienyl, and optionally includes propenyl and allyl.

As a linear or branched alkyl or cycloalkyl consisting of atoms other than carbon and hydrogen, the $C_1$-$C_{10}$ heteroalkyl may include mercaptomethyl methyl, methoxymethyl, ethoxymethyl, tert-butoxyl methyl, N,N-dimethyl methyl, epoxy butyl, epoxy pentyl, and epoxy hexyl, and optionally includes methoxymethyl and epoxy pentyl.

Specific examples of the aryl include phenyl, naphthyl, anthracyl, phenanthryl, tetracenyl, pyrenyl, chrysenyl, benzo[c]phenanthryl, benzo[g]chrysenyl, fluorenyl, benzofluorenyl, dibenzofluorenyl, biphenyl, triphenyl, tetraphenyl, and fluoranthracyl, and optionally include phenyl and naphthyl.

Specific examples of the heteroaryl may include pyrrolyl, pyrazinyl, pyridyl, pyrimidinyl, triazinyl, indolyl, isoindolyl, imidazolyl, furyl, benzofuryl, isobenzofuryl, dibenzofuryl, dibenzothienyl, azodibenzofuryl, azodibenzothienyl, diazodibenzofuryl, diazodibenzothienyl, quinolyl, isoquinolyl, quinoxalinyl, carbazolyl, phenanthridinyl, acridinyl, phenanthrolinyl, phenazinyl, phenothiazinyl, phenoxazinyl, oxazolinyl, oxadiazolyl, furzanyl, thienyl, benzothienyl, dihydroacridinyl, azocarbazolyl, diazocarbazolyl, and quinazolinyl, and optionally include pyridyl, pyrimidinyl, triazinyl, dibenzofuryl, dibenzothienyl, azodibenzofuryl, azodibenzothienyl, diazodibenzofuryl, diazodibenzothienyl, carbazolyl, azocarbazolyl, and diazocarbazolyl.

The following embodiments are merely described to facilitate the understanding of the technical invention, and should not be considered as specific limitations of the present invention.

All raw materials, solvents and the like involved in the synthesis of compounds in the present invention are purchased from Alfa, Acros, and other suppliers known to persons skilled in the art.

Synthesis of a Ligand La004

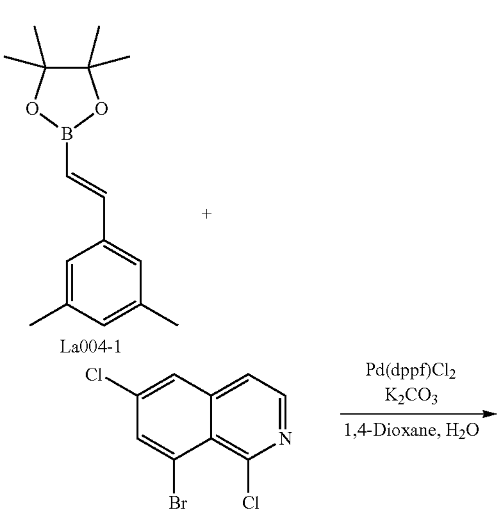

La004-1

La004-2

-continued

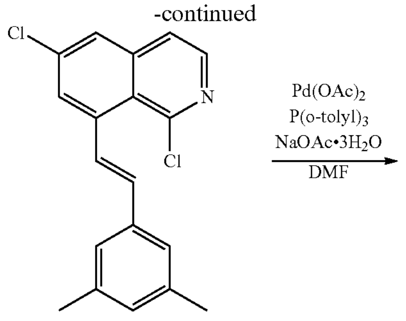

La004-3

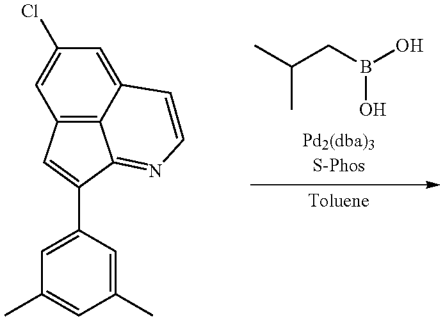

La004-4

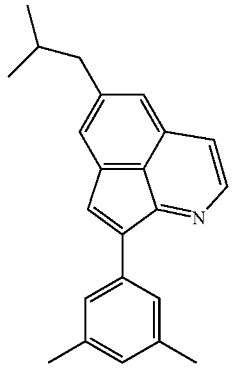

La004

Synthesis of a Compound La004-3

A compound La004-1 (20.00 g, 77.47 mmol), La004-2 (21.45 g, 77.47 mmol), [1,1'-bis(diphenylphosphino)ferrocene]dichloropalladium (1.42 g, 1.55 mmol), potassium carbonate (21.41 g, 154.94 mmol), 1,4-dioxane (200 ml) and deionized water (80 ml) were added into a 1,000 ml three-necked round-bottomed flask, vacuumization was performed for nitrogen replacement for 3 times, and stirring was performed at 80° C. for 2 hours under the protection of nitrogen. According to monitoring by thin-layer chromatography (TLC, with a developing agent including ethyl acetate and petroleum ether at a ratio of 1:10), the raw material La004-1 was completely reacted.

Cooling was performed to room temperature, concentration was performed under reduced pressure to remove an organic solvent, dichloromethane (500 ml) was added, and deionized water was added for washing (3*150 ml). Then, liquid separation was performed, and an organic phase was concentrated, followed by column chromatography with silica gel (200- to 300-mesh silica gel, with an eluting agent including ethyl acetate and petroleum ether at a ratio of 1:20), elution and concentration to obtain 20.10 g of a light yellow solid compound La004-3 with a purity of 99.10% and a yield of 79.05%. The mass spectrum was: 328.26 (M+H).

Synthesis of a Compound La004-4

The compound La004-3 (18.50 g, 56.36 mmol), palladium acetate (253.06 mg, 1.13 mmol), tris(2-methylphenyl) phosphine (687.87 mg, 2.26 mmol), sodium acetate trihydrate (15.34 g, 112.72 mmol) and N,N-dimethylformamide (185 ml) were added into a 500 ml three-necked round-bottomed flask, vacuumization was performed for nitrogen replacement for 3 times, and stirring was performed at 100° C. for 6 hours under the protection of nitrogen. According to monitoring by TLC (with a developing agent including ethyl acetate and petroleum ether at a ratio of 1:15), the raw material La004-3 was completely reacted.

Concentration was directly performed to remove the N,N-dimethylformamide, ethyl acetate (500 ml) was added, and deionized water was added for washing (3*200 ml). Then, liquid separation was performed, and an organic phase was concentrated, followed by column chromatography with silica gel (200- to 300-mesh silica gel, with an eluting agent including ethyl acetate and petroleum ether at a ratio of 1:25) and concentration to obtain 12.37 g of a light yellow sugar-like solid compound La004-4 with a purity of 99.53% and a yield of 75.21%. The mass spectrum was: 292.06 (M+H).

Synthesis of a Compound La004

The compound La004-4 (12.00 g, 41.13 mmol), isobutaneboronic acid (6.29 g, 61.69 mmol), tris(dibenzylideneacetone) dipalladium (753 mg, 0.82 mmol), 2-dicyclohexylphosphino-2',6'-dimethoxybiphenyl (675.73 mg, 1.64 mmol), potassium phosphate (18.94 g, 82.26 mmol) and toluene (120 ml) were added into a 500 ml three-necked round-bottomed flask, vacuumization was performed for nitrogen replacement for 3 times, and stirring was performed at 105° C. for 4 hours under the protection of nitrogen. According to monitoring by TLC (with a developing agent including ethyl acetate and petroleum ether at a ratio of 1:12), the raw material La004-4 was completely reacted.

Cooling was performed to room temperature, ethyl acetate (400 ml) was added, and deionized water was added for washing (3*250 ml). Then, liquid separation was performed, and an organic phase was concentrated, followed by column chromatography with silica gel (200- to 300-mesh silica gel, with an eluting agent including ethyl acetate and petroleum ether at a ratio of 1:25) and concentration to obtain 9.02 g of a white sugar-like solid compound La004 with a purity of 99.83% and a yield of 70.00%. The mass spectrum was: 314.14 (M+H).

Synthesis of a Compound Ir(La004)$_2$(Lb005)

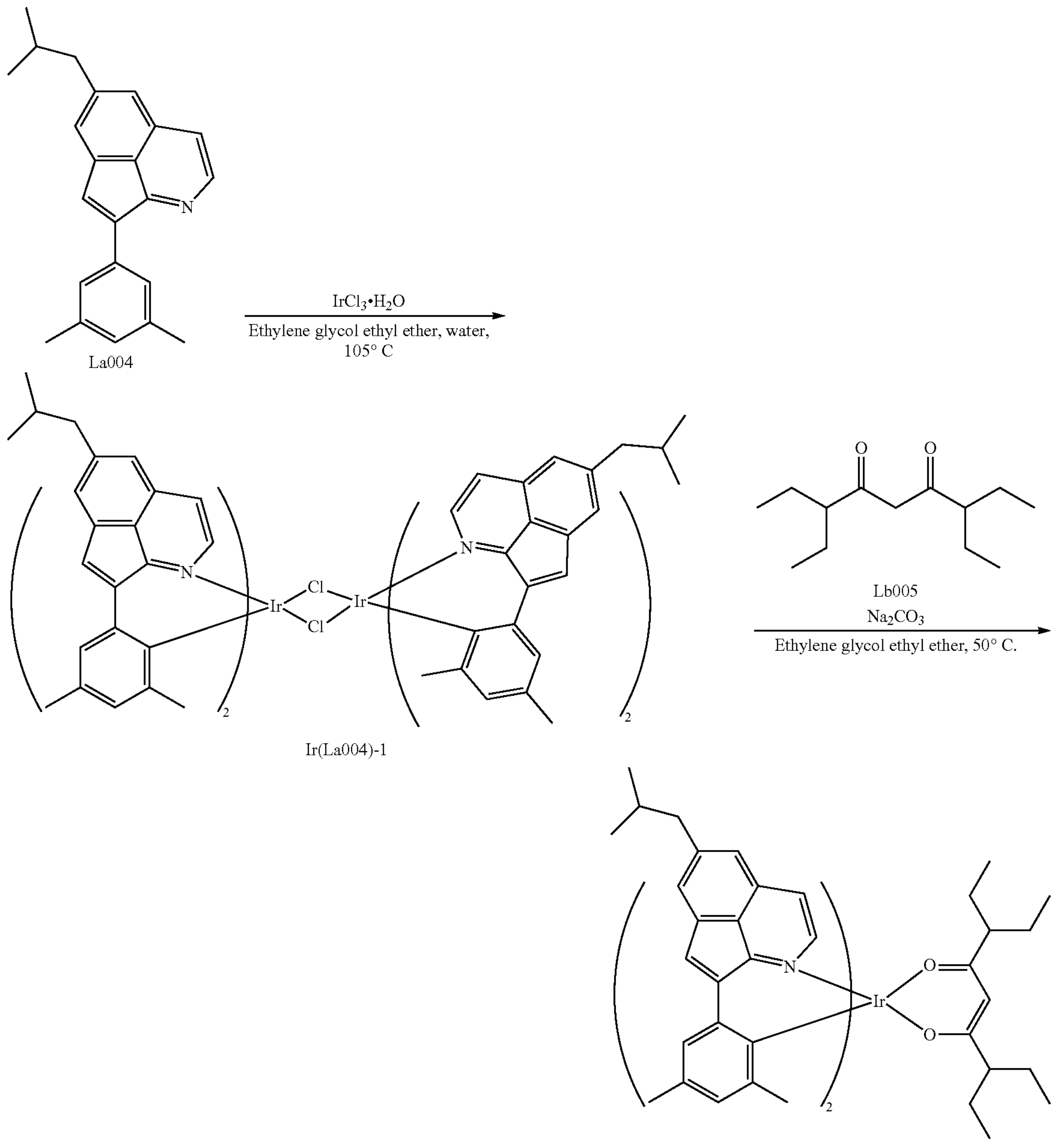

Ir(La004)$_2$(Lb005)

Synthesis of a Compound Ir(La004)-1

The compound La004 (18.61 g, 59.37 mmol) and $IrCl_3$·$3H_2O$ (5.98 g, 16.96 mmol) were added into a 1,000 ml three-necked round-bottomed flask, ethylene glycol ethyl ether (120 ml) and deionized water (40 ml) were added, vacuumization was performed for nitrogen replacement for 3 times, then, heating was performed to 105° C., and stirring was performed for reflux for 24 hours.

After cooling was performed to room temperature, methanol (200 ml) was added for beating at room temperature for 1 hour, and suction filtration was performed. Then, a filter cake was washed with methanol (50 ml), and a resulting solid was dried under vacuum at 80° C. to obtain 10.84 g of a compound Ir(La004)-1 with a yield of 75.00%. The obtained compound was directly used in the next step without purification.

Synthesis of a Compound Ir(La004)$_2$(Lb005)

The compound Ir(La004)-1 (6.54 g, 3.84 mmol), Lb005 (4.08 g, 19.20 mmol), sodium carbonate (4.07 g, 38.40 mmol) and ethylene glycol ethyl ether (66 ml) were added into a 250 ml one-necked round-bottomed flask, vacuumization was performed for nitrogen replacement for 3 times, and stirring was performed at 50° C. for 24 hours. According to monitoring by TLC (with a developing agent including methanol and dichloromethane at a ratio of 1:100), the Ir(La004)-1 was completely reacted.

After cooling was performed to room temperature, methanol (132 ml) was added for beating at room temperature for 2 hours, and suction filtration was performed. Then, a filter cake was dissolved in dichloromethane (200 ml) and filtered with 200- to 300-mesh silica gel (50 g), a filtrate was washed with deionized water (3*80 ml) and concentrated at 50° C. to obtain a dark red solid, and the dark red solid was subjected to recrystallization with tetrahydrofuran and methanol for two times to obtain 3.57 g of a red solid compound Ir(La004)$_2$(Lb005) with a purity of 99.83% and a yield of 45.17%, 3.57 g of the crude product Ir(La004)$_2$ (Lb005) was sublimated and purified to obtain 2.22 g of sublimated and purified Ir(La004)$_2$(Lb005) with a purity of 99.80% and a yield of 62.16%. The mass spectrum was 1029.36 (M+H).

$^1$H NMR (400 MHz, $CDCl_3$) δ 8.44 (d, J=15.0 Hz, 2H), 8.05 (m, 4H), 7.68 (s, 2H), 7.63-7.51 (m, 2H), 7.44-7.42 (s, 4H), 4.60 (s, 1H), 2.70 (m, 4H), 2.27 (s, 12H), 1.99-1.57 (m, 4H), 1.11-1.04 (m, 12H), 0.83-0.77 (m, 8H), 0.67 (m, 6H), 0.94 (m, 6H).

Synthesis of a Ligand La008

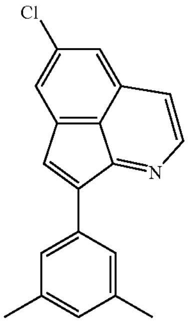

La004-4

+

-continued

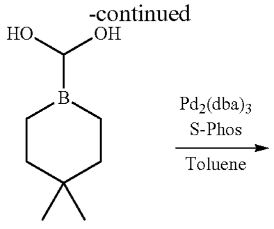

La008-1

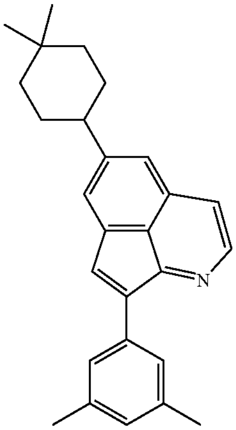

La008

Synthesis of a Compound La008

With reference to synthesis and purification methods of the compound La004, only the corresponding raw materials were required to be changed, and 15.40 g of a target compound La008 with a purity of 99.75% and a yield of 70.15% was obtained. The mass spectrum was 368.15 (M+H).

Synthesis of a Compound Ir(La008)$_2$(Lb005)

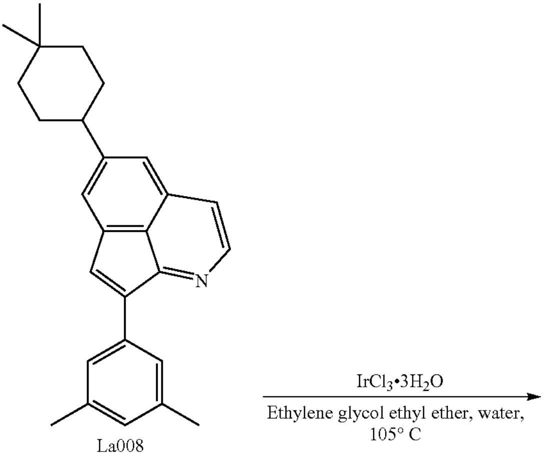

La008

-continued

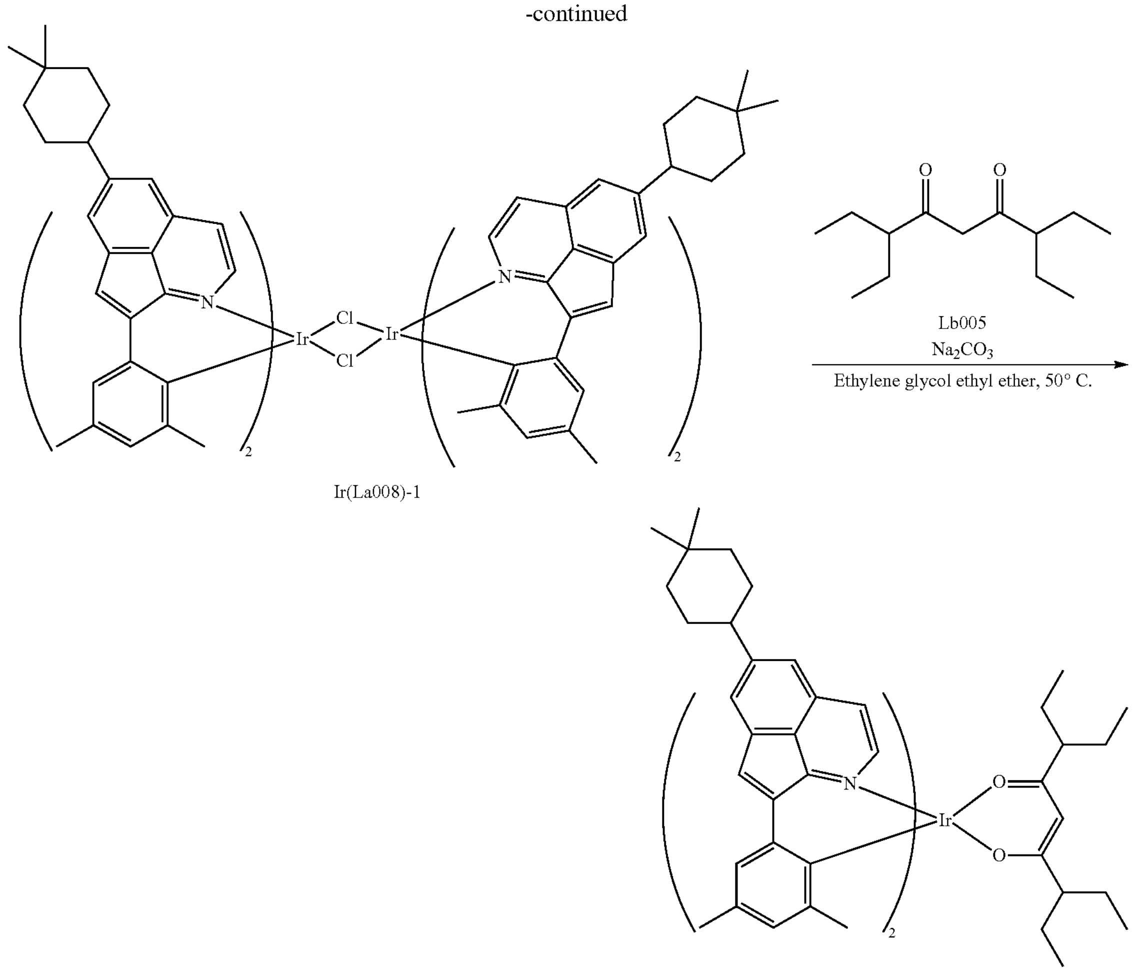

Ir(La008)-1

Ir(La008)2(Lb005)

Synthesis of a Compound Ir(La008)-1

With reference to synthesis and purification methods of the compound Ir(La004)-1, only the corresponding raw materials were required to be changed, and 7.31 g of a compound Ir(La008)-1 with a yield of 70.52% was obtained. The obtained compound was directly used in the next step without purification.

Synthesis of a Compound $Ir(La008)_2(Lb005)$

With reference to synthesis and purification methods of the compound $Ir(La004)_2(Lb005)$, only the corresponding raw materials were required to be changed, and 3.78 g of a red solid compound $Ir(La008)_2(Lb005)$ with a purity of 99.86% and a yield of 42.36% was obtained. 3.78 g of the crude product $Ir(La008)_2(Lb005)$ was sublimated and purified to obtain 2.27 g of sublimated and purified $Ir(La008)_2(Lb005)$ with a purity of 99.82% and a yield of 60.25%. The mass spectrum was 1137.26 (M+H).

$^1$H NMR (400 MHz, $CDCl_3$) δ 8.43 (d, J=15.1 Hz, 2H), 8.03 (m, 4H), 7.66 (s, 2H), 7.63-7.53 (m, 2H), 7.42-7.41 (s, 4H), 4.59 (s, 1H), 2.80-2.73 (m, 2H), 2.70 (m, 2H), 1.96-1.82 (m, 8H), 1.75-1.68 (m, 8H), 1.65-1.61 (m, 24H), 1.52-1.43 (m, 8H), 1.11-0.97 (m, 6H), 0.94 (m, 6H).

Synthesis of a Ligand La009

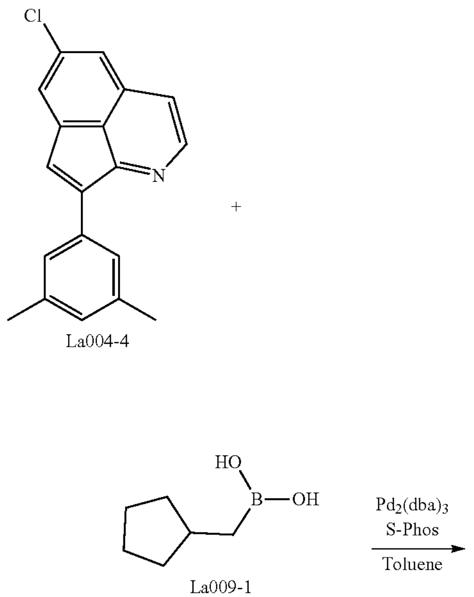

La004-4

La009-1

-continued
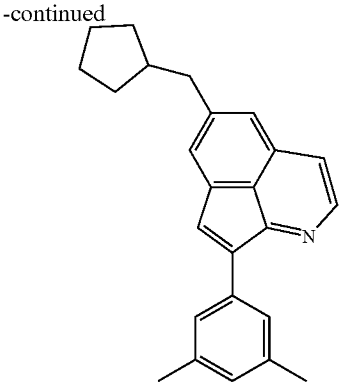
La009
Synthesis of a Compound La009
With reference to synthesis and purification methods of the compound La004, only the corresponding raw materials were required to be changed, and 20.14 g of a target compound La009 with a purity of 99.81% and a yield of 68.22% was obtained. The mass spectrum was 340.10 (M+H).
Synthesis of a Compound Ir(La009)$_2$(Lb005)
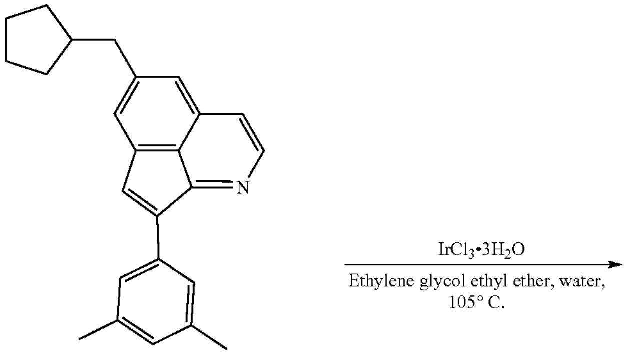
La009
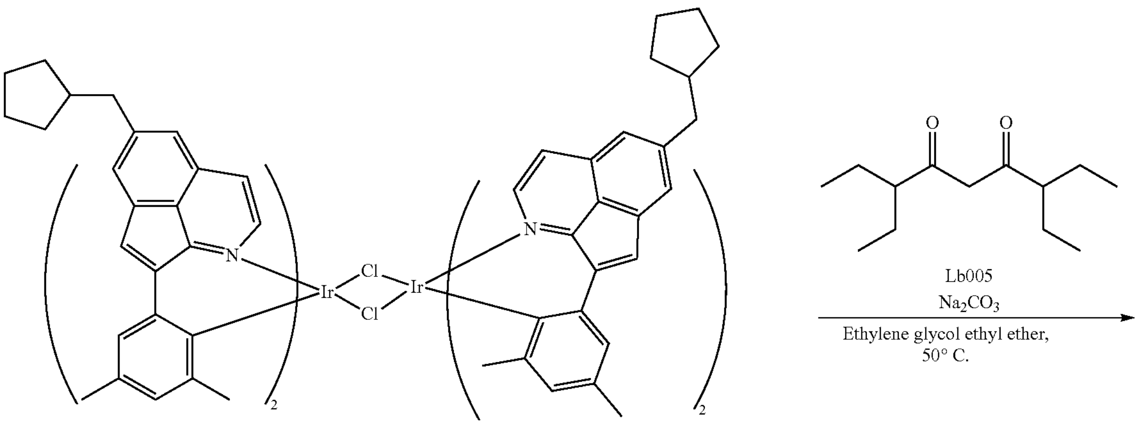
Ir(La009)-1

-continued

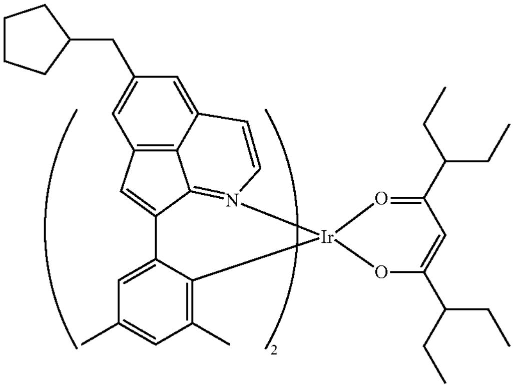

Ir(La009)2(Lb005)

Synthesis of a Compound Ir(La009)-1

With reference to synthesis and purification methods of the compound Ir(La004)-1, only the corresponding raw materials were required to be changed, and 10.53 g of a compound Ir(La009)-1 with a yield of 68.72% was obtained. The obtained compound was directly used in the next step without purification.

Synthesis of a Compound Ir(La009)$_2$(Lb005)

With reference to synthesis and purification methods of the compound Ir(La004)$_2$(Lb005), only the corresponding raw materials were required to be changed, and 4.14 g of a red solid compound Ir(La009)$_2$(Lb005) with a purity of 99.89% and a yield of 38.58% was obtained. 4.14 g of the crude product Ir(La009)$_2$(Lb005) was sublimated and purified to obtain 2.67 g of sublimated and purified Ir(La009)$_2$(Lb005) with a purity of 99.87% and a yield of 64.49%. The mass spectrum was 1081.52 (M+H).

$^1$H NMR (400 MHz, $CDCl_3$) δ 8.44 (d, J=15.12 Hz, 2H), 8.06 (m, 4H), 7.69 (s, 2H), 7.68-7.54 (m, 2H), 7.47-7.42 (s, 4H), 4.58 (s, 1H), 2.80 (m, 4H), 2.27 (s, 12H), 2.20 (m, 4H), 1.73-1.62 (m, 16H), 1.52-1.43 (m, 8H), 1.11-0.97 (m, 6H), 0.94 (m, 6H).

Synthesis of a Compound Ir(La009)$_2$(Lb007)

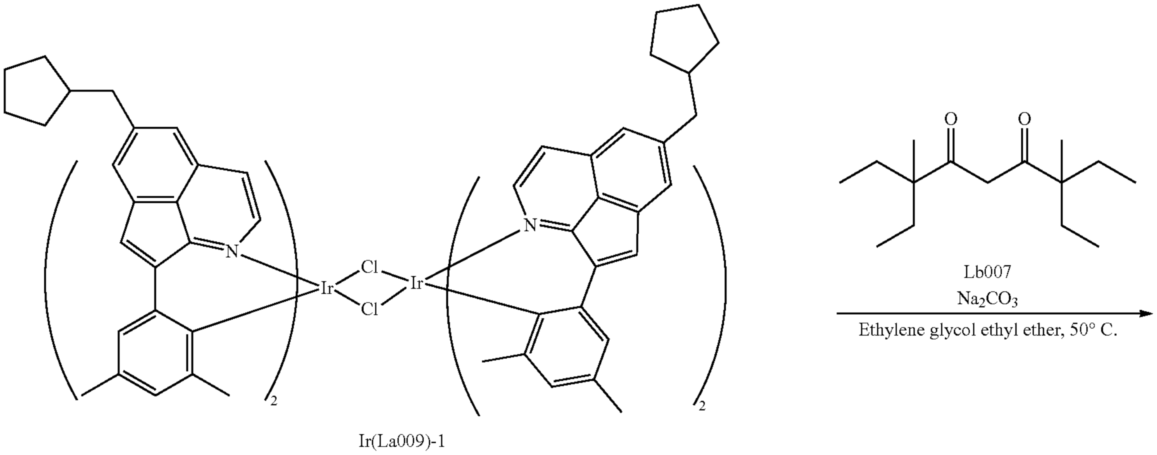

Ir(La009)-1

-continued

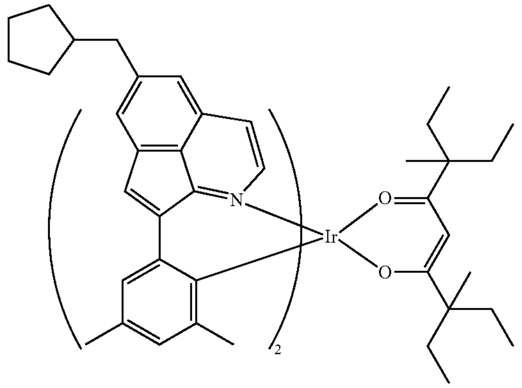

Ir(La009)$_2$(Lb007)

Synthesis of a Compound Ir(La009)$_2$(Lb007)

With reference to synthesis and purification methods of the compound Ir(La004)$_2$(Lb005), only the corresponding raw materials were required to be changed, and 3.53 g of a red solid compound Ir(La009)$_2$(Lb007) with a purity of 99.79% and a yield of 41.37% was obtained. 3.53 g of the crude product Ir(La009)$_2$(Lb007) was sublimated and purified to obtain 2.15 g of sublimated and purified Ir(La009)$_2$(Lb007) with a purity of 99.75% and a yield of 60.90%. The mass spectrum was 1109.52 (M+H).

$^1$H NMR (400 MHz, $CDCl_3$) δ 8.47 (d, J=15.20 Hz, 2H), 8.10 (m, 4H), 7.69 (s, 2H), 7.67-7.53 (m, 2H), 7.45-7.40 (s, 4H), 4.57 (s, 1H), 2.57 (m, 4H), 2.26 (s, 12H), 2.20-1.93 (m, 2H), 1.73-1.22 (m, 16H), 1.42-1.16 (m, 8H), 0.99-0.89 (m, 18H).

Synthesis of a Compound Ir(La009)$_2$(Lb031)

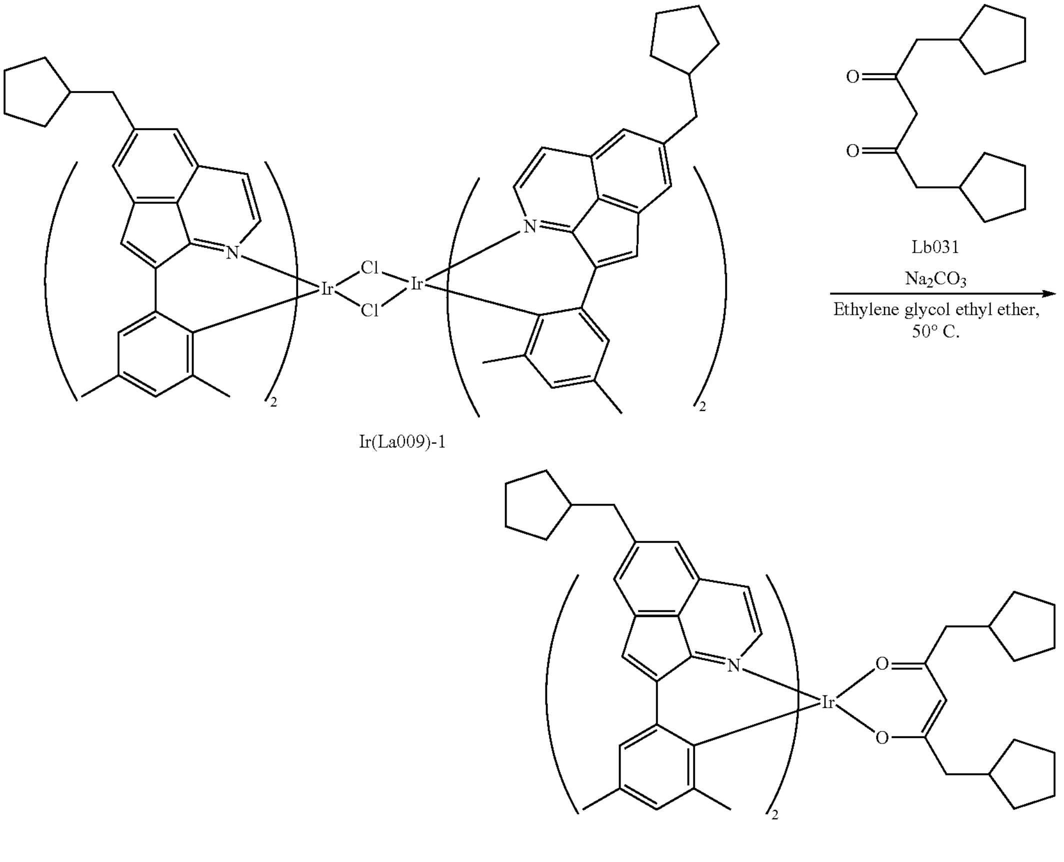

Ir(La009)-1

Ir(La009)$_2$(Lb031)

Synthesis of a Compound Ir(La009)$_2$(Lb031)

With reference to synthesis and purification methods of the compound Ir(La004)$_2$(Lb005), only the corresponding raw materials were required to be changed, and 2.21 g of a red solid compound Ir(La009)$_2$(Lb031) with a purity of 99.80% and a yield of 38.78% was obtained. 2.21 g of the crude product Ir(La009)$_2$(Lb031) was sublimated and purified to obtain 1.32 g of sublimated and purified Ir(La009)$_2$(Lb031) with a purity of 99.78% and a yield of 59.72%. The mass spectrum was 1105.54 (M+H).

$^1$H NMR (400 MHz, $CDCl_3$) δ 8.45 (d, J=15 Hz, 2H), 8.08 (m, 4H), 7.69 (s, 2H), 7.60-7.51 (m, 2H), 7.47-7.42 (s, 4H), 4.57 (s, 1H), 3.06 (m, 4H), 2.57 (m, 4H), 2.26 (s, 12H), 2.20-1.93 (m, 4H), 1.73-1.22 (m, 32H).

Synthesis of a Ligand La011

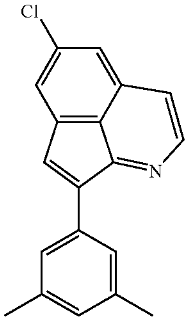

La004-4

+

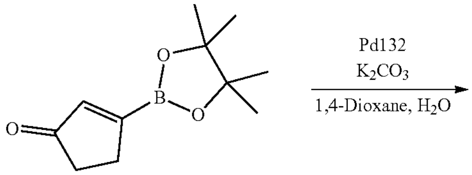

La011-1

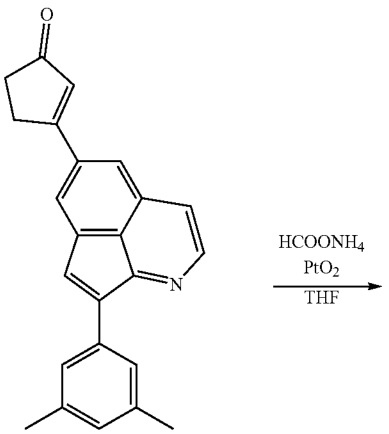

La011-2

-continued

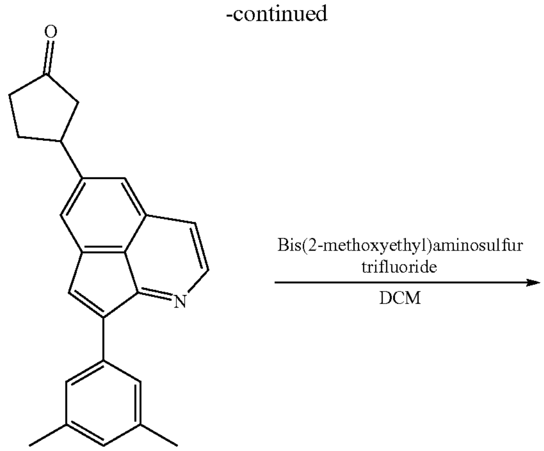

La011-3

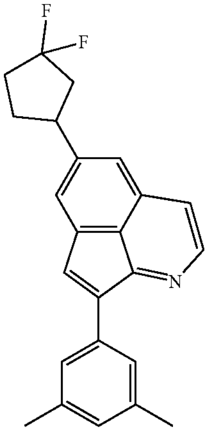

La011

Synthesis of a Compound La011-2

The La004-4 (30 g, 102.82 mmol), La011-1 (25.67 g, 123.38 mmol), bis(di-tert-butyl(4-dimethylaminophenyl) phosphine)dichloropalladium (730 mg, 1.03 mmol), potassium carbonate (28.40 g, 205.64 mmol), 1,4-dioxane (300 ml) and deionized water (100 ml) were added into a 1,000 ml one-necked round-bottomed flask, vacuumization was performed for nitrogen replacement for 3 times, and stirring was performed at 80° C. for 1 hour. According to monitoring by TLC (with a developing agent including ethyl acetate and petroleum ether at a ratio of 1:5), the raw material La004-4 was completely reacted.

Cooling was performed to room temperature, concentration was performed to remove a solvent, dichloromethane (500 ml) was added, and deionized water was added for washing (3*150 ml). Then, liquid separation was performed, and an organic phase was concentrated, followed by column chromatography with silica gel (200- to 300-mesh silica gel, with an eluting agent including ethyl acetate and petroleum ether at a ratio of 1:10) and concentration to obtain 29.91 g of a white solid compound La011-2 with a purity of 99.62% and a yield of 86.21%. The mass spectrum was: 338.24 (M+H).

Synthesis of a Compound La011-3

The La011-2 (25.20 g, 74.68 mmol), ammonium formate (47.09 mg, 746.84 mmol), platinum dioxide (1.7 g, 7.47 mmol) and tetrahydrofuran (500 ml) were added into a 1,000 ml three-necked round-bottomed flask, vacuumization was performed for nitrogen replacement for 3 times, and stirring was performed at 65° C. for 4 hours. According to monitoring by TLC, the raw material La011-2 was completely reacted.

Cooling was performed to room temperature, concentration was performed to remove a solvent, dichloromethane (700 ml) was added, and deionized water was added for washing (3*250 ml). Then, liquid separation was performed, and an organic phase was concentrated, followed by column chromatography with silica gel (200- to 300-mesh silica gel, with an eluting agent including ethyl acetate and petroleum ether at a ratio of 1:12) and concentration to obtain 17.77 g of a white sugar-like solid compound La011-3 with a purity of 99.58% and a yield of 70.11%. The mass spectrum was: 340.06 (M+H).

Synthesis of a Compound La011

The La011-3 (17.70 g, 52.15 mmol) and dichloromethane (200 ml) were added into a 500 ml three-necked round-bottomed flask, vacuumization was performed for nitrogen replacement for 3 times, bis(2-methoxyethyl)aminosulfur trifluoride (23.07 g, 104.30 mmol) was added dropwise under stirring at room temperature, and stirring was performed overnight at room temperature. According to monitoring by TLC (with a developing agent including ethyl acetate and petroleum ether at a ratio of 1:10), the raw material La011-3 was completely reacted.

A reaction solution was added dropwise into a saturated sodium bicarbonate aqueous solution for quenching a reaction, the pH value of the system was adjusted to 8, concentration was performed to remove tetrahydrofuran, dichloromethane (600 ml) was added for liquid separation, and deionized water was added for washing (3*230 ml). Then, liquid separation was performed, and an organic phase was concentrated, followed by column chromatography with silica gel (200- to 300-mesh silica gel, with an eluting agent including ethyl acetate and petroleum ether at a ratio of 1:20) and concentration to obtain 13.68 g of a white sugar-like solid compound La011 with a purity of 99.69% and a yield of 72.56%. The mass spectrum was: 362.14 (M+H).

Synthesis of a Compound Ir(La011)$_2$(Lb005)

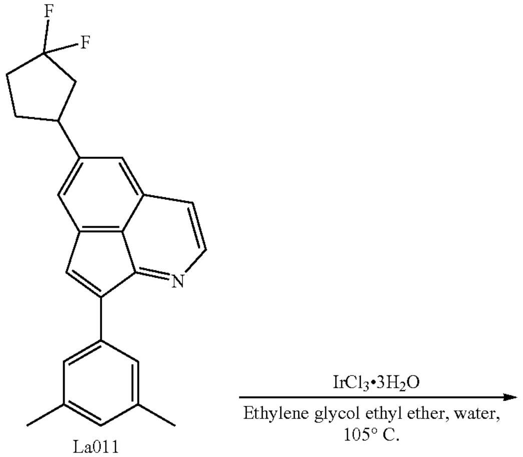

La011

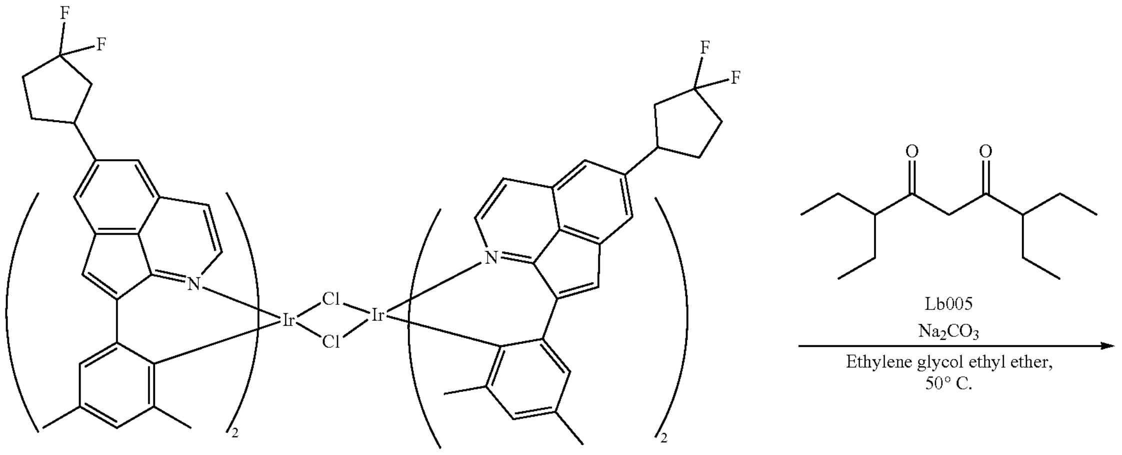

Ir(La011)-1

-continued

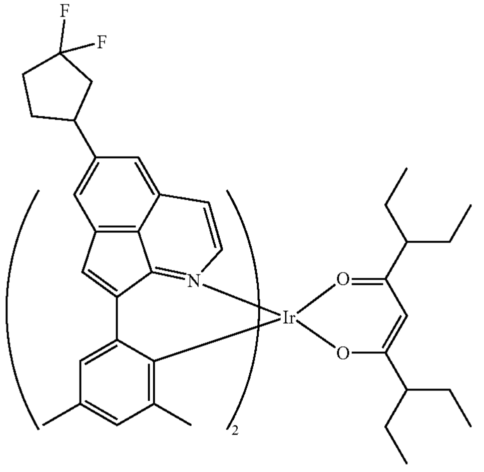

Ir(La011)$_2$(Lb005)

Synthesis of a Compound Ir(La011)-1

With reference to synthesis and purification methods of the compound Ir(La004)-1, only the corresponding raw materials were required to be changed, and 6.92 g of a compound Ir(La011)-1 with a yield of 68.33% was obtained. The obtained compound was directly used in the next step without purification.

Synthesis of a Compound Ir(La011)$_2$(Lb005)

With reference to synthesis and purification methods of the compound Ir(La004)$_2$(Lb005), only the corresponding raw materials were required to be changed, and 2.73 g of a red solid compound Ir(La011)$_2$(Lb005) with a purity of 99.75% and a yield of 32.81% was obtained. 2.73 g of the crude product Ir(La011)$_2$(Lb005) was sublimated and purified to obtain 1.64 g of sublimated and purified Ir(La011)$_2$(Lb005) with a purity of 99.68% and a yield of 60.04%. The mass spectrum was 1125.45 (M+H).

$^1$H NMR (400 MHz, $CDCl_3$) δ 8.40 (d, J=15.0 Hz, 2H), 8.13 (t, J=3.0 Hz, 2H), 7.89-7.79 (m, 4H), 7.55-7.51 (m, 2H), 7.21 (d, J=1.4 Hz, 2H), 7.03 (d, J=4.58 Hz, 2H), 4.60 (s, 1H), 3.30 (m, 2H), 2.27 (s, 12H), 2.20 (m, 2H), 1.96-1.76 (m, 12H), 1.52-1.43 (m, 8H), 1.11-0.98 (m, 6H), 0.97 (m, 6H).

Synthesis of a Ligand La020

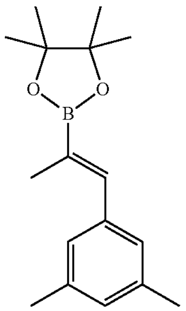

La020-1

+

-continued

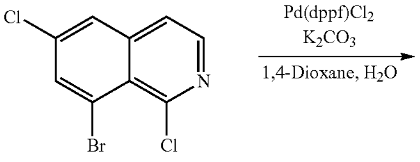

La004-2

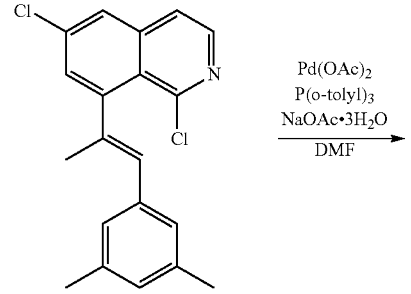

La020-3

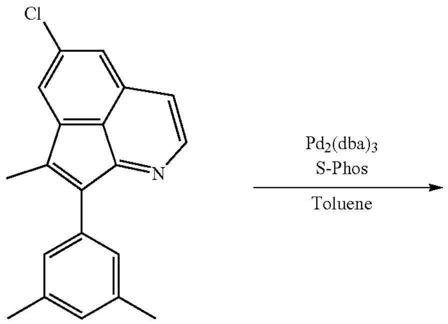

La020-4

-continued

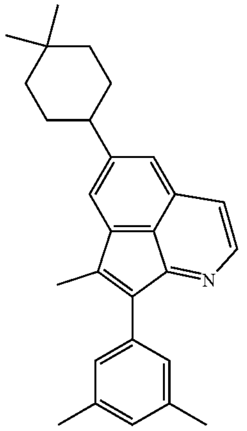

La020

Synthesis of a Compound La020-3

With reference to synthesis and purification methods of the compound La004-3, only the corresponding raw materials were required to be changed, and 24.87 g of a compound La020-3 with a purity of 99.36% and a yield of 80.11% was obtained. The mass spectrum was 342.28 (M+H).

Synthesis of a Compound La020-4

With reference to synthesis and purification methods of the compound La004-4, only the corresponding raw materials were required to be changed, and 17.47 g of a compound La020-4 with a purity of 99.50% and a yield of 78.62% was obtained. The mass spectrum was 306.88 (M+H).

Synthesis of a Compound La020

With reference to synthesis and purification methods of the compound La004, only the corresponding raw materials were required to be changed, and 14.24 g of a compound La020 with a purity of 99.74% and a yield of 68.75% was obtained. The mass spectrum was 382.15 (M+H).

Synthesis of a Compound Ir(La020)$_2$(Lb005)

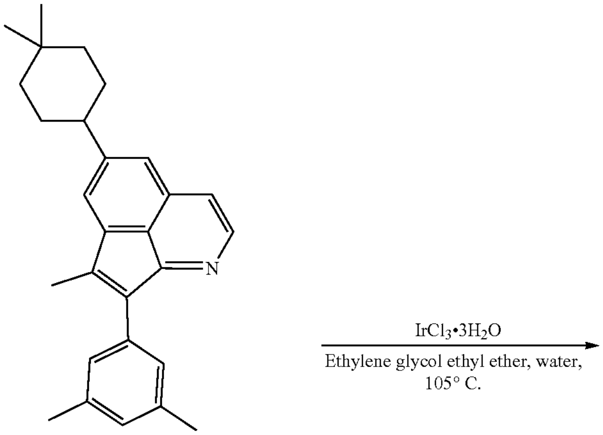

La020

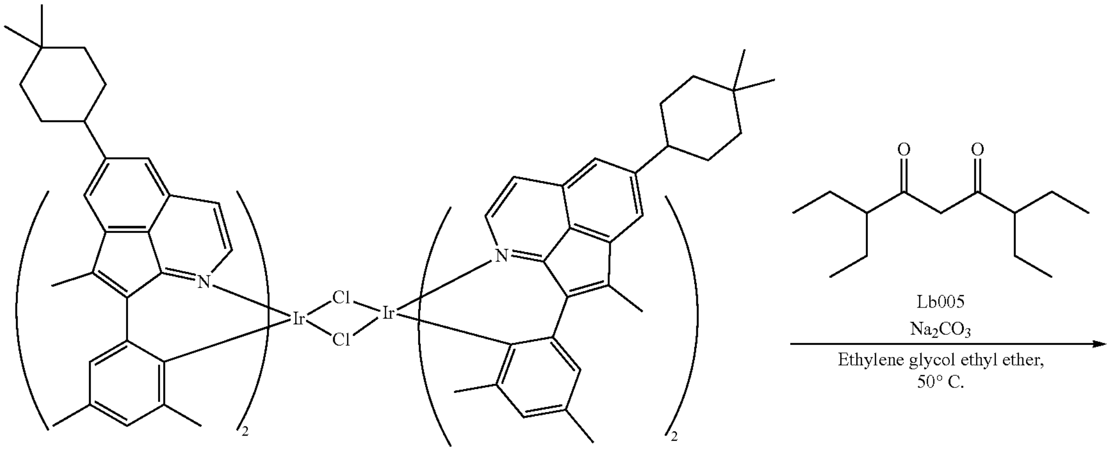

Ir(La020)-1

-continued

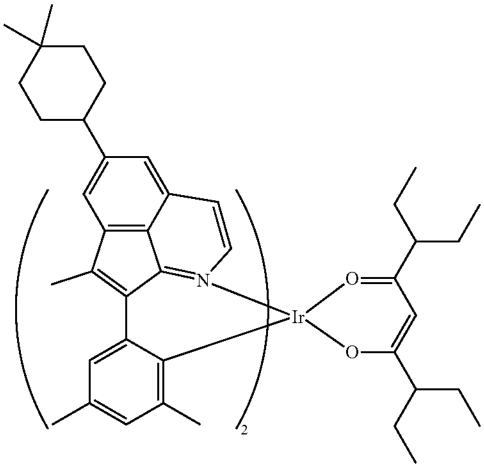

$Ir(La020)_2(Lb005)$

Synthesis of a Compound Ir(La020)-1

With reference to synthesis and purification methods of the compound Ir(La004)-1, only the corresponding raw materials were required to be changed, and 8.03 g of a compound Ir(La020)-1 with a yield of 66.54% was obtained. The obtained compound was directly used in the next step without purification.

Synthesis of a Compound $Ir(La020)_2(Lb005)$

With reference to synthesis and purification methods of the compound $Ir(La004)_2(Lb005)$, only the corresponding raw materials were required to be changed, and 2.51 g of a red solid compound $Ir(La020)_2(Lb005)$ with a purity of 99.79% and a yield of 33.72% was obtained. 2.51 g of the crude product $Ir(La020)_2(Lb005)$ was sublimated and purified to obtain 1.41 g of sublimated and purified $Ir(La020)_2(Lb005)$ with a purity of 99.74% and a yield of 56.17%. The mass spectrum was 1165.74 (M+H).

$^1H$ NMR (400 MHz, $CDCl_3$) δ 8.40 (d, J=7.5 Hz, 2H), 8.12-8.06 (m, 4H), 7.68 (d, J=1.4 Hz, 2H), 7.53 (m, 2H), 6.92 (s, 2H), 4.56 (s, 1H), 2.80-2.73 (m, 2H), 2.71 (m, 12H), 2.43 (m, 8H), 1.75-1.68 (m, 8H), 1.65-1.61 (m, 8H), 1.52-1.43 (m, 8H), 1.11-0.97 (m, 12H), 0.94 (m, 12H).

Synthesis of a Ligand La026

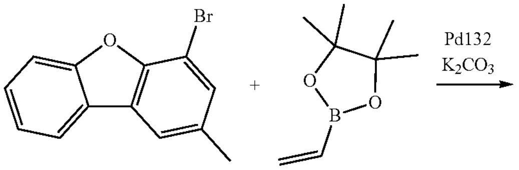

La026-1 La026-2

-continued

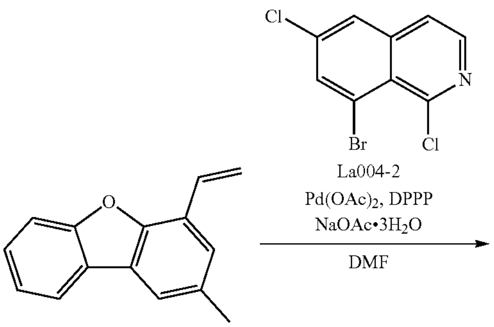

La026-3

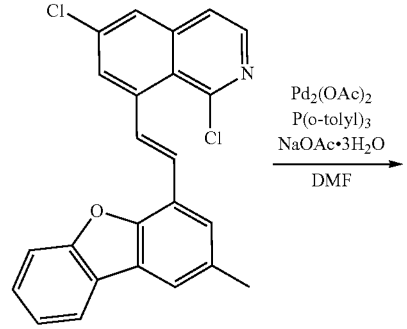

La026-4

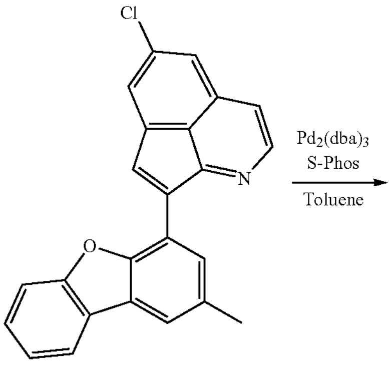

La026-5

-continued

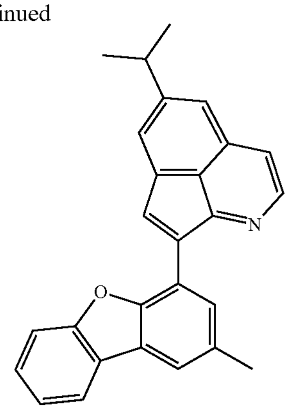

La026

Synthesis of a Compound La026-3

A compound La026-1 (33.00 g, 114.89 mmol), La026-2 (21.23 g, 137.87 mmol), bis(di-tert-butyl(4-dimethylamino-phenyl)phosphine)dichloropalladium (807.20 mg, 1.14 mmol), potassium carbonate (31.78 g, 229.96 mmol), toluene (360 ml), ethanol (120 ml) and deionized water (120 ml) were added into a 1,000 ml three-necked round-bottomed flask, vacuumization was performed for nitrogen replacement for 3 times, and stirring was performed at 75° C. for 2 hours under the protection of nitrogen. According to monitoring by TLC (with a developing agent including ethyl acetate and petroleum ether at a ratio of 1:10), the raw material La026-1 was completely reacted.

Ethyl acetate (300 ml) was added for liquid separation, and deionized water was added for washing (3*250 ml). Then, liquid separation was performed, and an organic phase was concentrated, followed by column chromatography with silica gel (200- to 300-mesh silica gel, with an eluting agent including ethyl acetate and petroleum ether at a ratio of 1:20) and concentration to obtain 20.10 g of a white solid compound La026-3 with a purity of 99.52% and a yield of 84.00%. The mass spectrum was: 209.08 (M+H).

Synthesis of a Compound La026-4

The compound La026-3 (19.16 g, 91.99 mmol), La004-2 (30.57 g, 110.39 mmol), palladium acetate (413.05 mg, 1.84 mmol), 1,3-bis(diphenylphosphino)propane (1.52 g, 3.68 mmol), sodium acetate trihydrate (25.03 g, 183.98 mmol) and N,N-dimethylformamide (250 ml) were added into a 1,000 ml three-necked round-bottomed flask, vacuumization was performed for nitrogen replacement for 3 times, and stirring was performed at 80° C. for 8 hours. According to monitoring by TLC (with a developing agent including ethyl acetate and petroleum ether at a ratio of 1:7), the raw material La026-3 was completely reacted.

Concentration was directly performed to remove the N,N-dimethylformamide, ethyl acetate (800 ml) was added, and deionized water was added for washing (3*350 ml). Then, liquid separation was performed, and an organic phase was concentrated, followed by column chromatography with silica gel (200- to 300-mesh silica gel, with an eluting agent including ethyl acetate and petroleum ether at a ratio of 1:15) and concentration to obtain 26.09 g of a light yellow sugar-like solid compound La026-4 with a purity of 99.55% and a yield of 70.14%. The mass spectrum was: 404.06 (M+H).

Synthesis of a Compound La026-5

With reference to synthesis and purification methods of the compound La004-4, only the corresponding raw materials were required to be changed, and 19.23 g of a compound La026-5 with a purity of 99.45% and a yield of 76.92% was obtained. The mass spectrum was 368.18 (M+H).

Synthesis of a Compound La026

With reference to synthesis and purification methods of the compound La004, only the corresponding raw materials were required to be changed, and 10.15 g of a compound La026 with a purity of 99.65% and a yield of 67.73% was obtained. The mass spectrum was 376.26 (M+H).

Synthesis of a Compound $Ir(La026)_2(Lb005)$

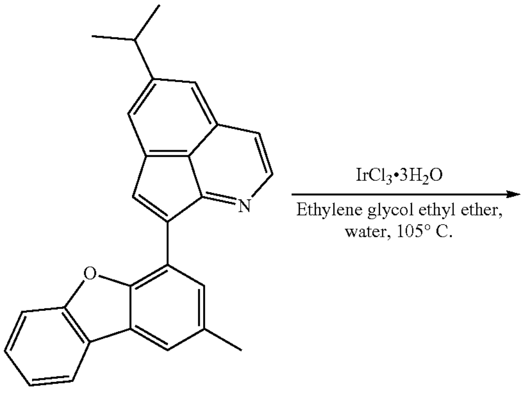

La026

-continued

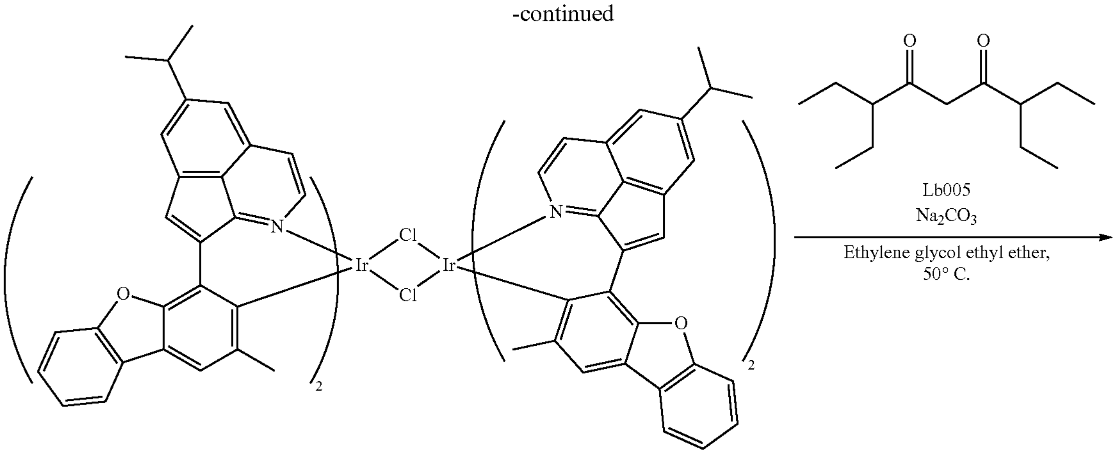

Ir(La026)-1

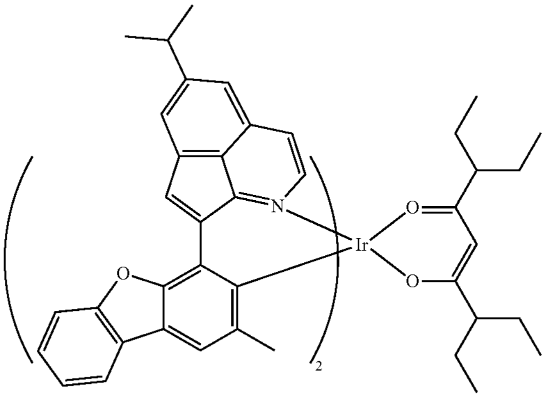

$Ir(La026)_2(Lb005)$

Synthesis of a Compound Ir(La026)-1

With reference to synthesis and purification methods of the compound Ir(La004)-1, only the corresponding raw materials were required to be changed, and 7.66 g of a compound Ir(La026)-1 with a yield of 45.72% was obtained. The obtained compound was directly used in the next step without purification.

Synthesis of a Compound $Ir(La026)_2(Lb005)$

With reference to synthesis and purification methods of the compound $Ir(La004)_2(Lb005)$, only the corresponding raw materials were required to be changed, and 2.10 g of a red solid compound $Ir(La026)_2(Lb005)$ with a purity of 99.90% and a yield of 35.86% was obtained. 2.10 g of the crude product $Ir(La026)_2(Lb005)$ was sublimated and purified to obtain 1.22 g of sublimated and purified $Ir(La026)_2(Lb005)$ with a purity of 99.85% and a yield of 58.09%. The mass spectrum was 1153.36 (M+H).

$^1H$ NMR (400 MHz, $CDCl_3$) δ 8.40 (d, J=7.5 Hz, 2H), 8.12 (dt, J=10.4, 1.3 Hz, 4H), 7.98 (dd, J=7.4, 1.5 Hz, 2H), 7.82 (s, 2H), 7.56-7.50 (m, 4H), 7.41-7.36 (m, 4H), 7.31 (td, J=7.5, 1.5 Hz, 2H), 4.70 (s, 1H), 2.87 (m, 2H), 2.47 (s, 6H), 2.03-2.01 (m, 2H), 1.68-1.46 (m, 8H), 1.21-1.13 (m, 12H), 0.98-0.85 (m, 12H).

Synthesis of a Ligand La033

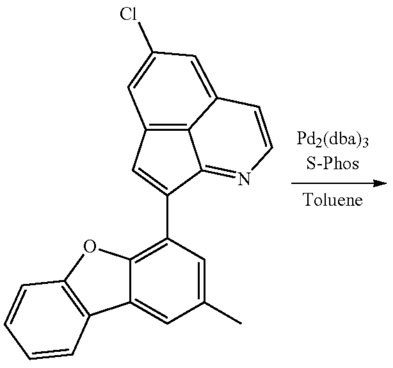

La026-4

-continued
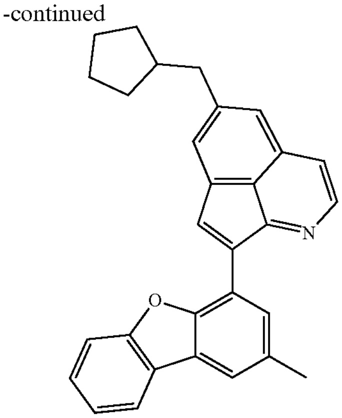
La033
Synthesis of a Compound La033
With reference to synthesis and purification methods of the compound La004, only the corresponding raw materials were required to be changed, and 16.54 g of a compound La033 with a purity of 99.50% and a yield of 62.53% was obtained. The mass spectrum was 416.06 (M+H).
Synthesis of a Compound $Ir(La033)_2(Lb005)$
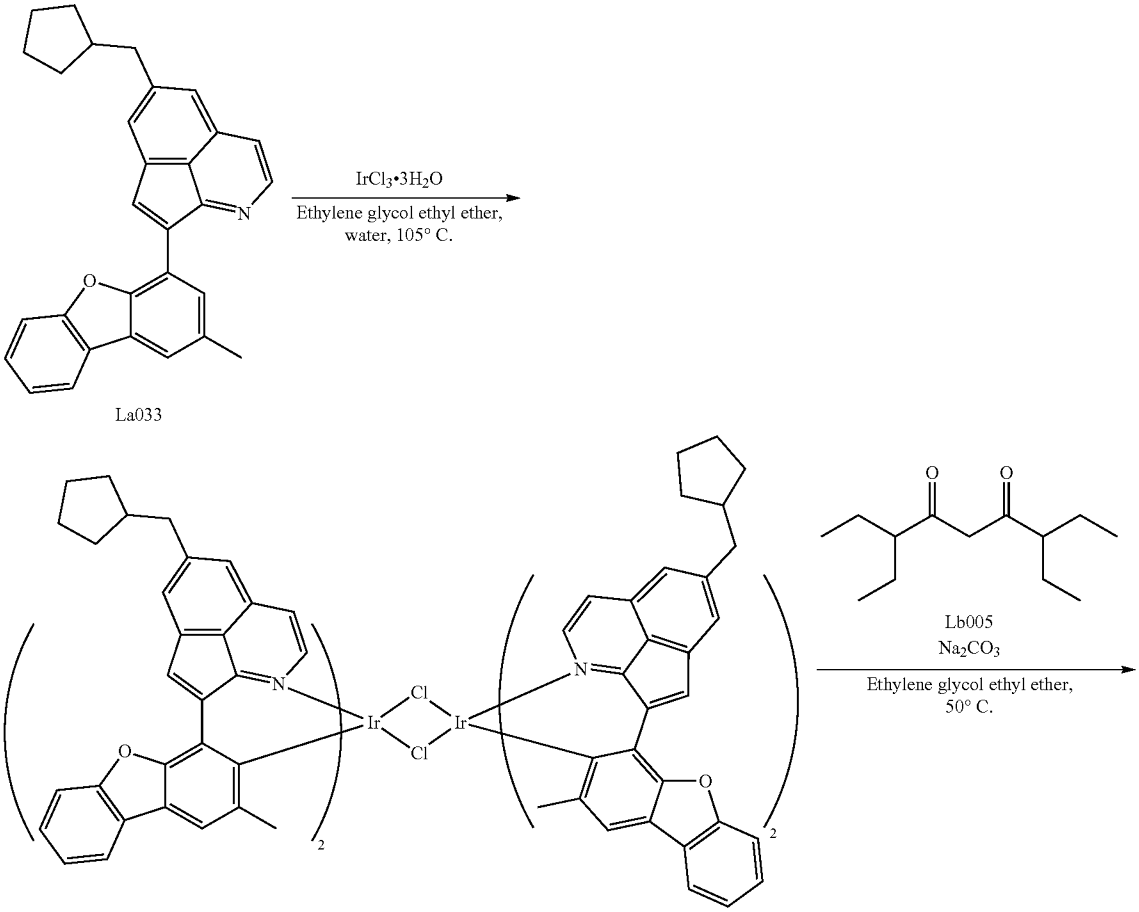
La033
Ir(La033)-1

-continued

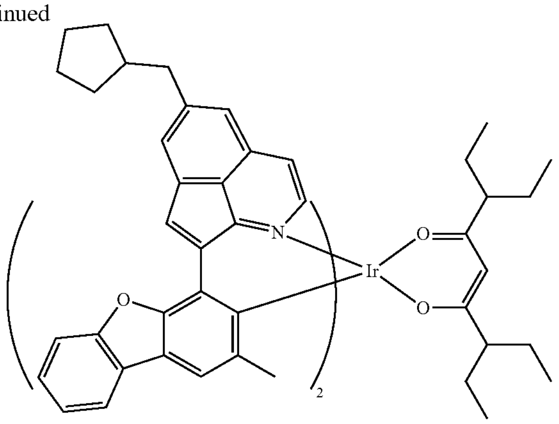

Ir(La033)$_2$(Lb005)

Synthesis of a Compound Ir(La033)-1

With reference to synthesis and purification methods of the compound Ir(La004)-1, only the corresponding raw materials were required to be changed, and 9.01 g of a compound Ir(La033)-1 with a yield of 47.31% was obtained. The obtained compound was directly used in the next step without purification.

Synthesis of a Compound Ir(La033)$_2$(Lb005)

With reference to synthesis and purification methods of the compound Ir(La004)$_2$(Lb005), only the corresponding raw materials were required to be changed, and 4.02 g of a red solid compound Ir(La033)$_2$(Lb005) with a purity of 99.76% and a yield of 46.27% was obtained. 4.02 g of the crude product Ir(La033)$_2$(Lb005) was sublimated and purified to obtain 2.41 g of sublimated and purified Ir(La033)$_2$ (Lb005) with a purity of 99.68% and a yield of 59.95%. The mass spectrum was 1233.58 (M+H).

$^1$H NMR (400 MHz, $CDCl_3$) δ 8.44 (d, J=7.5 Hz, 2H), 8.09 (t, J=1.3 Hz, 4H), 7.98 (dd, J=7.4, 1.5 Hz, 2H), 7.82 (s, 2H), 7.58-7.53 (m, 4H), 7.39 (td, J=7.5, 1.5 Hz, 2H), 7.35 (d, J=1.3 Hz, 2H), 7.31 (td, J=7.5, 1.5 Hz, 2H), 4.58 (s, 1H), 2.57 (m, 4H), 2.27 (s, 6H), 2.10-1.99 (m, 4H), 1.76-1.62 (m, 16H), 1.52-1.43 (m, 8H), 1.11-0.97 (m, 6H), 0.94 (m, 6H).

Synthesis of a Ligand La051

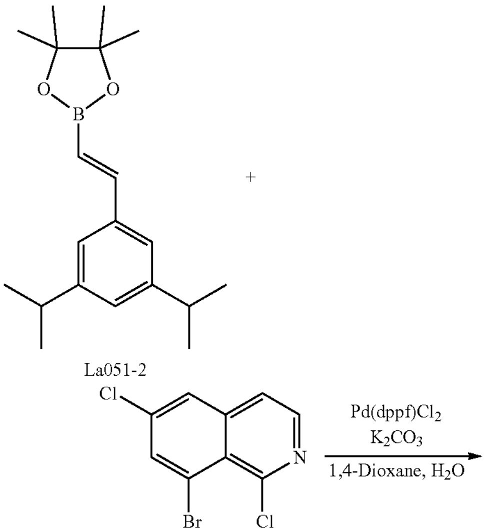

La051-2

La004-2

-continued

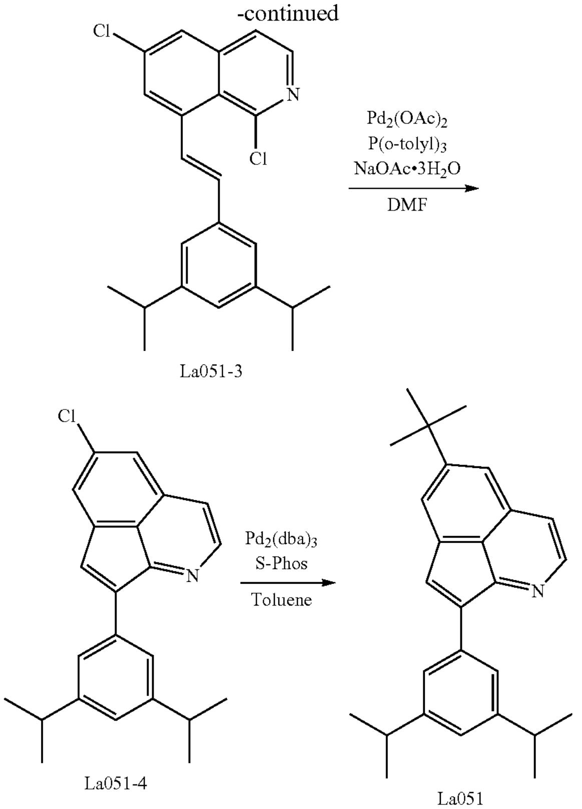

La051-3

La051-4

La051

Synthesis of a Compound La051-3

With reference to synthesis and purification methods of the compound La004-3, only the corresponding raw materials were required to be changed, and 19.11 g of a compound La051-3 with a purity of 99.63% and a yield of 67.44% was obtained. The mass spectrum was 384.02 (M+H).

Synthesis of a Compound La051-4

With reference to synthesis and purification methods of the compound La004-4, only the corresponding raw materials were required to be changed, and 12.34 g of a compound La051-4 with a purity of 99.30% and a yield of 75.05% was obtained. The mass spectrum was 348.52 (M+H).

Synthesis of a Compound La051
With reference to synthesis and purification methods of the compound La004, only the corresponding raw materials were required to be changed, and 9.16 g of a compound La051 with a purity of 99.86% and a yield of 68.07% was obtained. The mass spectrum was 370.45 (M+H).
Synthesis of a Compound $Ir(La051)_2(Lb005)$
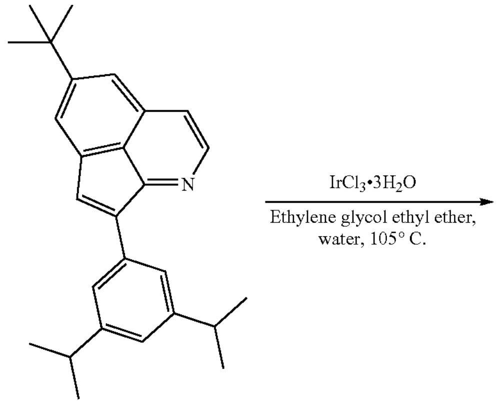
La051
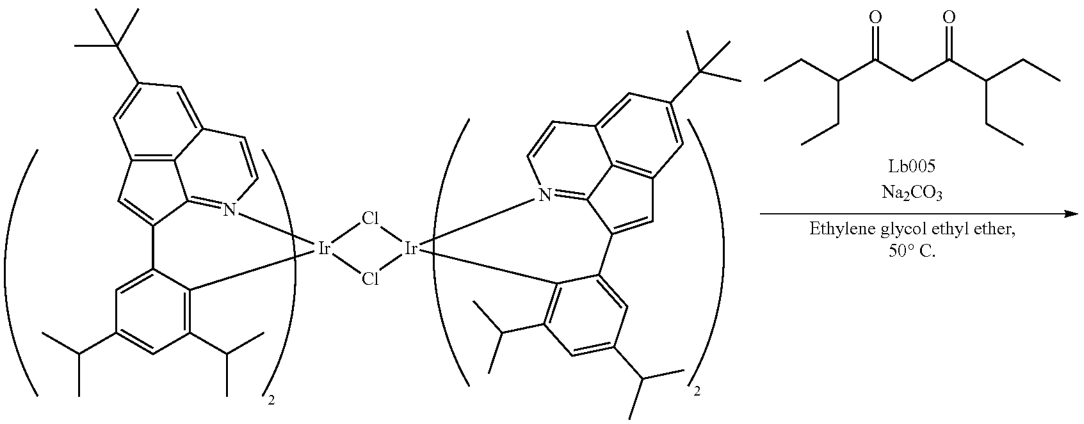
Ir(La05)-1
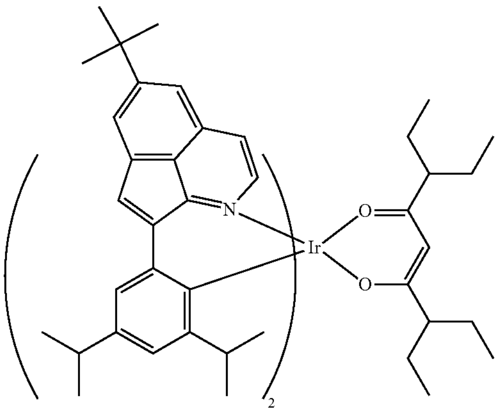
$Ir(La051)_2(Lb005)$ Synthesis of a Compound Ir(La051)-1

With reference to synthesis and purification methods of the compound Ir(La004)-1, only the corresponding raw materials were required to be changed, and 6.01 g of a compound Ir(La051)-1 with a yield of 75.66% was obtained. The obtained compound was directly used in the next step without purification.

Synthesis of a Compound $Ir(La051)_2(Lb005)$

With reference to synthesis and purification methods of the compound $Ir(La004)_2(Lb005)$, only the corresponding raw materials were required to be changed, and 3.35 g of a red solid compound $Ir(La051)_2(Lb005)$ with a purity of 99.88% and a yield of 52.52% was obtained. 3.35 g of the crude product $Ir(La051)_2(Lb005)$ was sublimated and purified to obtain 2.13 g of sublimated and purified $Ir(La051)_2(Lb005)$ with a purity of 99.86% and a yield of 63.58%. The mass spectrum was 1141.43 (M+H).

$^1H$ NMR (400 MHz, $CDCl_3$) δ 8.39 (d, J=14.8 Hz, 2H), 8.08-8.07 (m, 2H), 8.04 (t, J=3.0 Hz, 2H), 7.66 (d, J=3.1 Hz, 2H), 7.52 (dd, J=15.0, 2.9 Hz, 2H), 7.21 (d, J=1.4 Hz, 2H), 7.06 (d, J=3.1 Hz, 2H), 4.58 (s, 1H), 2.87 (m, 4H), 2.27 (m, 2H), 1.32-1.30 (m, 42H), 1.63-1.22 (m, 8H), 0.94-0.85 (m, 12H).

Synthesis of a Ligand La064

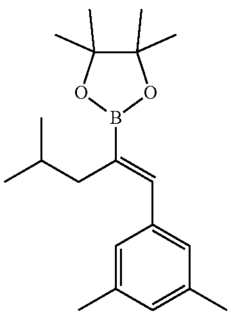

La064-2

+

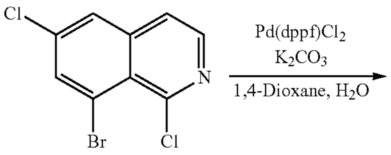

La004-2

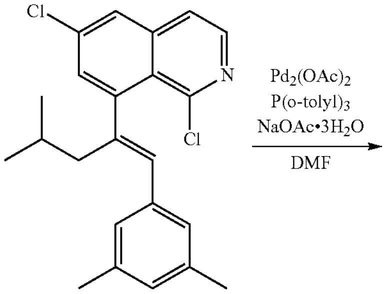

La064-3

-continued

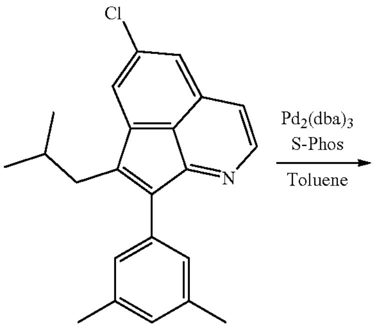

La064-4

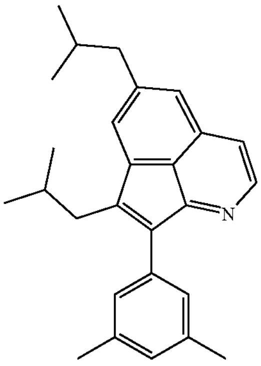

La064

Synthesis of a Compound La064-1

With reference to synthesis and purification methods of the compound La004-3, only the corresponding raw materials were required to be changed, and 15.24 g of a compound La064-3 with a purity of 99.43% and a yield of 65.35% was obtained. The mass spectrum was 384.02 (M+H).

Synthesis of a Compound La064-4

With reference to synthesis and purification methods of the compound La004-4, only the corresponding raw materials were required to be changed, and 11.85 g of a compound La064-4 with a purity of 99.30% and a yield of 73.16% was obtained. The mass spectrum was 348.52 (M+H).

Synthesis of a Compound La064

With reference to synthesis and purification methods of the compound La004, only the corresponding raw materials were required to be changed, and 8.86 g of a compound La064 with a purity of 99.61% and a yield of 65.95% was obtained. The mass spectrum was 370.45 (M+H).

Synthesis of a Compound Ir(La064)$_2$(Lb005)

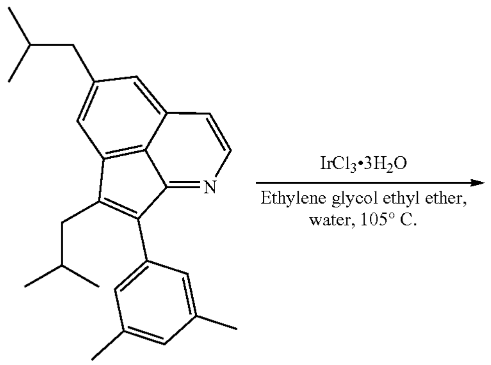

La064

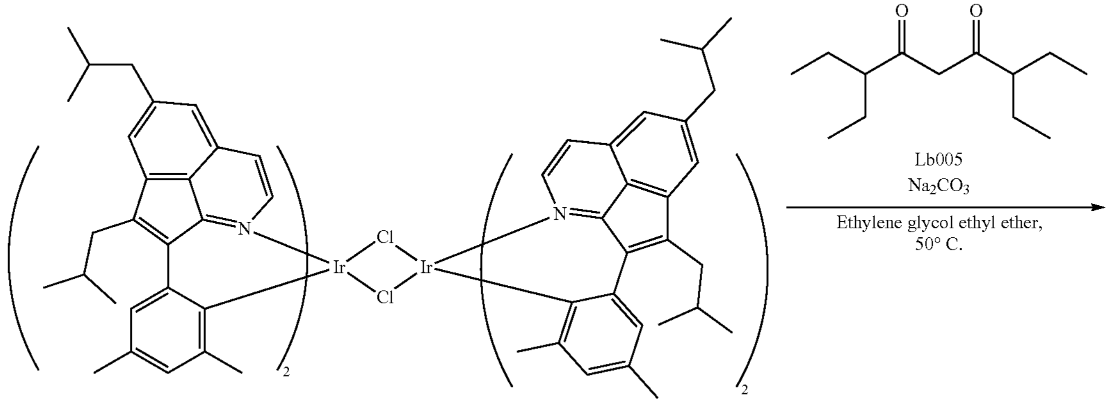

Ir(La064)-1

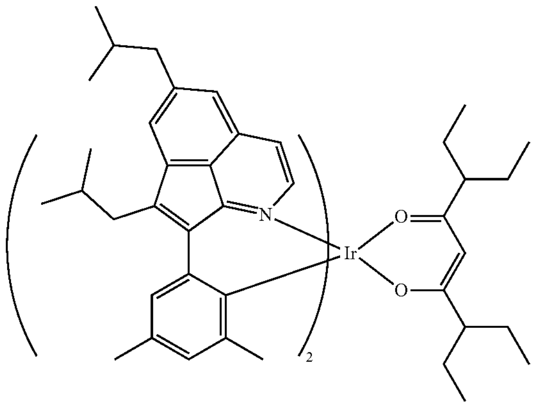

Ir(La064)$_2$(Lb005)

Synthesis of a Compound Ir(La064)-1

With reference to synthesis and purification methods of the compound Ir(La004)-1, only the corresponding raw materials were required to be changed, and 5.73 g of a compound Ir(La064)-1 with a yield of 74.21% was obtained. The obtained compound was directly used in the next step without purification.

Synthesis of a Compound Ir(La064)$_2$(Lb005)

With reference to synthesis and purification methods of the compound Ir(La004)$_2$(Lb005), only the corresponding raw materials were required to be changed, and 1.80 g of a red solid compound Ir(La064)$_2$(Lb005) with a purity of 99.83% and a yield of 56.71% was obtained. 1.80 g of the crude product Ir(La064)$_2$(Lb005) was sublimated and purified to obtain 1.10 g of sublimated and purified Ir(La064)$_2$(Lb005) with a purity of 99.79% and a yield of 61.11%. The mass spectrum was 1141.43 (M+H).

$^1$H NMR (400 MHz, $CDCl_3$), δ 8.44 (d, J=15.0 Hz, 2H), 8.10-8.01 (m, 4H), 7.57 (dd, J=15.0, 3.0 Hz, 2H), 7.51 (d, J=3.1 Hz, 2H), 6.75 (d, J=2.9 Hz, 2H), 4.60 (s, 1H), 2.47-2.43 (m, 8H), 2.33-2.15 (m, 12H), 1.82-1.80 (m, 6H), 1.31-1.24 (m, 8H), 0.94-0.86 (m, 36H).

Synthesis of a Ligand La080

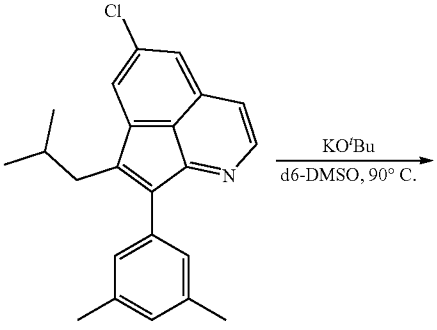

La064-4

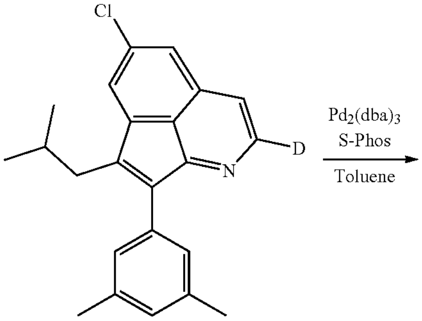

La080-4

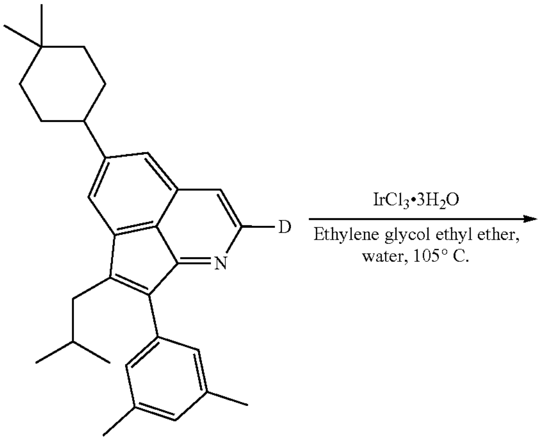

La080

-continued

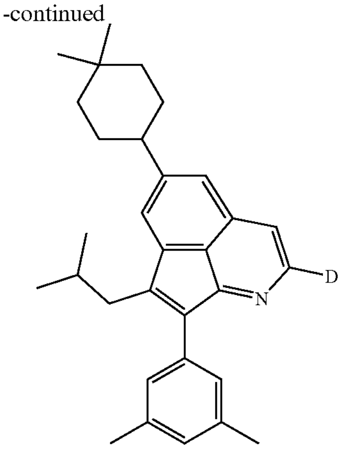

La080

Synthesis of a Compound La080-4

The La064-4 (16.21 g, 46.60 mmol), potassium tert-butoxide (10.46 g, 93.19 mmol) and deuterated dimethyl sulfoxide (80 ml) were added into a 250 ml three-necked round-bottomed flask, vacuumization was performed for nitrogen replacement for 3 times, and heating was performed to 90° C. for a reaction overnight for 15 hours. According to nuclear magnetic monitoring, the La064-4 was completely reacted.

A reaction solution was added dropwise into deionized water (250 ml), ethyl acetate (500 ml) was added, stirring was performed at room temperature for 30 minutes for liquid separation, and an organic phase was washed with deionized water (3*150 ml). Then, liquid separation was performed, and an organic phase was concentrated, followed by column chromatography with silica gel (200- to 300-mesh silica gel, with an eluting agent including ethyl acetate and petroleum ether at a ratio of 1:15) and concentration to obtain 15.44 g of a white sugar-like solid compound La080-4 with a purity of 99.60%, a deuterated ratio of 99.12% and a yield of 95.00%. The mass spectrum was: 349.05 (M+H).

Synthesis of a Compound La080

With reference to synthesis and purification methods of the compound La004, only the corresponding raw materials were required to be changed, and 10.16 g of a compound La080 with a purity of 99.51% and a yield of 67.05% was obtained. The mass spectrum was 425.35 (M+H).

Synthesis of a Compound Ir(La080)$_2$(Lb005)

-continued

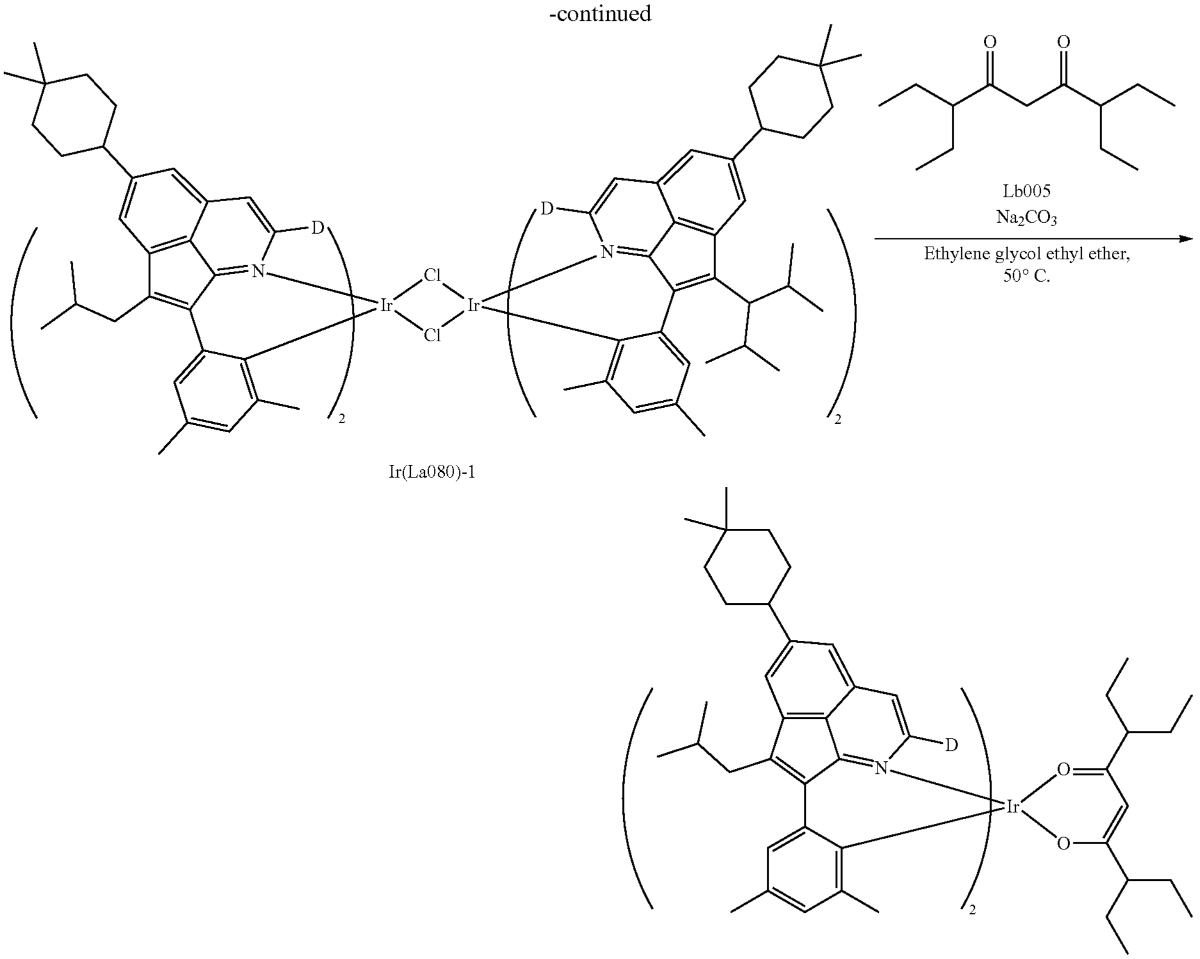

Ir(La080)-1

Ir(La080)$_2$(Lb005)

Synthesis of a Compound Ir(La080)-1

With reference to synthesis and purification methods of the compound Ir(La004)-1, only the corresponding raw materials were required to be changed, and 6.10 g of a compound Ir(La080)-1 with a yield of 75.27% was obtained. The obtained compound was directly used in the next step without purification.

Synthesis of a Compound Ir(La080)$_2$(Lb005)

With reference to synthesis and purification methods of the compound Ir(La004)$_2$(Lb005), only the corresponding raw materials were required to be changed, and 1.98 g of a red solid compound Ir(La080)$_2$(Lb005) with a purity of 99.77% and a yield of 54.38% was obtained. 1.98 g of the crude product Ir(La080)$_2$(Lb005) was sublimated and purified to obtain 1.33 g of sublimated and purified Ir(La080)$_2$ (Lb005) with a yield of 67.17%. The mass spectrum was 1251.62 (M+H).

$^1$H NMR (400 MHz, $CDCl_3$) δ 8.79 (d, J=2.7 Hz, 2H), 8.64-8.62 (m, 4H), 7.70 (d, J=2.9 Hz, 2H), 6.94 (d, J=2.9 Hz, 2H), 4.84 (s, 1H), 2.73-2.47 (m, 6H), 2.40 (s, 12H), 2.31 (m, 2H), 1.83-1.63 (m, 18H), 1.44-1.31 (m, 8H), 0.94-0.86 (m, 36H).

Synthesis of a Ligand La102

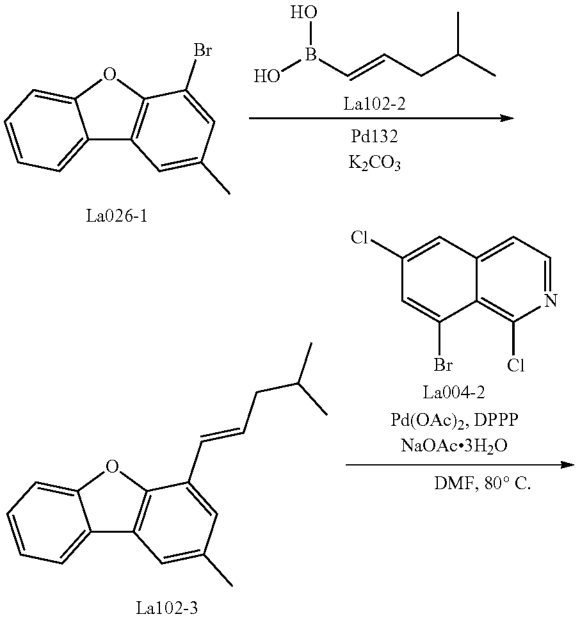

La026-1

La102-3

-continued

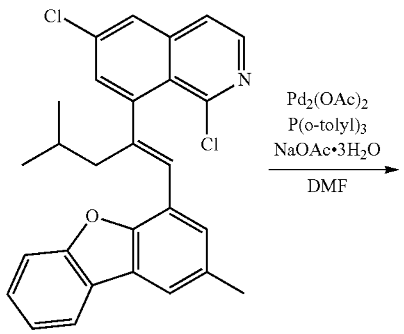

La102-4

-continued

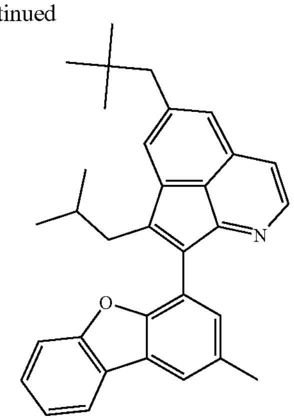

La102

Synthesis of a Compound La102-3

With reference to synthesis and purification methods of the compound La026-3, only the corresponding raw materials were required to be changed, and 25.86 g of a compound La102-3 with a purity of 99.61% and a yield of 85.14% was obtained. The mass spectrum was 265.27 (M+H).

Synthesis of a Compound La102-4

With reference to synthesis and purification methods of the compound La026-4, only the corresponding raw materials were required to be changed, and 30.19 g of a light yellow sugar-like solid compound La102-4 with a purity of 99.34% and a yield of 71.28% was obtained. The mass spectrum was 460.32 (M+H).

Synthesis of a Compound La102-5

With reference to synthesis and purification methods of the compound La004-4, only the corresponding raw materials were required to be changed, and 17.44 g of a compound La102-5 with a purity of 99.51% and a yield of 78.80% was obtained. The mass spectrum was 424.26 (M+H).

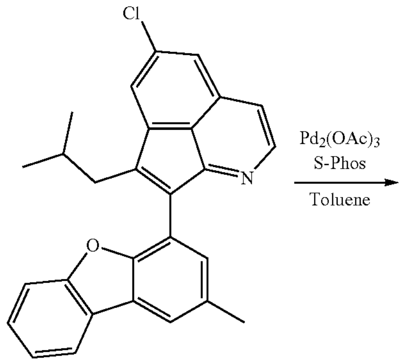

La102-5

Synthesis of a Compound La102

With reference to synthesis and purification methods of the compound La004, only the corresponding raw materials were required to be changed, and 11.71 g of a compound La102 with a purity of 99.65% and a yield of 71.02% was obtained. The mass spectrum was 460.28 (M+H).

Synthesis of a Compound Ir(La102)$_2$(Lb005)

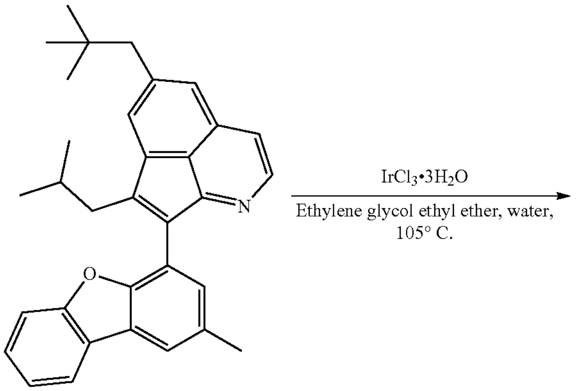

La102

-continued

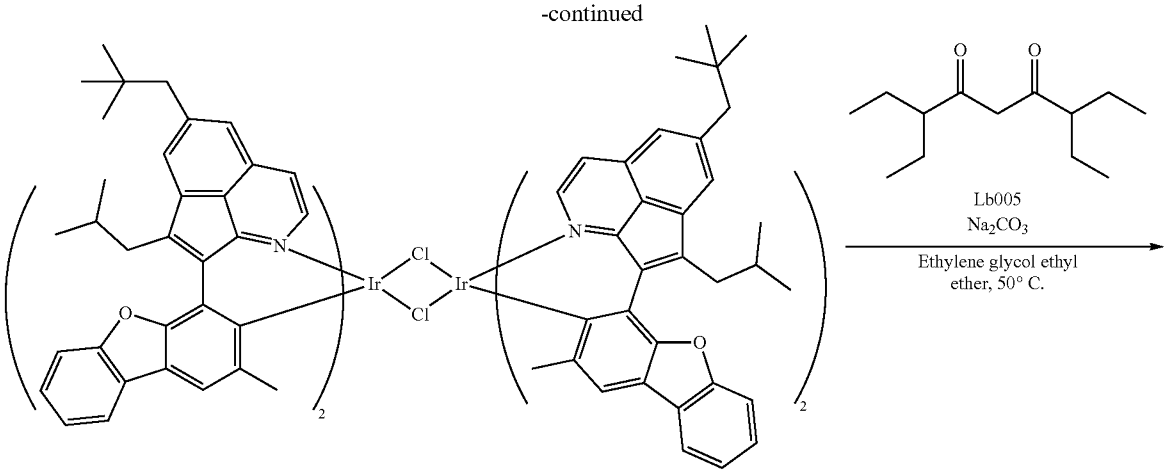

Ir(La102)-1

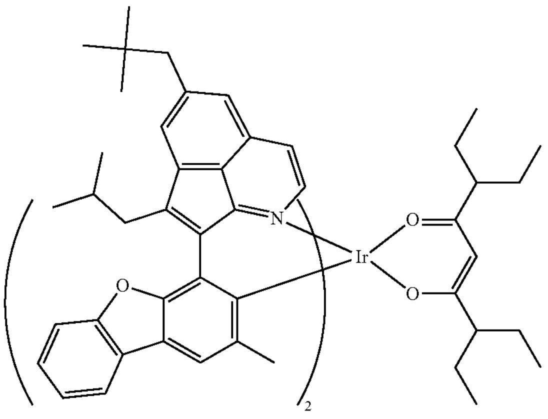

$Ir(La102)_2(Lb005)$

Synthesis of a Compound Ir(La102)-1

With reference to synthesis and purification methods of the compound Ir(La004)-1, only the corresponding raw materials were required to be changed, and 7.00 g of a compound Ir(La102)-1 with a yield of 78.66% was obtained. The obtained compound was directly used in the next step without purification.

Synthesis of a Compound $Ir(La102)_2(Lb005)$

With reference to synthesis and purification methods of the compound $Ir(La004)_2(Lb005)$, only the corresponding raw materials were required to be changed, and 3.28 g of a red solid compound $Ir(La102)_2(Lb005)$ with a purity of 99.76% and a yield of 48.58% was obtained. 3.28 g of the crude product $Ir(La102)_2(Lb005)$ was sublimated and purified to obtain 2.04 g of sublimated and purified $Ir(La102)_2(Lb005)$ with a purity of 99.76% and a yield of 62.19%. The mass spectrum was 1321.26 (M+H).

$^1H$ NMR (400 MHz, $CDCl_3$) δ 8.44 (d, J=15.0 Hz, 2H), 8.12-8.04 (m, 4H), 7.98 (dd, J=14.6, 3.4 Hz, 2H), 7.78 (s, 2H), 7.59-7.52 (m, 4H), 7.42-7.28 (m, 4H), 4.79 (s, 1H), 2.47-2.43 (m, 8H), 2.35 (s, 6H), 2.31 (m, 2H), 1.83-1.73 (m, 2H), 1.31-1.24 (m, 8H), 0.94-0.86 (m, 42H).

Synthesis of a Compound Ir(La004)(Lb005)(Lc004)
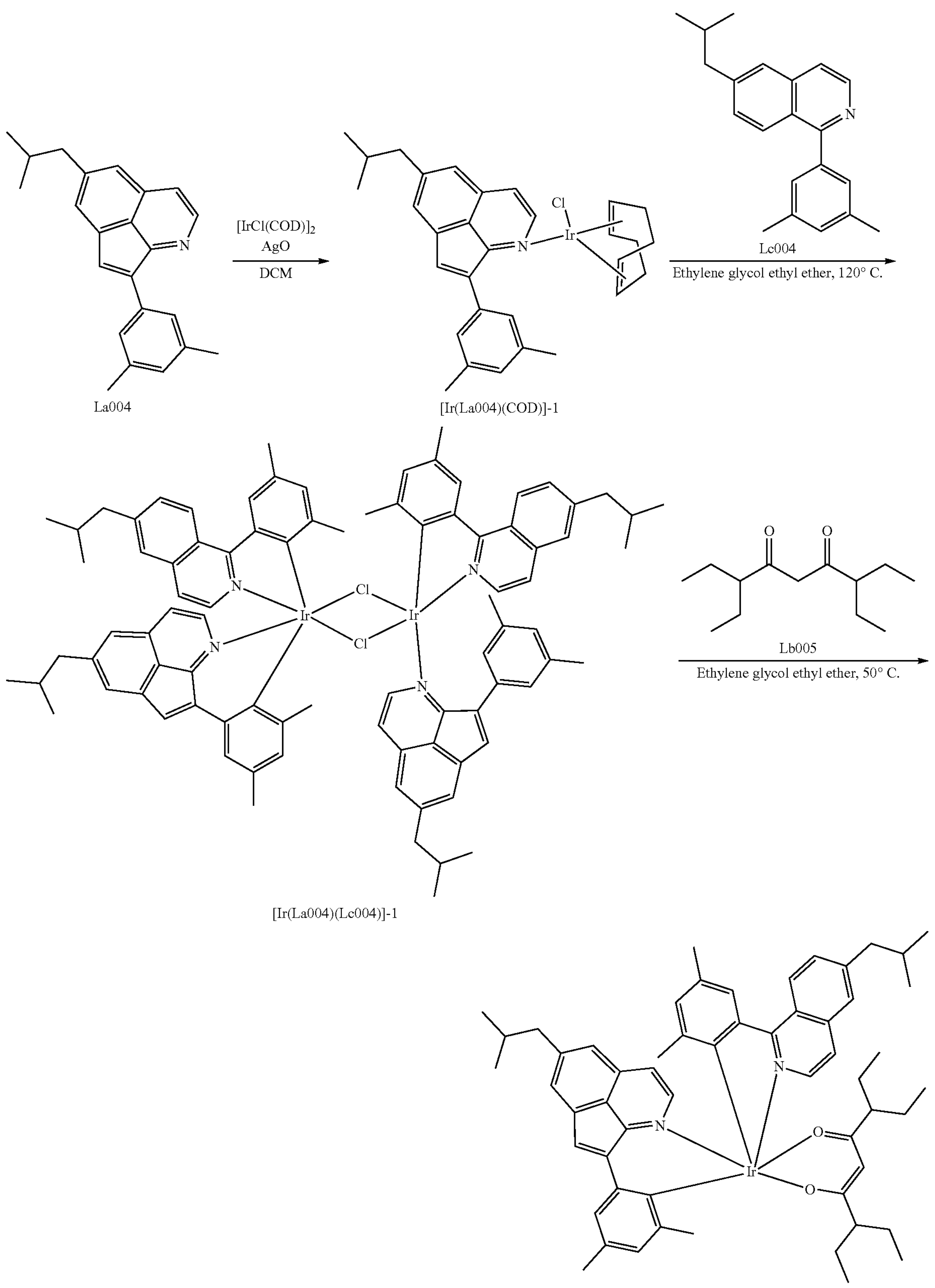
Ir(La004)(Lb005)(Lc004)

Synthesis of a Compound [Ir(La004)(COD)]-1

The La004 (14.27 g, 45.52 mmol), silver oxide (5.27 g, 22.76 mmol), 4A powdered molecular sieve (15 g) and dichloromethane (300 ml) were added into a 1,000 ml one-necked round-bottomed flask, vacuumization was performed for nitrogen replacement for 3 times, and stirring was performed to carry out a reaction at room temperature for 2 hours until a reaction solution became a brownish black turbid solution. According to monitoring by TLC (with a developing agent including ethyl acetate and petroleum ether at a ratio of 1:8), the raw material La004 was completely consumed. Then, chloro(1,5-cyclooctadiene)iridium dimer (15.28 g, 22.76 mmol) was added into the reaction solution and stirred overnight at room temperature for 12 hours until the solution became reddish brown. According to monitoring by TLC (with a developing agent including methanol and dichloromethane at a ratio of 1:100), a reaction was stopped when a large amount of a high-polarity red product was produced.

Filtration was performed, a filter cake was rinsed with a small amount of dichloromethane, a filtrate was collected and concentrated until 30 ml of a solvent was remained, and n-hexane (200 ml) was added for beating at room temperature for 1 hour. Then, suction filtration was performed, and a filter cake was dried to obtain 13.31 g of an orange red solid [Ir(La004)(COD)]-1 with a yield of 88.21%. The mass spectrum was: 648.19 (M+H).

Synthesis of a Compound [Ir(La004)(Lc004)]-1

The compound [Ir(La004)(COD)]-1 (10.00 g, 15.45 mmol), Lc004 (13.40 g, 46.35 mmol) and ethylene glycol ethyl ether (150 ml) were added into a 500 ml three-necked round-bottomed flask, vacuumization was performed for replacement for 3 times, and heating was performed to 120° C. for stirring for 16 hours. According to monitoring by TLC (with a developing agent including methanol and dichloromethane at a ratio of 1:100), the raw material [Ir(La004)(COD)]-1 was completely consumed.

After cooling was performed to room temperature, methanol (300 ml) was added, and filtration was performed. Then, a filter cake was washed with methanol (50 ml), and a resulting solid was dried under vacuum at 80° C. to obtain 6.82 g of a compound [Ir(La004)(Lc004)]-1 with a yield of 53.60%. The obtained compound was directly used in the next step without purification.

Synthesis of a Compound Ir(La004)(Lb005)(Lc004)

With reference to synthesis and purification methods of the compound Ir(La004)$_2$(Lb005), only the corresponding raw materials were required to be changed, and 2.50 g of a red solid compound Ir(La004)(Lb005)(Lc004) with a purity of 99.83% and a yield of 48.58% was obtained. 2.50 g of the crude product Ir(La004)(Lb005)(Lc004) was sublimated and purified to obtain 1.44 g of sublimated and purified Ir(La004)(Lb005)(Lc004) with a purity of 99.81% and a yield of 57.60%. The mass spectrum was 1005.68 (M+H).

$^1$H NMR (400 MHz, $CDCl_3$) δ 8.42 (dd, J=19.9, 15.0 Hz, 2H), 8.13-8.05 (m, 3H), 8.03 (d, J=3.1 Hz, 1H), 7.78 (d, J=15.0 Hz, 1H), 7.64 (d, J=3.1 Hz, 1H), 7.55-7.49 (m, 4H), 6.96 (d, J=2.9 Hz, 2H), 4.76 (s, 1H), 2.54-2.40 (s, 12H), 2.38-2.30 (m, 4H), 2.28 (m, 2H), 1.81-1.24 (m, 10H), 1.01-0.86 (m, 24H).

Synthesis of a Compound Ir(La004)(Lb005)(Lc011)

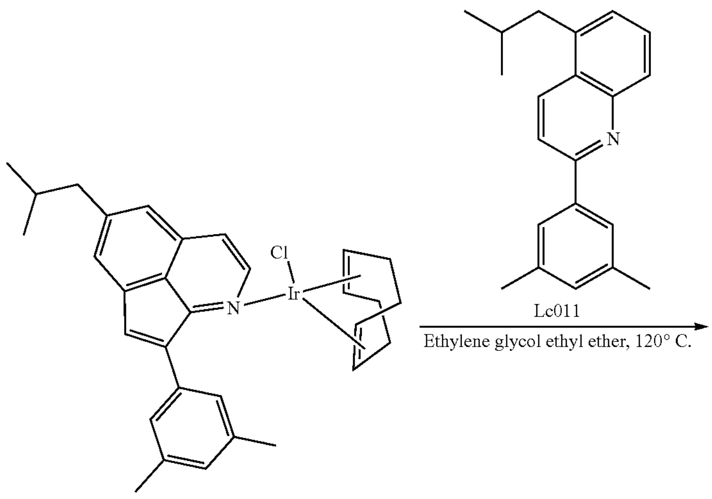

[Ir(La004)(COD)]-1

-continued

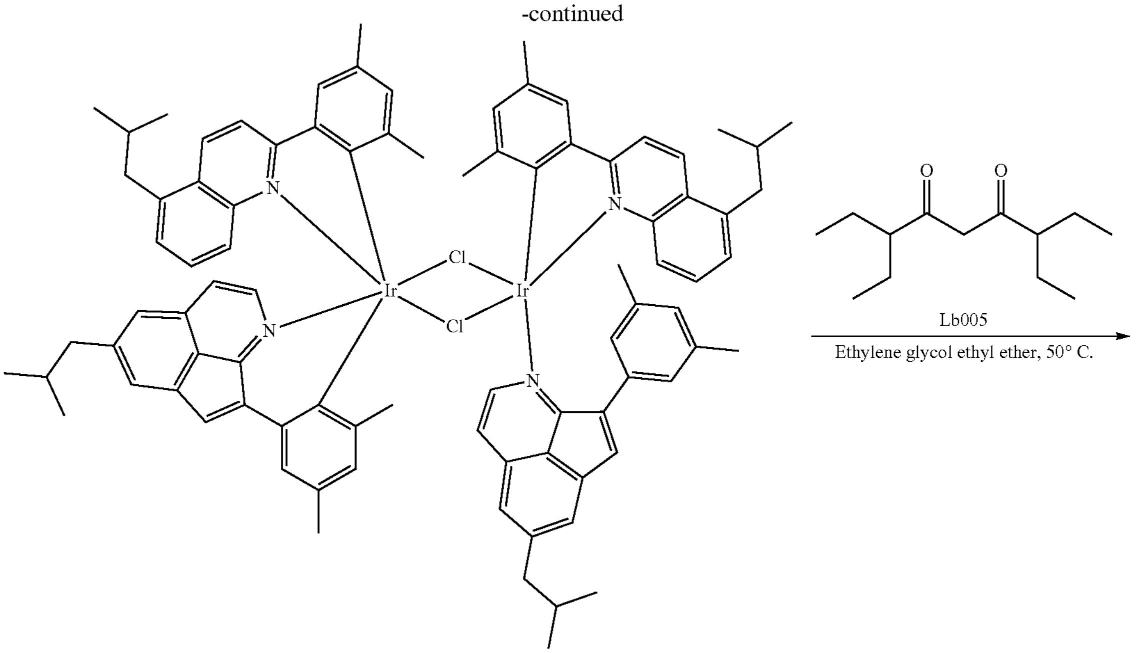

[Ir(La004)(Lc011)]-1

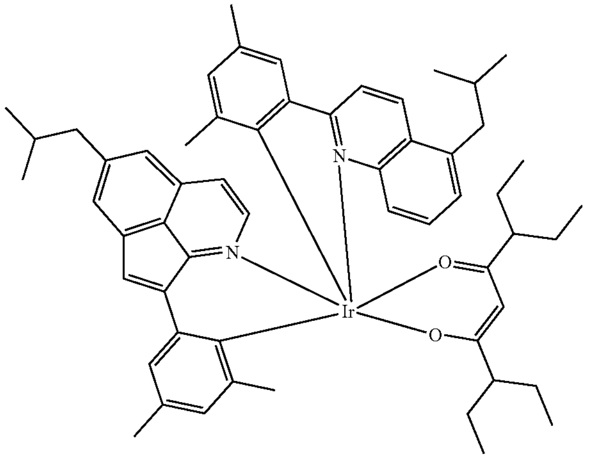

Ir(La004)(Lb005)(Lc011)

Synthesis of a Compound [Ir(La004)(Lc011)]-1

With reference to synthesis and purification methods of the compound [Ir(La004)(Lc004)]-1, only the corresponding raw materials were required to be changed, and 6.48 g of a red solid compound [Ir(La004)(Lc011)]-1 with a yield of 51.35% was obtained. The obtained compound was directly used in the next step without purification.

Synthesis of a Compound Ir(La004)(Lb005)(Lc011)

With reference to synthesis and purification methods of the compound $Ir(La004)_2(Lb005)$, only the corresponding raw materials were required to be changed, and 2.1 g of a red solid compound Ir(La004)(Lb005)(Lc011) with a purity of 99.78% and a yield of 45.25% was obtained. 2.1 g of the crude product Ir(La004)(Lb005)(Lc011) was sublimated and purified to obtain 1.09 g of sublimated and purified Ir(La004)(Lb005)(Lc011) with a purity of 99.75% and a yield of 51.90%. The mass spectrum was 1005.68 (M+H).

$^1H$ NMR (400 MHz, $CDCl_3$) δ 8.60 (d; J=7.5 Hz, 1H), 8.44 (d, J=7.5 Hz, 1H), 8.05-8.01 (m, 3H), 7.95 (dd, J=7.5, 1.4 Hz, 1H), 7.71-7.62 (m, 2H), 7.57 (d, J=7.5 Hz, 1H), 7.35 (d, J=7.5 Hz, 1H), 7.19 (dd, J=7.5, 1.4 Hz, 1H), 7.08 (s, 1H), 6.96 (d, J=1.4 Hz, 2H), 4.79 (s, 1H), 2.57-2.43 (s, 12H), 2.40-2.31 (m, 4H), 2.31 (m, 2H), 1.83-1.53 (m, 2H), 1.31-1.24 (m, 8H), 0.99-0.86 (m, 24H).

Synthesis of a Compound Ir(La004)(Lb005)(Lc023)
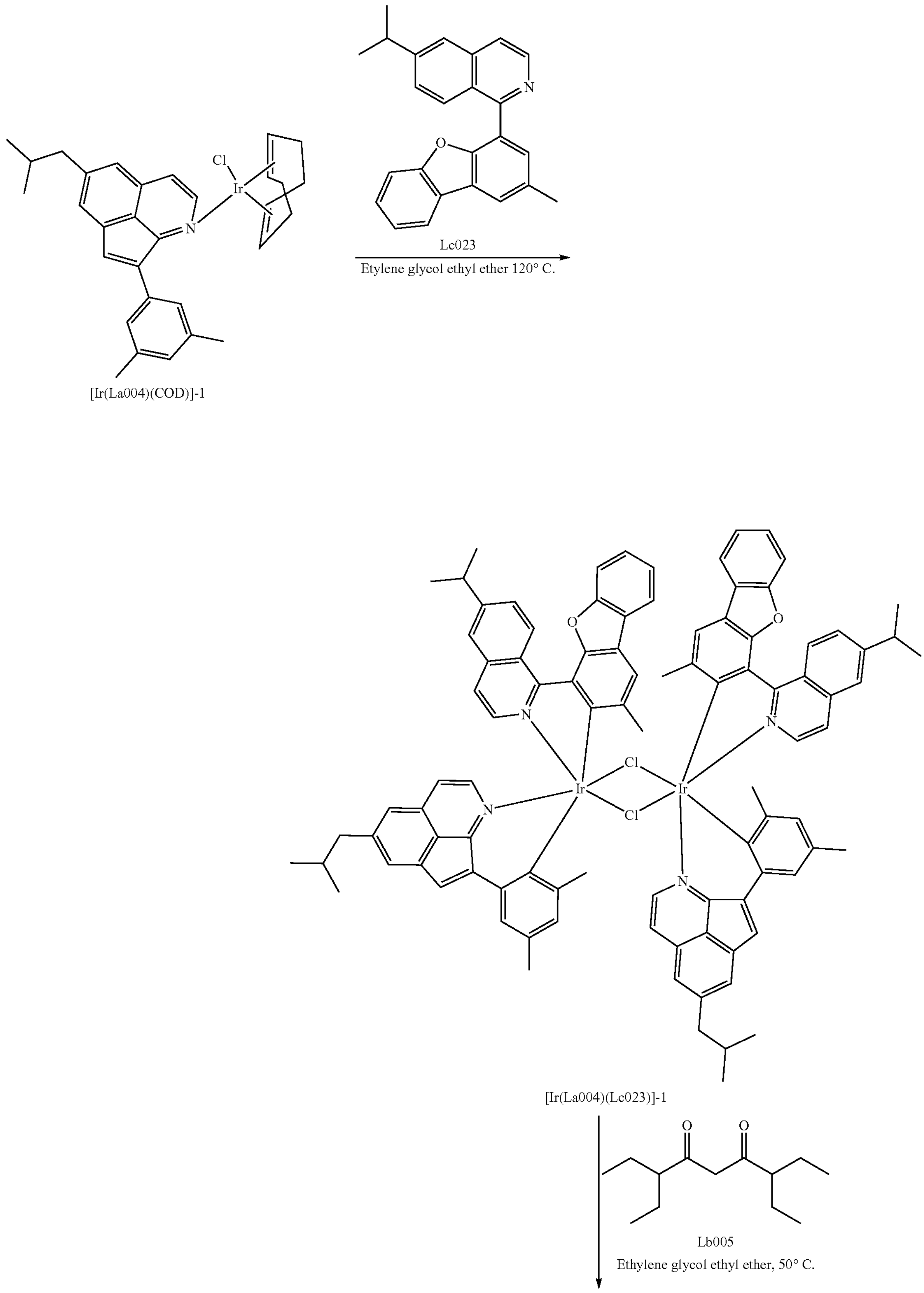

-continued

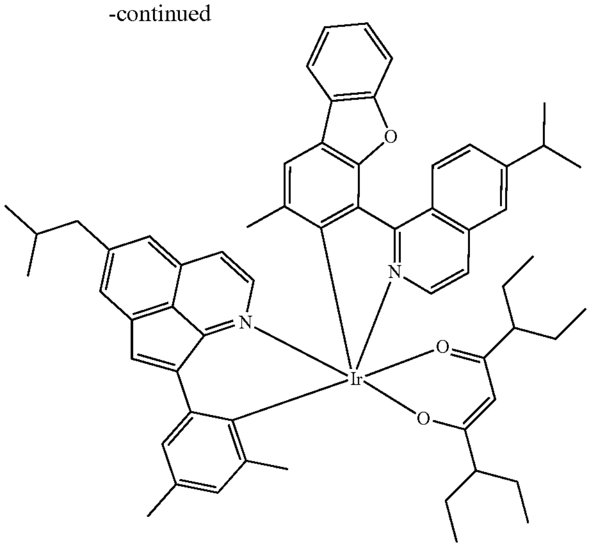

Ir(La004)(Lb005)(Lc023)

Synthesis of a Compound [Ir(La004)(Lc023)]-1

With reference to synthesis and purification methods of the compound [Ir(La004)(Lc004)]-1, only the corresponding raw materials were required to be changed, and 7.56 g of a red solid compound [Ir(La004)(Lc023)]-1 with a yield of 54.52% was obtained. The obtained compound was directly used in the next step without purification.

Synthesis of a Compound Ir(La004)(Lb005)(Lc023)

With reference to synthesis and purification methods of the compound $Ir(La004)_2(Lb005)$, only the corresponding raw materials were required to be changed, and 2.55 g of a red solid compound Ir(La004)(Lb005)(Lc023) with a purity of 99.86% and a yield of 46.74% was obtained. 2.55 g of the crude product Ir(La004)(Lb005)(Lc023) was sublimated and purified to obtain 1.46 g of sublimated and purified Ir(La004)(Lb005)(Lc023) with a purity of 99.81% and a yield of 57.25%. The mass spectrum was 1066.26 (M+H).

$^1H$ NMR (400 MHz, $CDCl_3$) δ 8.44 (d, J=15.0 Hz, 1H), 8.36 (d, J=15.0 Hz, 1H), 8.14 (dd, J=3.0, 1.5 Hz, 1H), 8.04 (t, J=3.0 Hz, 1H), 7.98 (dd, J=14.6, 3.5 Hz, 1H), 7.80-7.76 (m, 3H), 7.67-7.64 (m, 3H), 7.59-7.52 (m, 2H), 7.49-7.45 (m, 1H), 7.47-7.27 (m, 2H), 6.96 (d, J=3.1 Hz, 1H), 4.79 (s, 1H), 2.87-2.43 (m, 3H), 2.40-2.31 (s, 9H), 2.31 (m, 2H), 1.83-1.53 (m, 9H), 1.31-0.86 (m, 24H).

Application Example: Manufacturing of an Organic Electroluminescent Device

A glass substrate with a size of 50 mm*50 mm*1.0 mm including an indium tin oxide (ITO, 100 nm) transparent electrode was ultrasonically cleaned in ethanol for 10 minutes, dried at 150° C., and then treated with $N_2$ plasma for 30 minutes. The washed glass substrate was installed on a substrate support of a vacuum evaporation device. At first, a compound HATCN for covering the transparent electrode was evaporated on the surface of the side having a transparent electrode line to form a thin film with a thickness of 5 nm. Then, a layer of HTM1 was evaporated to form a thin film with a thickness of 60 nm. Then, a layer of HTM2 was evaporated on the HTM1 thin film to form a thin film with a thickness of 10 nm. Then, a main material and a doping compound (including a reference compound X and the compound of the present invention) were co-evaporated on the HTM2 film layer to obtain a film with a thickness of 30 nm, wherein the ratio of the main material to the doping material was 90%:10%. Then, an electron transport layer (ETL, 25 nm) and a LiQ film layer (1 nm) was sequentially evaporated on a light-emitting layer. Finally, a metal Al layer (100 nm) was evaporated to serve as an electrode.

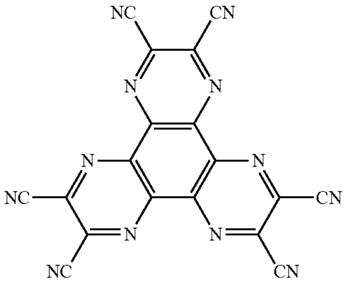

HATCN

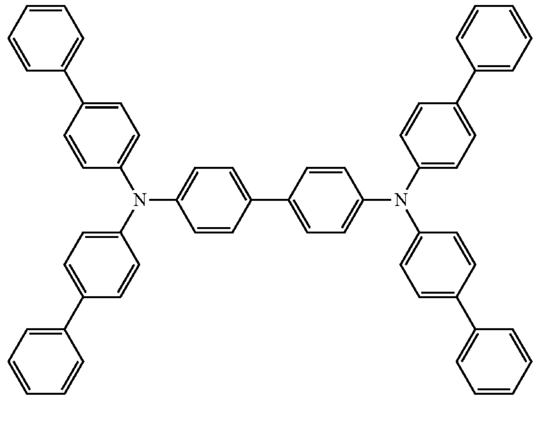

HTM 1

-continued
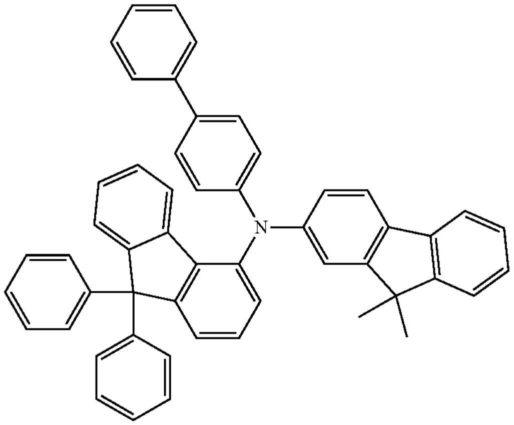
HTM 2
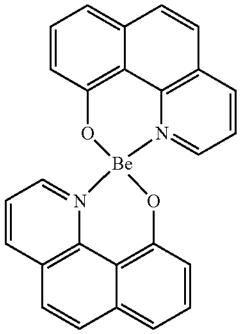
Main material
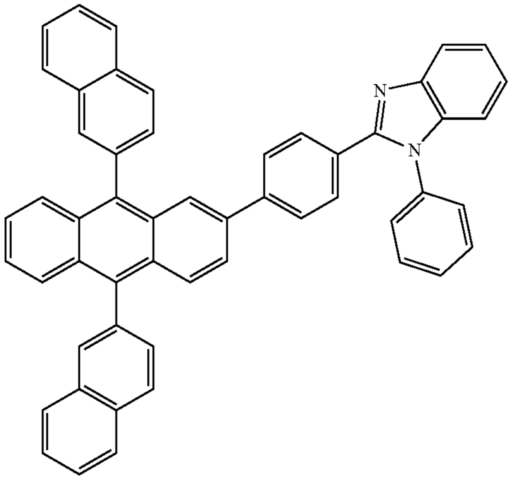
ETL
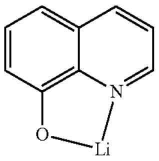
EIL
-continued
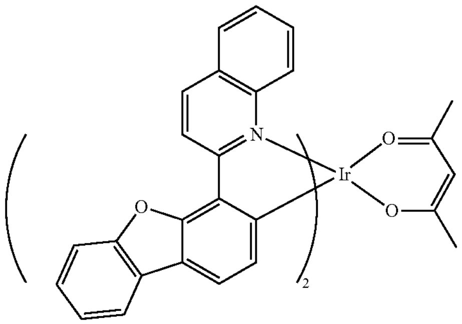
Reference compound 1
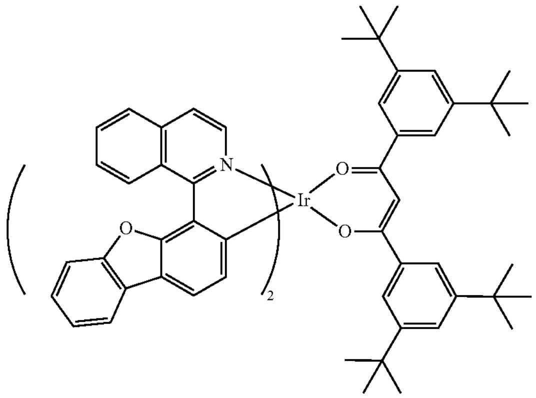
Reference compound 2
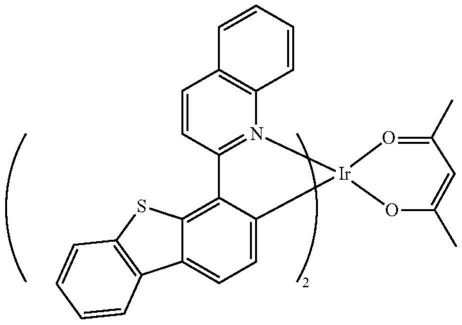
Reference compound 3
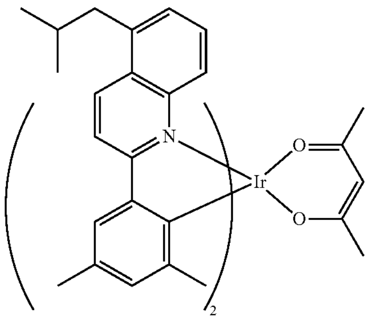
Reference compound 4

Evaluation:

Properties of a device obtained above were tested. In various examples and comparative examples, a constant-current power supply (Keithley 2400) was used, a current at a fixed density was used for flowing through light-emitting elements, and a spectroradiometer (CS 2000) was used for testing the light-emitting spectrum. Meanwhile, the voltage value was measured, and the time (LT90) when the brightness was reduced to 90% of the initial brightness was tested. Results are shown as follows.

| | Doping material | Peak wave-length/nm | FWHM/nm | Starting voltage/V | Current efficiency Cd/A | LT90@ 3000 nits |
|---|---|---|---|---|---|---|
| Example 1 | $Ir(La004)_2(Lb005)$ | 615.5 | 43 | 4.07 | 23.3 | 255 |
| Example 2 | $Ir(La008)_2(Lb005)$ | 616 | 42 | 4.09 | 24.6 | 261 |
| Example 3 | $Ir(La009)_2(Lb005)$ | 616 | 43 | 4.11 | 22.9 | 275 |
| Example 4 | $Ir(La009)_2(Lb007)$ | 615 | 41 | 4.08 | 25.4 | 281 |
| Example 5 | $Ir(La009)_2(Lb031)$ | 616 | 42 | 4.12 | 24.2 | 263 |
| Example 6 | $Ir(La011)_2(Lb005)$ | 614.5 | 43 | 4.04 | 23.6 | 258 |
| Example 7 | $Ir(La020)_2(Lb005)$ | 616 | 42 | 4.09 | 24.1 | 264 |
| Example 8 | $Ir(La026)_2(Lb005)$ | 616.5 | 43 | 4.10 | 22.8 | 266 |
| Example 9 | $Ir(La033)_2(Lb005)$ | 615 | 44 | 4.12 | 23.5 | 273 |
| Example 10 | $Ir(La051)_2(Lb005)$ | 614 | 41 | 4.09 | 25.3 | 276 |
| Example 11 | $Ir(La064)_2(Lb005)$ | 615 | 43 | 4.14 | 24.3 | 281 |
| Example 12 | $Ir(La080)_2(Lb005)$ | 616 | 44 | 4.12 | 23.4 | 277 |
| Example 13 | $Ir(La102)_2(Lb005)$ | 616 | 43 | 4.13 | 24.8 | 290 |
| Example 14 | Ir(La004)(Lb005)(Lc004) | 615.5 | 42 | 4.12 | 25.1 | 291 |
| Example 15 | Ir(La004)(Lb005)(Lc011) | 614.5 | 45 | 4.10 | 23.3 | 296 |
| Example 16 | Ir(La004)(Lb005)(Lc023) | 616 | 43 | 4.12 | 23.2 | 286 |
| Comparative Example 1 | Reference compound 1 | 610 | 50 | 4.21 | 21 | 108 |
| Comparative Example 2 | Reference compound 2 | 612 | 52 | 4.18 | 20 | 120 |
| Comparative Example 3 | Reference compound 3 | 611 | 51 | 4.25 | 21 | 98 |
| Comparative Example 4 | Reference compound 4 | 608 | 49 | 4.28 | 19 | 86 |

Through comparison of the data in the above table, it can be seen that compared with reference compounds, the compound of the present invention used as a dopant in an organic electroluminescent device has narrow emission spectrum, higher color saturation and more excellent properties, such as driving voltage, luminous efficiency and device service life.

Comparison in sublimation temperature: The sublimation temperature is defined as a corresponding temperature at an evaporation rate of 1 angstrom per second and a vacuum degree of $10^{-7}$ Torr. Test results are shown as follows.

| Doping material | Sublimation temperature |
|---|---|
| $Ir(La004)_2(Lb005)$ | 266 |
| $Ir(La009)_2(Lb005)$ | 269 |
| $Ir(La026)_2(Lb005)$ | 272 |
| $Ir(La033)_2(Lb005)$ | 270 |
| $Ir(La102)_2(Lb005)$ | 256 |
| Ir(La004)(Lb005)(Lc004) | 262 |
| Reference compound 1 | 280 |
| Reference compound 2 | 288 |
| Reference compound 3 | 286 |
| Reference compound 4 | 276 |

Through comparison of the data in the above table, it can be seen that the compound of the present invention has lower sublimation temperature, which is conducive to industrial application.

In the present invention, through special combinations of substituents, better luminous efficiency and improved service life of a device are unexpectedly provided, and meanwhile, lower sublimation temperature is unexpectedly provided compared with the prior art. The above results indicate that the compound of the present invention has the advantages of lower sublimation temperature, high optical and electrochemical stability, high color saturation, high luminous efficiency, long device service life and the like, and can be used in organic electroluminescent devices. In particular, the compound has the potential for application in the OLED industry as a red light-emitting dopant.

The material of the present invention has the advantages of high optical and electrical stability, low sublimation temperature, narrow emission half-peak width, high color saturation, high luminous efficiency, long device service life and the like. As a phosphorescent material, the material of the present invention can convert a triplet state into light, thereby improving the luminous efficiency of organic electroluminescent devices and reducing energy consumption. In particular, the compound has the potential for application in the AMOLED industry as a red light-emitting dopant.

The invention claimed is:

1. An organometallic compound, having a general formula of Ir(La)(Lb)(Lc), wherein La is a structure represented by Formula (1):

(1)

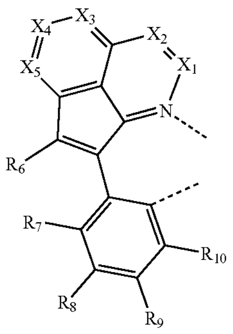

wherein dotted lines refer to positions connected to the metal Ir;

$X_1$ is N or $CR_1$, $X_2$ is N or $CR_2$, $X_3$ is N or $CR_3$, $X_4$ is N or $CR_4$, and $X_5$ is N or $CR_5$;

at most one of the $X_1$-$X_5$ is N, and when the $X_1$-$X_5$ are $CR_1$-$CR_5$, at least one of the $R_1$-$R_5$ is not H;

$R_1$-$R_{10}$ are independently selected from hydrogen, deuterium, halogen, cyano, hydroxyl, sulfhydryl, amino, substituted or unsubstituted $C_1$-$C_{10}$ alkyl, substituted or unsubstituted $C_1$-$C_{10}$ heteroalkyl, substituted or unsubstituted $C_3$-$C_{20}$ cycloalkyl, substituted or unsubstituted $C_2$-$C_{10}$ alkenyl, substituted or unsubstituted $C_2$-$C_{10}$ alkynyl, substituted or unsubstituted $C_6$-$C_{18}$ aryl, substituted or unsubstituted $C_2$-$C_{17}$ heteroaryl, substituted or unsubstituted tri-$C_1$-$C_{10}$ alkyl silyl, substituted or unsubstituted tri-$C_6$-$C_{12}$ aryl silyl, substituted or unsubstituted di-$C_1$-$C_{10}$ alkyl mono-$C_6$-$C_{30}$ aryl silyl, or substituted or unsubstituted mono-$C_1$-$C_{10}$ alkyl di-$C_6$-$C_{30}$ aryl silyl, or any two adjacent groups of the $R_1$-$R_6$ or $R_7$-$R_{10}$ may be connected to each other to form an aliphatic ring structure or an aromatic ring structure; at least one of the $R_7$-$R_{10}$ is not hydrogen; the "substituted" refers to substitution with deuterium, F, Cl, Br, $C_1$-$C_6$ alkyl, $C_3$-$C_6$ cycloalkyl, $C_1$-$C_6$ alkoxyl, amino substituted with $C_1$-$C_6$ alkyl, cyano, isocyano, or phosphino, and the substitution ranges from a single substitution number to a maximum substitution number; and the heteroalkyl and the heteroaryl contain at least one O, N or S heteroatom;

Lb is a structure represented by Formula (2):

(2)

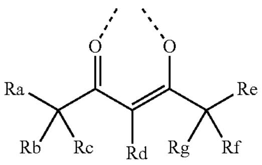

wherein dotted lines refer to positions connected to the metal Ir;

Ra-Rg are independently selected from hydrogen, deuterium, halogen, substituted or unsubstituted $C_1$-$C_{10}$ alkyl, substituted or unsubstituted $C_3$-$C_{20}$ cycloalkyl, substituted or unsubstituted $C_1$-$C_{10}$ heteroalkyl, or substituted or unsubstituted $C_3$-$C_{20}$ heterocyclic alkyl; or any two of Ra, Rb and Rc are connected to form an aliphatic ring structure, and any two of Re, Rf and Rg are connected o form an aliphatic ring structure; the "substituted" refers to substitution with deuterium, F, Cl, Br, $C_1$-$C_4$ alkyl, $C_1$-$C_4$ alkoxyl, $C_3$-$C_6$ cycloalkyl, amino substituted with $C_1$-$C_4$ alkyl, cyano, isocyano, or phosphino;

and the heteroalkyl and the heterocyclic alkyl at least contain one O, N or S heteroatom;

Lc is a monoanionic bidentate ligand, and the Lc is different from the Lb and is not an OO ligand;

the Lc and the La are the same or different, and the different indicates different parent nuclear structures, a same parent nuclear structure with different substituents, or a same parent nuclear structure with different substituent positions;

or any two or three of the La, the Lb and the Lc are connected to each other to form a polydentate ligand.

2. The organometallic compound according to claim 1, wherein the La is a structure represented by Formula (3):

(3)

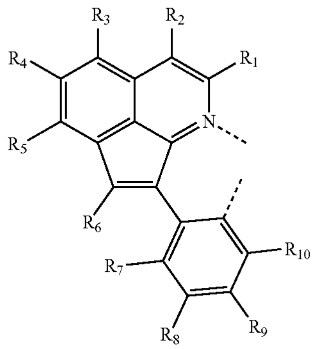

wherein dotted lines refer to positions connected to the metal Ir;

$R_1$-$R_{10}$ are independently selected from hydrogen, deuterium, halogen, cyano, hydroxyl, sulfhydryl, amino, substituted or unsubstituted $C_1$-$C_{10}$ alkyl, substituted or unsubstituted $C_1$-$C_{10}$ heteroalkyl, substituted or unsubstituted $C_3$-$C_{20}$ cycloalkyl, substituted or unsubstituted $C_2$-$C_{10}$ alkenyl, substituted or unsubstituted $C_2$-$C_{10}$ alkynyl, substituted or unsubstituted $C_6$-$C_{18}$ aryl, substituted or unsubstituted $C_2$-$C_{17}$ heteroaryl, substituted or unsubstituted tri-$C_1$-$C_{10}$ alkyl silyl, substituted or unsubstituted tri-$C_6$-$C_{12}$ aryl silyl, substituted or unsubstituted di-$C_1$-$C_{10}$ alkyl mono-$C_6$-$C_{30}$ aryl silyl, or substituted or unsubstituted mono-$C_1$-$C_{10}$ alkyl di-$C_6$-$C_{30}$ aryl silyl; or any two adjacent groups of the $R_1$-$R_6$ or $R_7$-$R_{10}$ are connected to each other to form an aliphatic ring structure or an aromatic ring structure;

at least one of the $R_7$-$R_{10}$ is not hydrogen;

the heteroalkyl and the heteroaryl at least contain one O, N or S heteroatom;

and the "substituted" refers to substitution with deuterium, F, Cl, Br, $C_1$-$C_6$ alkyl, $C_3$-$C_6$ cycloalkyl, $C_1$-$C_6$ alkoxyl, amino substituted with $C_1$-$C_6$ alkyl, cyano, isocyano, or phosphino, and the substitution ranges from a single substitution number to a maximum substitution number.

3. The organometallic compound according to claim 2, wherein in Formula (3), the $R_1$ and/or the $R_4$ and/or the $R_5$ is not hydrogen.

4. The organometallic compound according to claim 3, wherein in Formula (3), the $R_2$ and the $R_3$ are hydrogen.

5. The organometallic compound according to claim 4, wherein in Formula (3), the $R_1$, the $R_4$ and the $R_5$ are independently selected from deuterium, halogen, substituted or unsubstituted $C_1$-$C_6$ alkyl, or substituted or unsubstituted $C_3$-$C_{10}$ cycloalkyl, and the "substituted" refers to substitution with deuterium, F, Cl, Br, or $C_1$-$C_4$ alkyl.

6. The organometallic compound according to claim 2, wherein in Formula (3), the $R_6$ is selected from deuterium, halogen, substituted or unsubstituted $C_1$-$C_6$ alkyl, or substituted or unsubstituted $C_3$-$C_{10}$ cycloalkyl; and the $R_5$ and/or the $R_{10}$ is not hydrogen.

7. The organometallic compound according to claim 6, wherein in Formula (3), the $R_8$ and the $R_{10}$ are independently selected from substituted or unsubstituted $C_1$-$C_6$ alkyl, or substituted or unsubstituted $C_3$-$C_{10}$ cycloalkyl, and the "substituted" refers to substitution with deuterium, F, Cl, Br, or $C_1$-$C_4$ alkyl.

8. The organometallic compound according to claim 2, wherein in Formula (3), the $R_7$ and the $R_9$ are H.

9. The organometallic compound according to claim 2, wherein the $R_7$ and the $R_8$, the $R_8$ and the $R_9$, or the $R_9$ and the $R_{10}$ are connected to each other to form a structure represented by Formula (4):

(4)

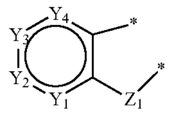

wherein * indicates a connecting position;

$Y_1$-$Y_4$ are independently $CR_0$ or N;

Z1 is selected from O or S;

$R_0$ is independently hydrogen, deuterium, halogen, cyano, substituted or unsubstituted $C_1$-$C_{10}$ alkyl, substituted or unsubstituted $C_3$-$C_{20}$ cycloalkyl, substituted or unsubstituted $C_2$-$C_{30}$ alkenyl, substituted or unsubstituted $C_2$-$C_{30}$ alkynyl, substituted or unsubstituted $C_6$-$C_{30}$ aryl, substituted or unsubstituted $C_1$-$C_{30}$ heteroaryl, substituted or unsubstituted tri-$C_1$-$C_{10}$ alkyl silyl, substituted or unsubstituted tri-$C_6$-$C_{30}$ aryl silyl, or substituted or unsubstituted di-$C_1$-$C_{10}$ alkyl mono-$C_6$-$C_{30}$ aryl silyl; and the "substituted" refers to substitution with deuterium, F, Cl, Br, $C_1$-$C_4$ alkyl, $C_1$-$C_4$ alkoxyl, $C_3$-$C_6$ cycloalkyl, amino substituted with $C_1$-$C_4$ alkyl, cyano, isocyano, or phosphino.

10. The organometallic compound according to claim 9, wherein in Formula (4), the $Y_1$-$Y_4$ are independently $CR_0$, the Z1 is O, and the $R_0$ is independently hydrogen, deuterium, halogen, substituted or unsubstituted $C_1$-$C_6$ alkyl, or substituted or unsubstituted $C_3$-$C_{10}$ cycloalkyl; and the "substituted" refers to substitution with deuterium, F, Cl, Br, or $C_1$-$C_4$ alkyl.

11. The organometallic compound according to claim 1, wherein the Lc and the La are the same.

12. The organometallic compound according to claim 1, wherein the Lc is a structure represented by Formula (5):

(5)

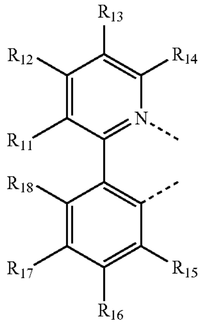

wherein dotted lines refer to positions connected to the metal Ir;

$R_{11}$-$R_{18}$ are independently selected from hydrogen, deuterium, halogen, cyano, hydroxyl, amino group, amino, substituted or unsubstituted $C_1$-$C_{10}$ alkyl, substituted or unsubstituted $C_1$-$C_{10}$ heteroalkyl, substituted or unsubstituted $C_3$-$C_{20}$ cycloalkyl, substituted or unsubstituted $C_2$-$C_{10}$ alkenyl, substituted or unsubstituted $C_2$-$C_{10}$ alkynyl, substituted or unsubstituted $C_6$-$C_{18}$ aryl, substituted or unsubstituted $C_2$-$C_{17}$ heteroaryl, substituted or unsubstituted tri-$C_1$-$C_{10}$ alkyl silyl, substituted or unsubstituted tri-$C_6$-$C_{12}$ aryl silyl, substituted or unsubstituted di-$C_1$-$C_{10}$ alkyl mono-$C_6$-$C_{30}$ aryl silyl, or substituted or unsubstituted mono-$C_1$-$C_{10}$ alkyl di-$C_6$-$C_{30}$ aryl silyl; at least two of the $R_{15}$-$R_{18}$ are not hydrogen;

at least two adjacent groups of the $R_{11}$-$R_{14}$ form an aromatic ring structure represented by the following Formula (6):

(6)

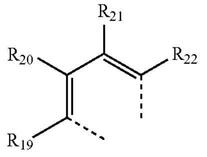

wherein dotted lines refer to positions connected to a pyridine ring;

$R_{19}$-$R_{22}$ are independently selected from hydrogen, deuterium, halogen, cyano, substituted or unsubstituted $C_1$-$C_{10}$ alkyl, substituted or unsubstituted $C_1$-$C_{10}$ heteroalkyl, substituted or unsubstituted $C_3$-$C_{20}$ cycloalkyl, substituted or unsubstituted $C_2$-$C_{10}$ alkenyl, substituted or unsubstituted $C_2$-$C_{10}$ alkynyl, substituted or unsubstituted $C_6$-$C_{18}$ aryl, substituted or unsubstituted $C_2$-$C_{17}$ heteroaryl, substituted or unsubstituted tri-$C_1$-$C_{10}$ alkyl silyl, substituted or unsubstituted tri-$C_6$-$C_{12}$ aryl silyl, substituted or unsubstituted di-$C_1$-$C_{10}$ alkyl mono-$C_6$-$C_{30}$ aryl silyl, or substituted or unsubstituted mono-$C_1$-$C_{10}$ alkyl di-$C_6$-$C_{30}$ aryl silyl, or any two adjacent groups of the $R_{19}$-$R_{22}$ are connected to each other to form an aliphatic ring structure or an aromatic ring structure;

and the "substituted" refers to substitution with deuterium, F, Cl, Br, $C_1$-$C_4$ alkyl, $C_1$-$C_4$ alkoxyl, $C_3$-$C_6$ cycloalkyl, amino substituted with $C_1$-$C_4$ alkyl, cyano, isocyano, or phosphino.

13. The organometallic compound according to claim 12, wherein the $R_{15}$ and the $R_{17}$ are deuterium, halogen, substituted or unsubstituted $C_1$-$C_6$ alkyl, or substituted or unsubstituted $C_3$-$C_{10}$ cycloalkyl, two adjacent groups of the $R_{11}$-$R_{14}$ form an aromatic ring structure represented by Formula (6), and the other two groups are independently selected from hydrogen, deuterium, halogen, substituted or unsubstituted $C_1$-$C_6$ alkyl, or substituted or unsubstituted $C_3$-$C_{10}$ cycloalkyl;

the $R_{19}$-$R_{22}$ are independently selected from hydrogen, deuterium, halogen, substituted or unsubstituted $C_1$-$C_6$ alkyl, or substituted or unsubstituted $C_3$-$C_{10}$ cycloalkyl; and the "substituted" refers to substitution with deuterium, F, Cl, Br, or $C_1$-$C_4$ alkyl.

14. The organometallic compound according to claim 2, wherein the La has one of the following structural formulas, or one of the following structural formulas in which the hydrogen atom(s) is/are partially or completely deuterated, or one of the following structural formulas in which the hydrogen atom(s) is/are partially or completely fluorinated, La001

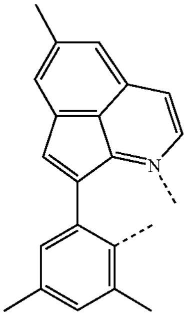

La002

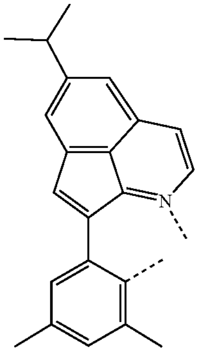

La003

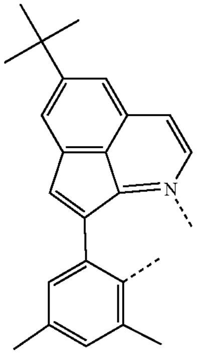

-continued

La004

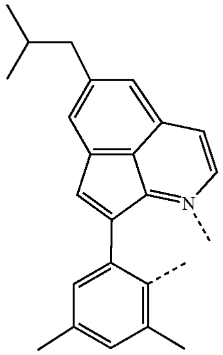

La005

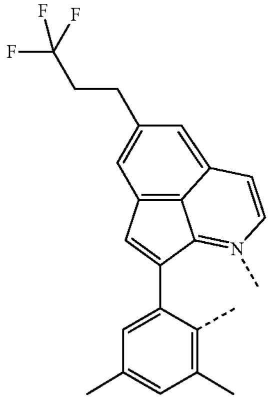

La006

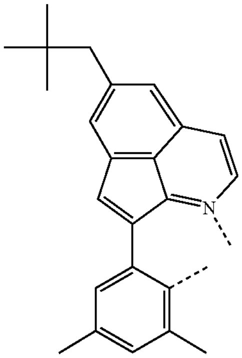

La007

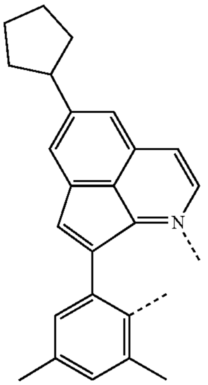

La008
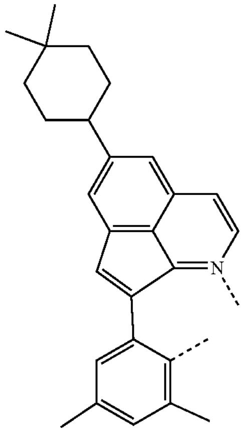
La009
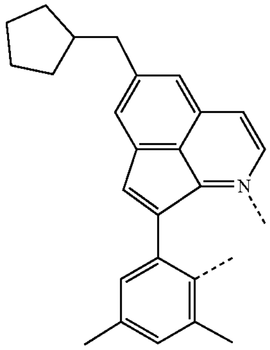
La010
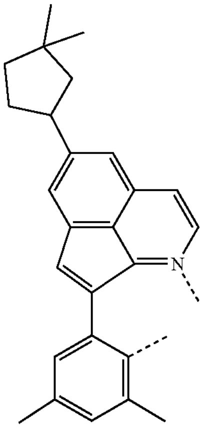
La011
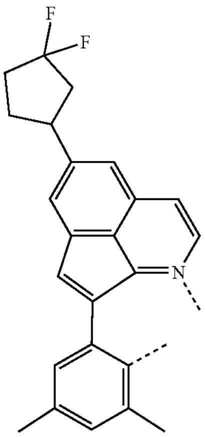
La012
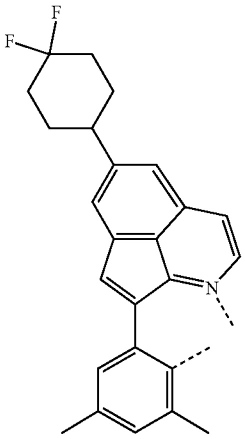
La013
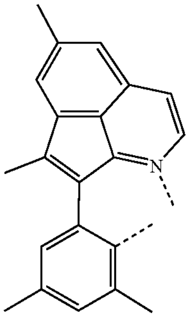
La014
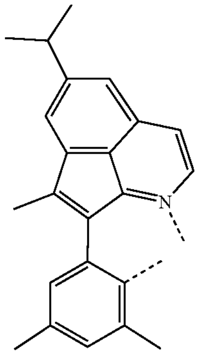
La015
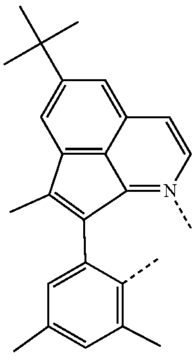

-continued
La016
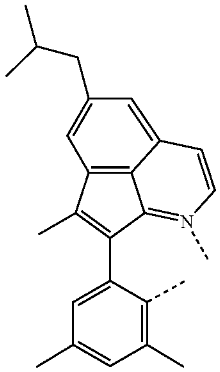
La017
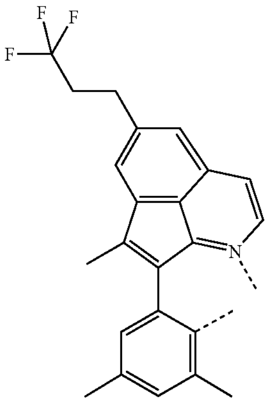
La018
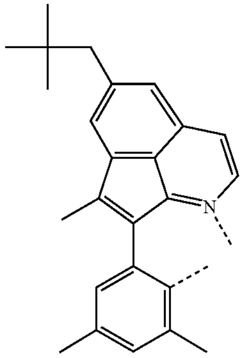
La019
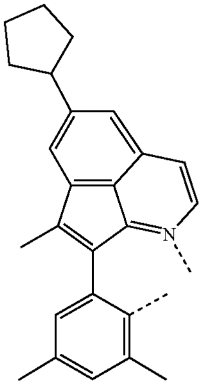
-continued
La020
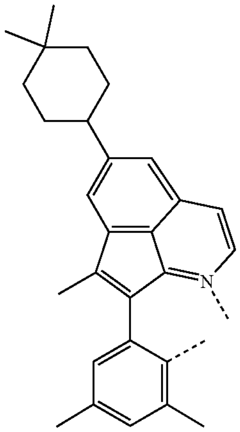
La021
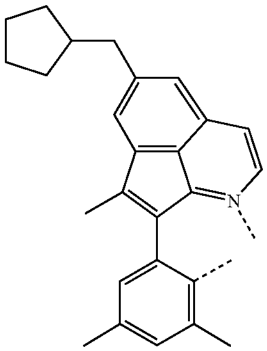
La022
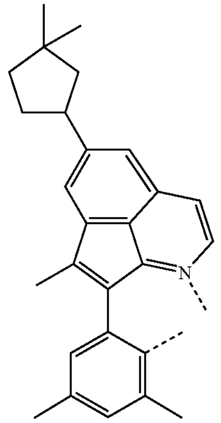
La023
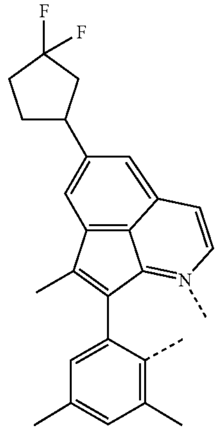

-continued
La024
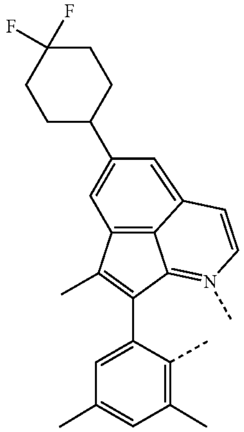
La025
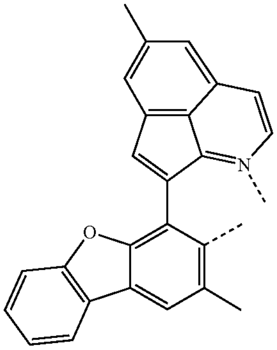
La026
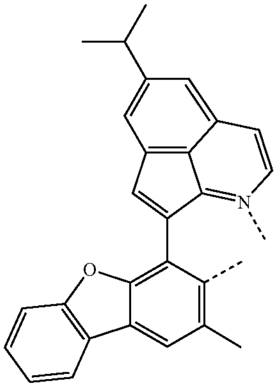
La027
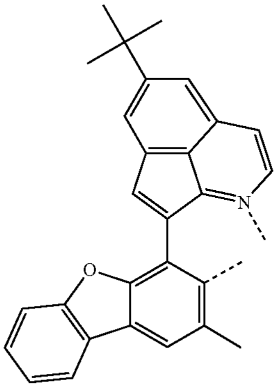
-continued
La028
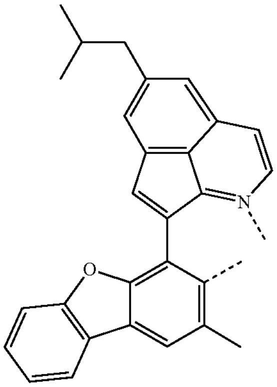
La030
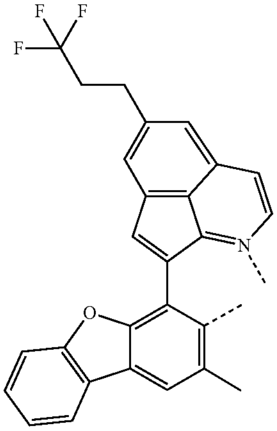
La031
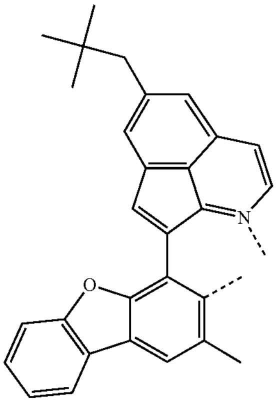
La031
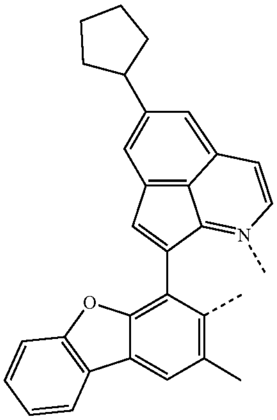

La032
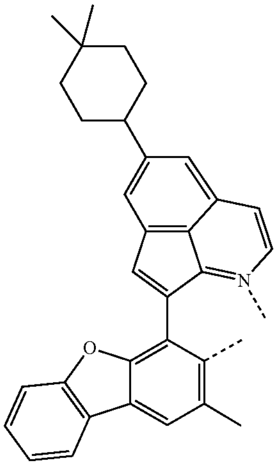
La033
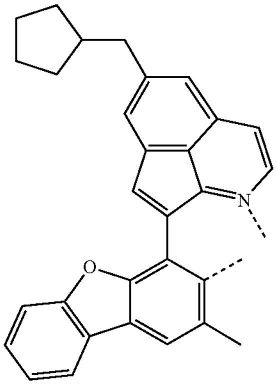
La034
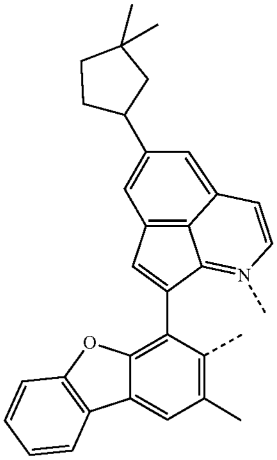
La035
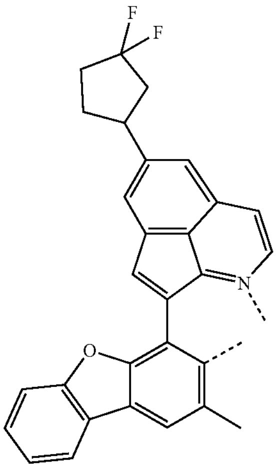
La036
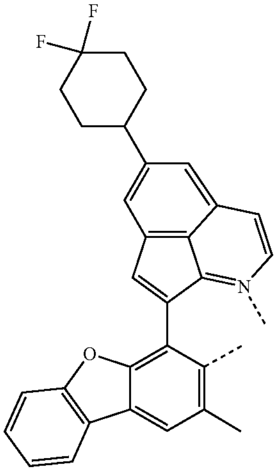
La037
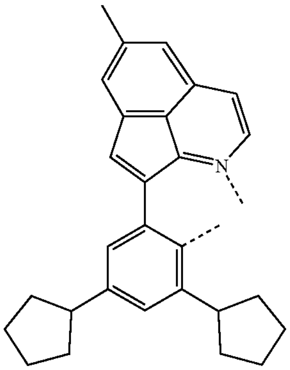

-continued
La038
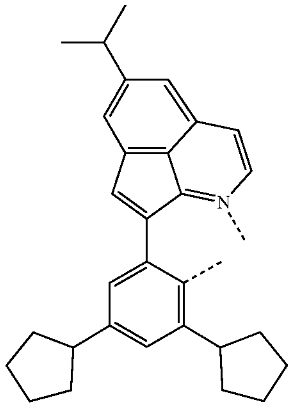
La039
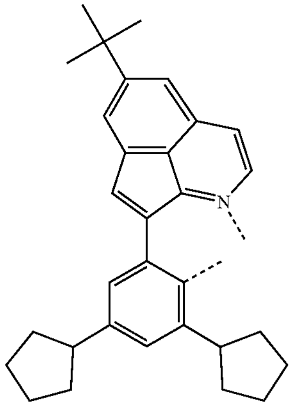
La040
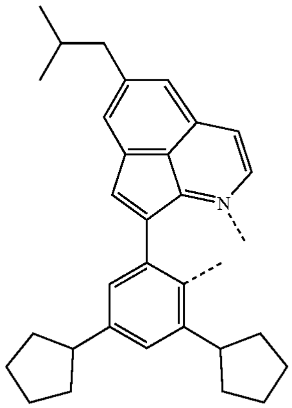
-continued
La041
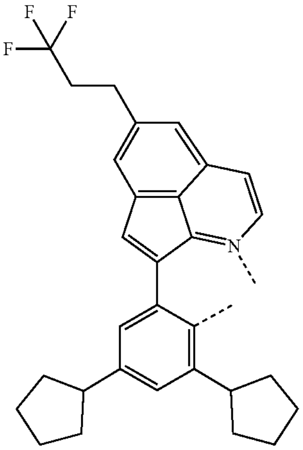
La042
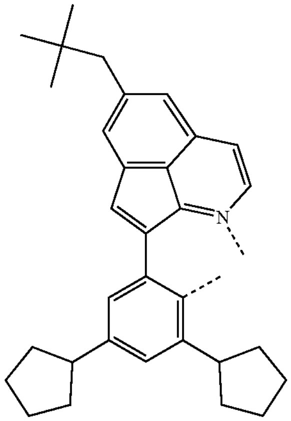
La043
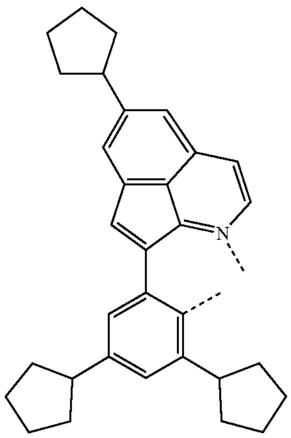

-continued
La044
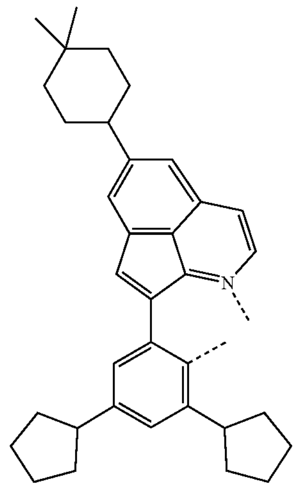
La045
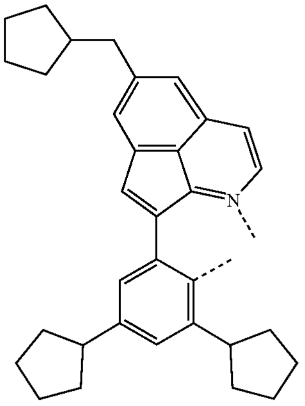
La046
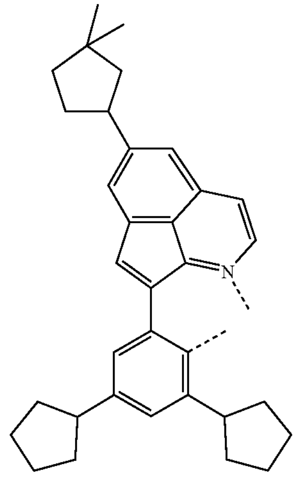
-continued
La047
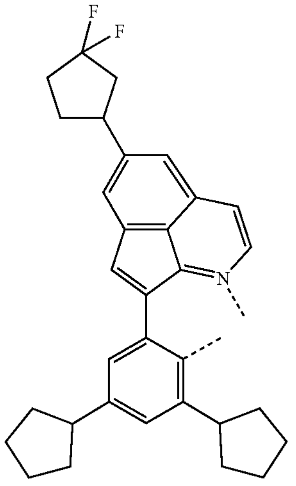
La048
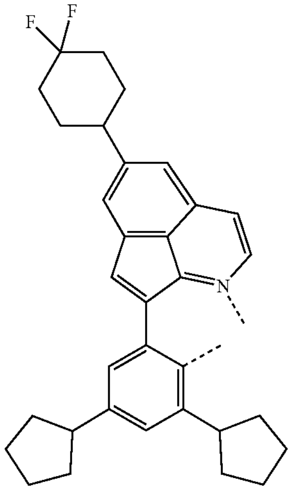
La049
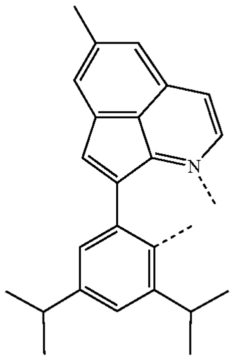

-continued
La050
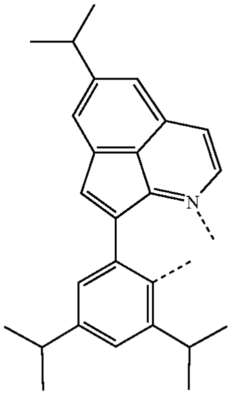
La051
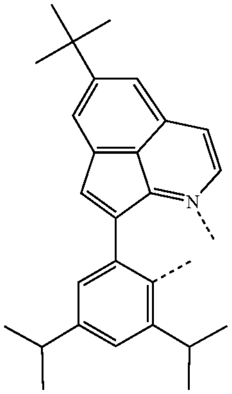
La052
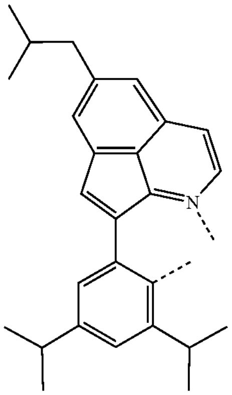
La053
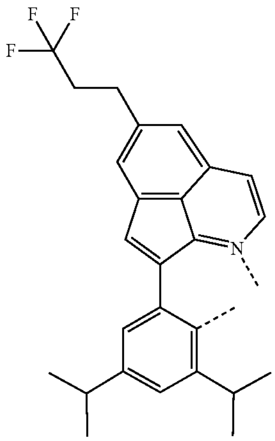
-continued
La054
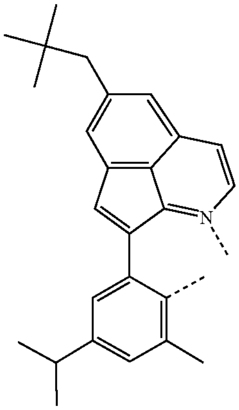
La055
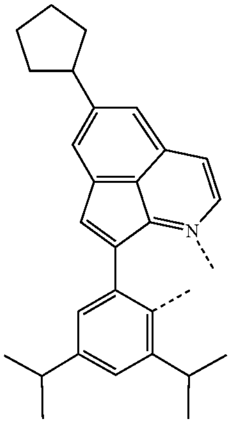
La056
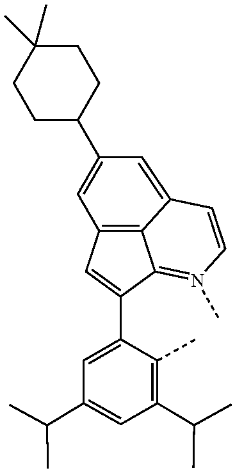

-continued
La057
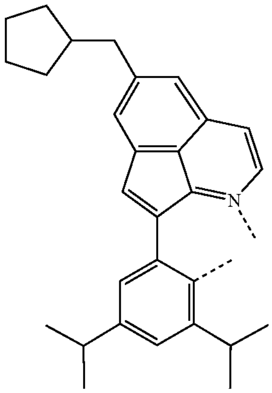
La058
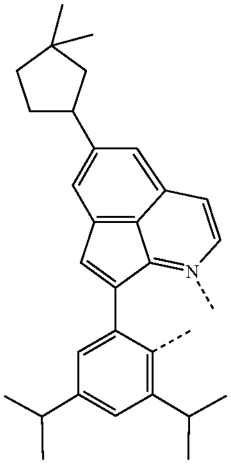
La059
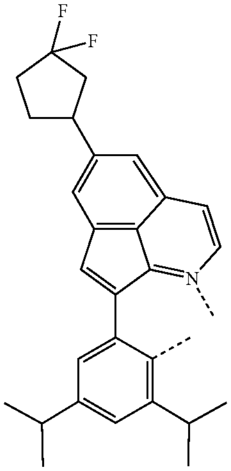
-continued
La060
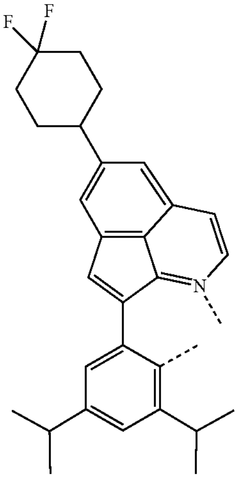
La061
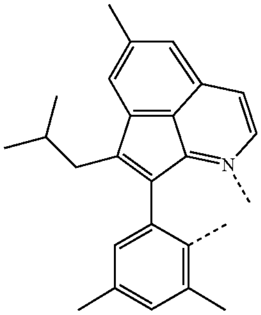
La062
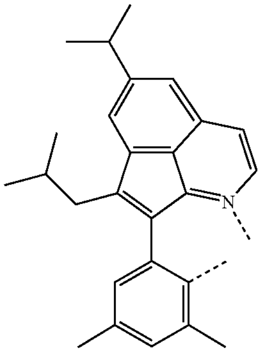
La063
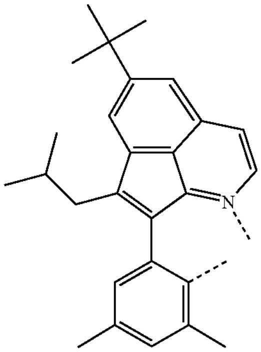

-continued
La064
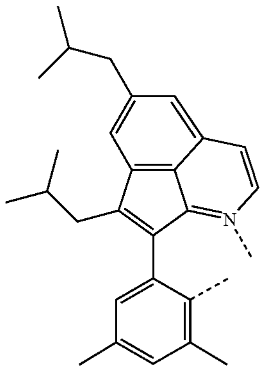
La065
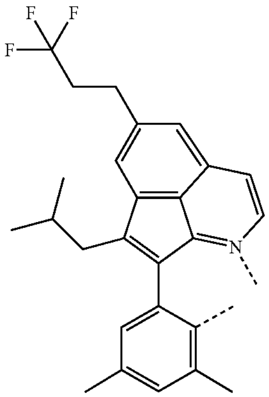
La066
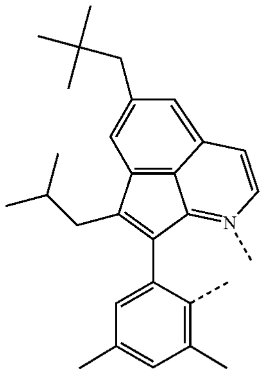
La067
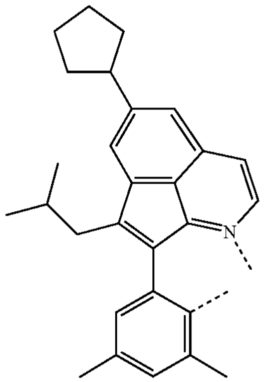
-continued
La068
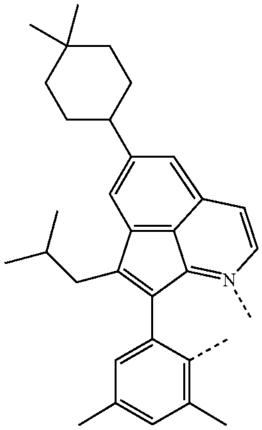
La069
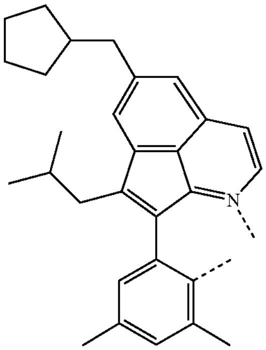
La070
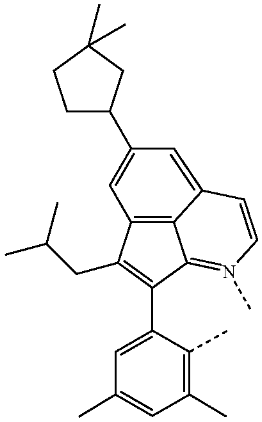
La071
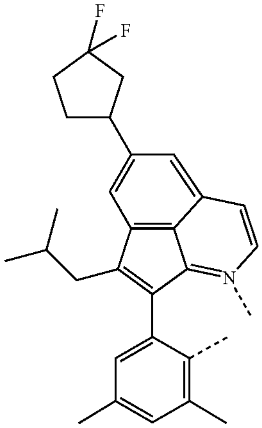

-continued
La072
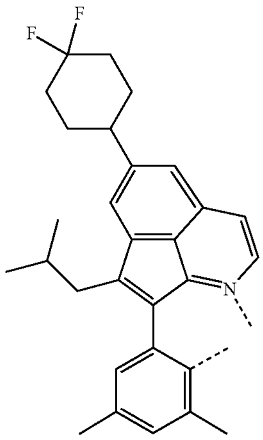
La073
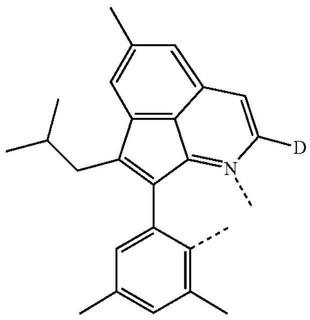
La074
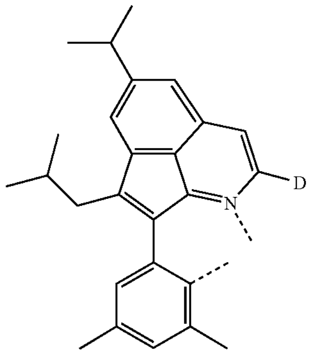
La075
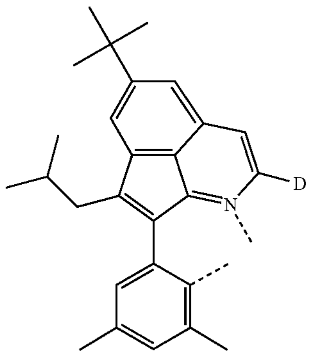
-continued
La076
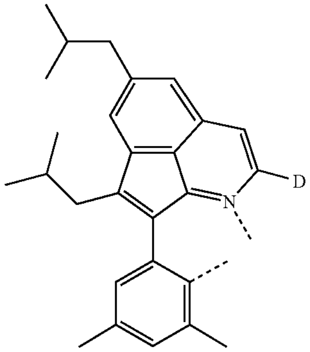
La077
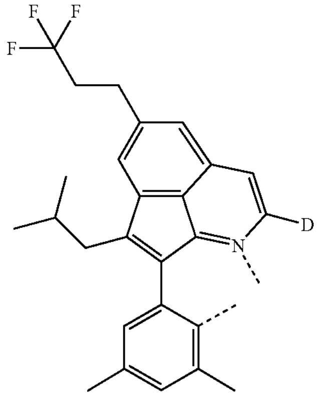
La078
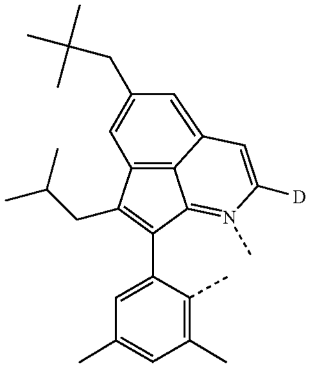
La079
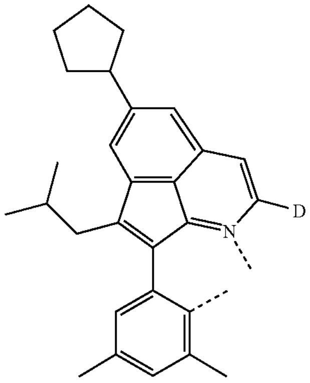

-continued
La080
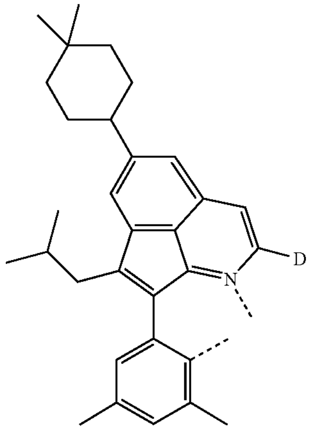
La081
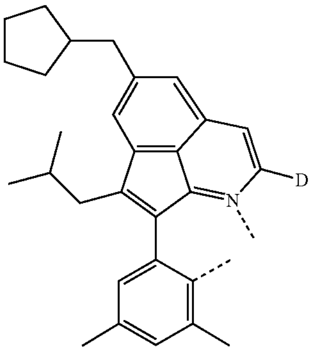
La082
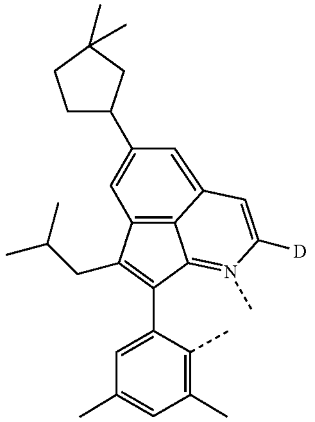
La083
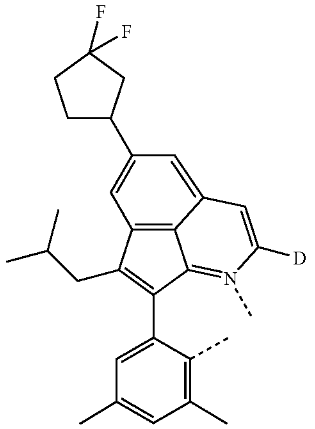
-continued
La084
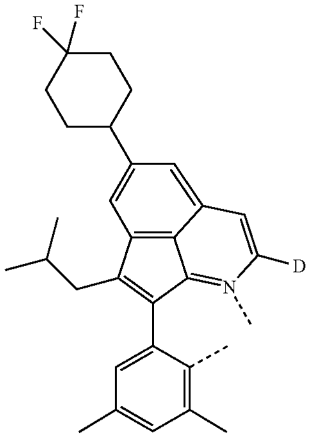
La085
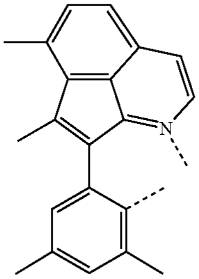
La086
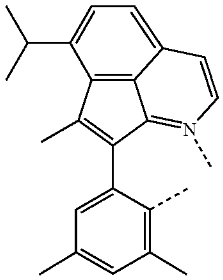
La087
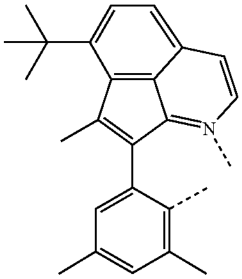
La088
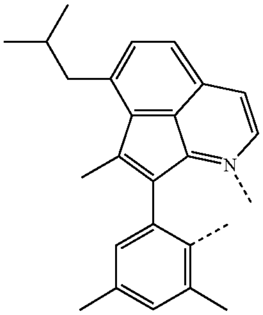

La089
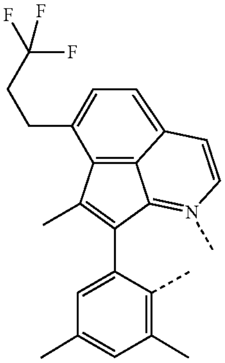
La090
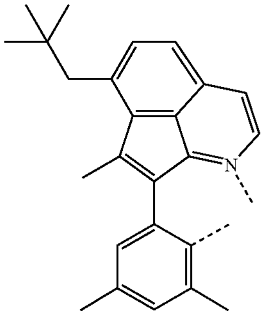
La091
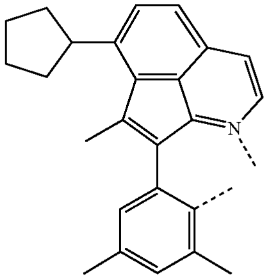
La092
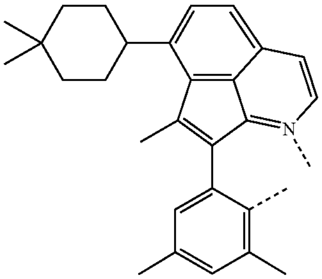
La093
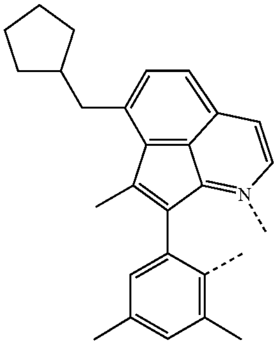
La094
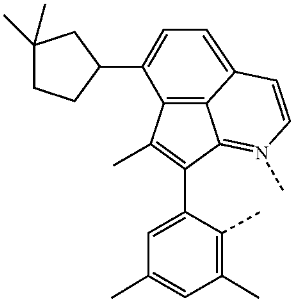
La095
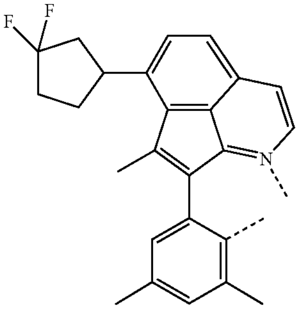
La096
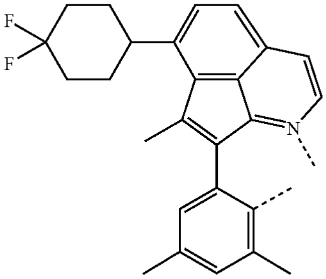
La097
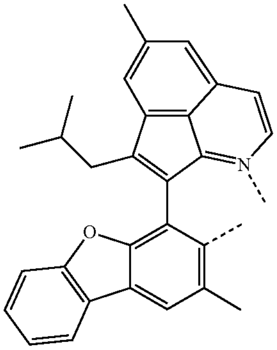

-continued
La098
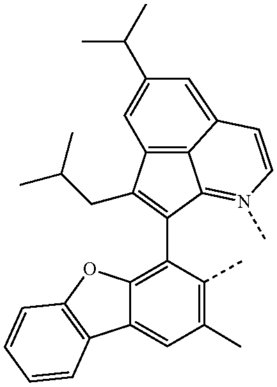
La099
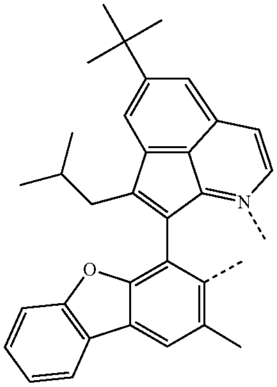
La100
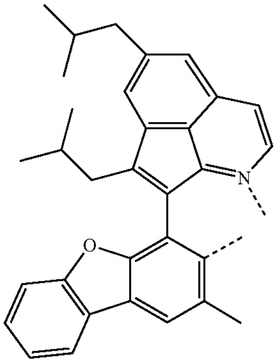
La101
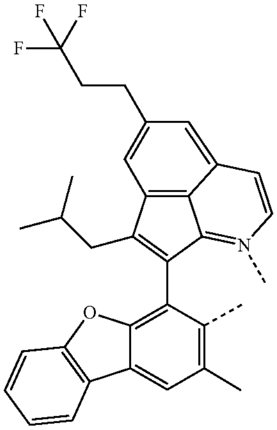
-continued
La102
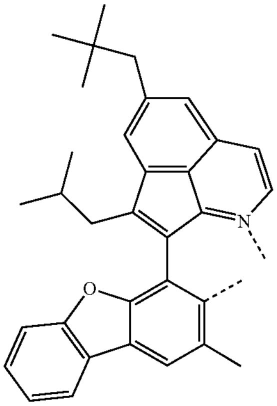
La103
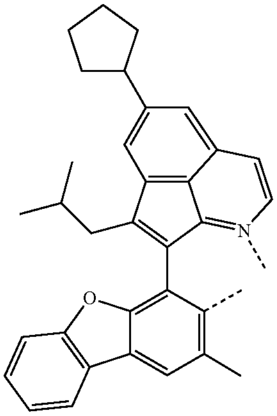
La104
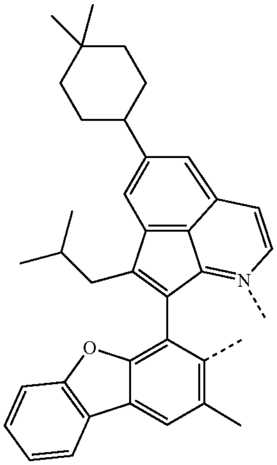

-continued
La105
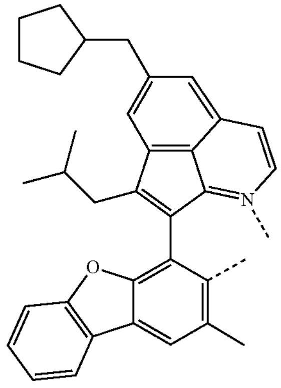
La106
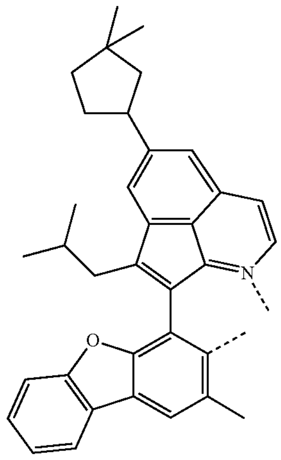
La107
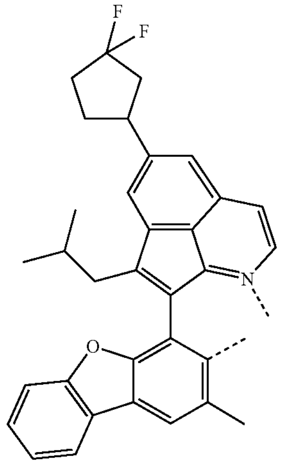
-continued
La108
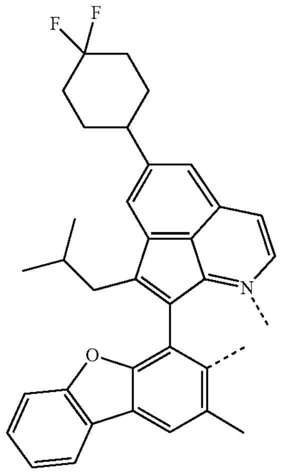
La109
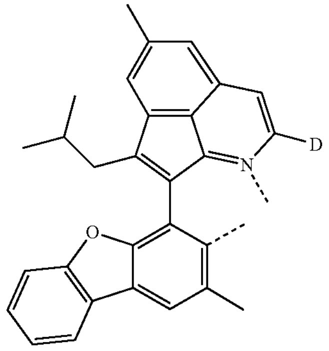
La110
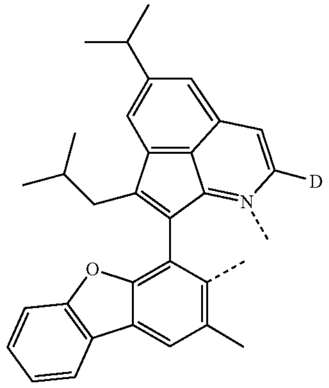
La111
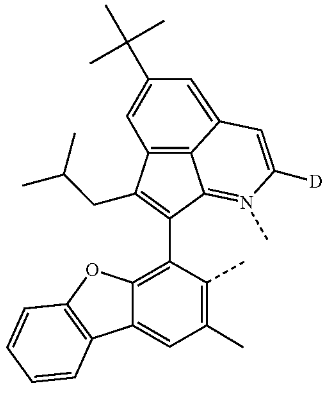

-continued
La112
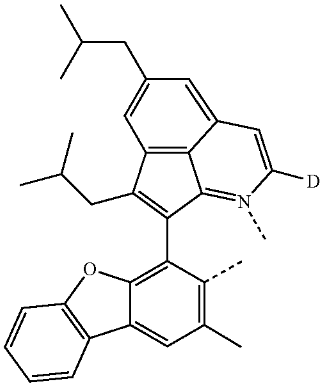
La113
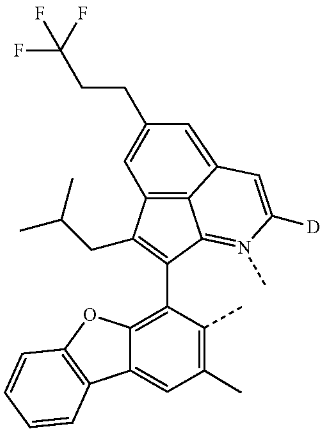
La114
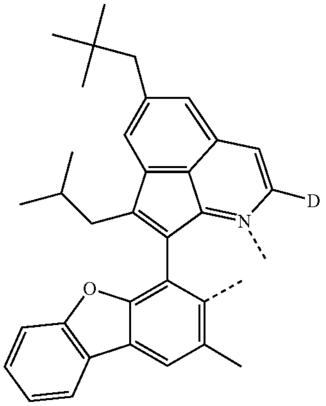
La115
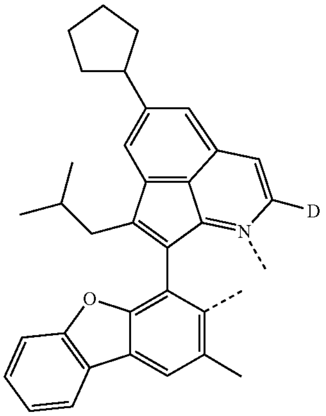
-continued
La116
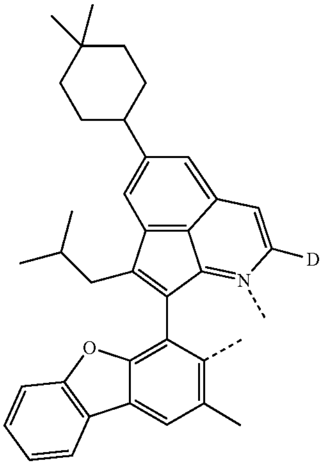
La117
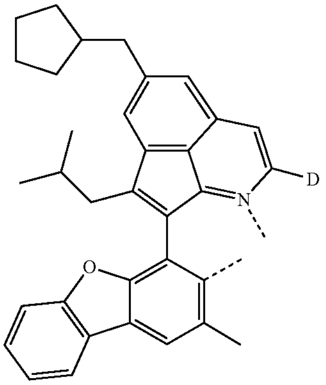
La118
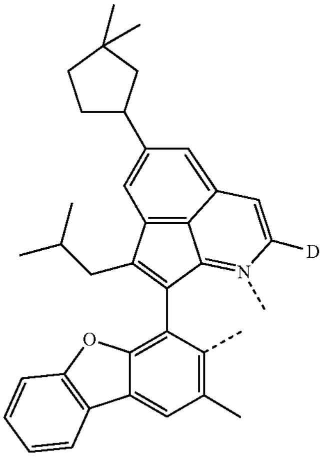

-continued

La119

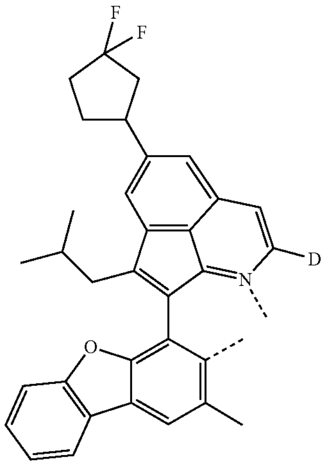

La120

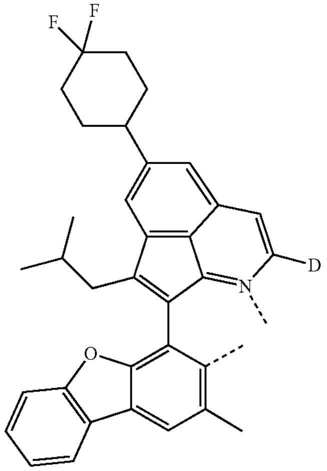

15. The organometallic compound according to claim 2, wherein the Lb has one of the following structural formulas, or one of the following structural formulas in which the hydrogen atom(s) is/are partially or completely deuterated, or one of the following structural formulas in which the hydrogen atom(s) is/are partially or completely fluorinated, Lb001

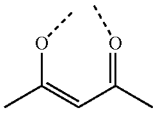

Lb002

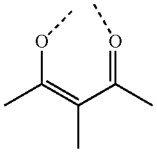

Lb003

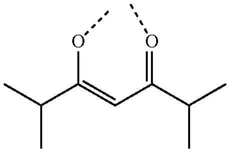

-continued

Lb004

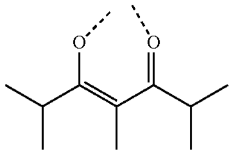

Lb005

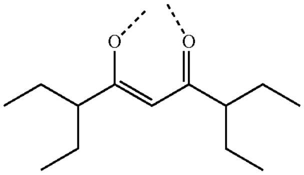

Lb006

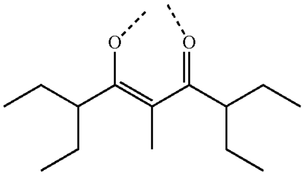

Lb007

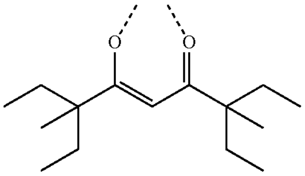

Lb008

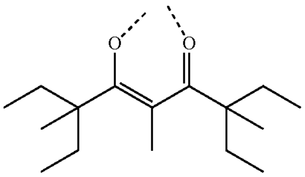

Lb009

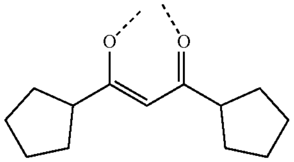

Lb010

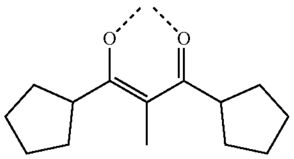

Lb011

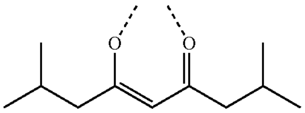

Lb012

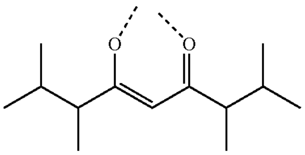

-continued
Lb013
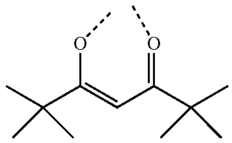
Lb014
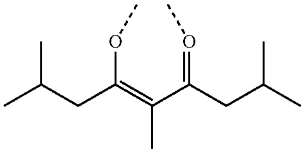
Lb015
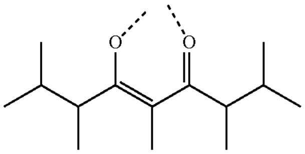
Lb016
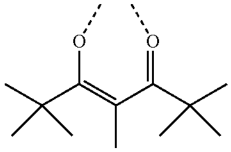
Lb017
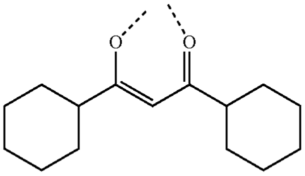
Lb018
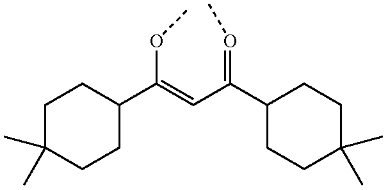
Lb019
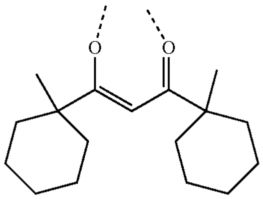
Lb020
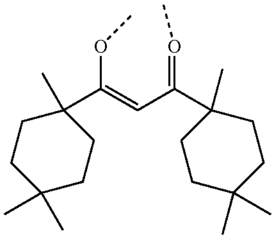
-continued
Lb021
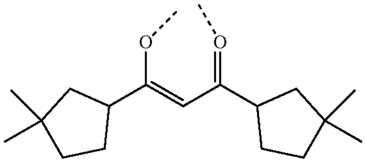
Lb022
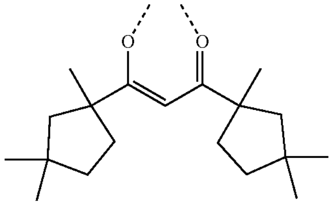
Lb023
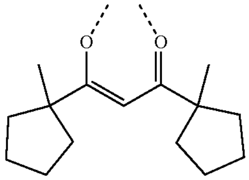
Lb024
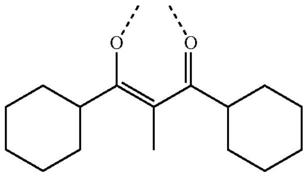
Lb025
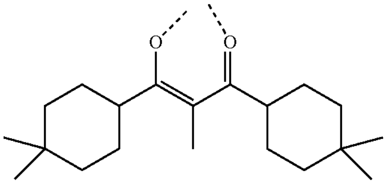
Lb026
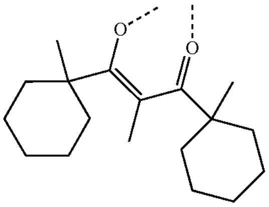
Lb027
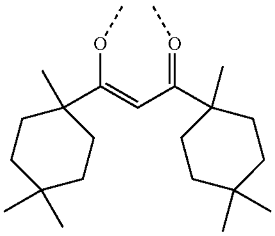
Lb028
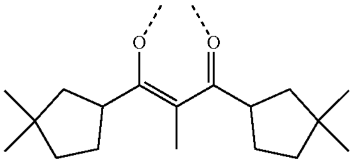

-continued
Lb029
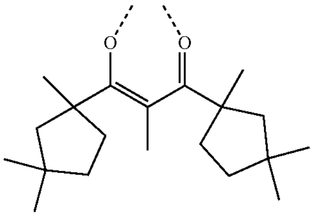
Lb030
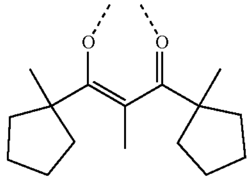
Lb031
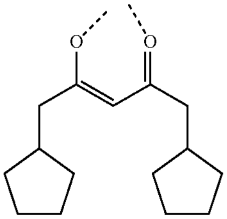
Lb032
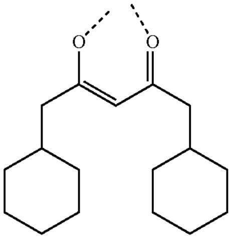
Lb033
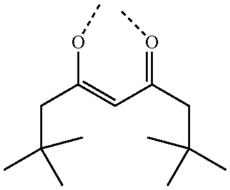
Lb034
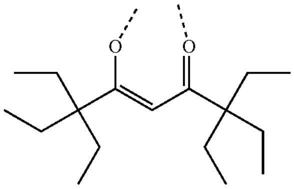
Lb035
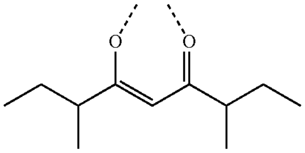
-continued
Lb036
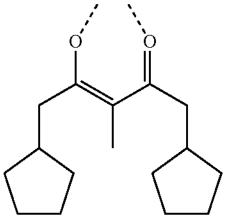
Lb037
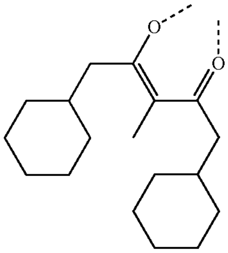
Lb038
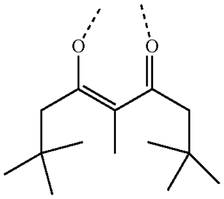
Lb039
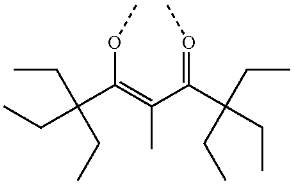
Lb040
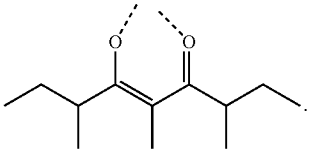
16. The organometallic compound according to claim 12, wherein the Lc has one of the following structural formulas, or is partially or completely deuterated or fluorinated correspondingly,
Lc001
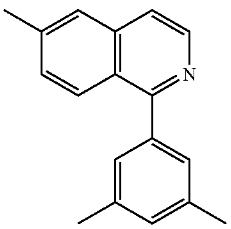

-continued
Lc002
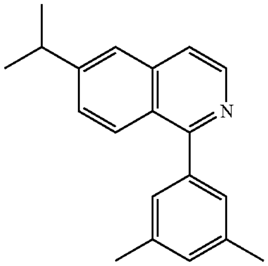
Lc003
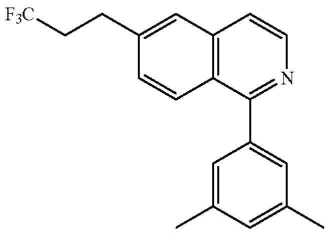
Lc004
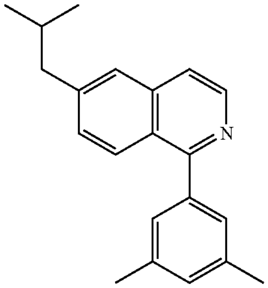
Lc005
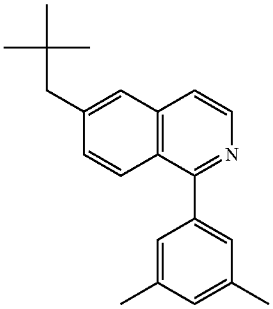
Lc006
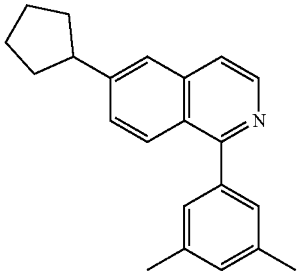
-continued
Lc007
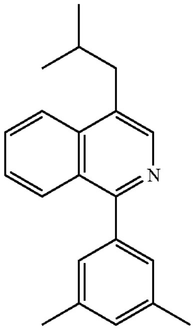
Lc008
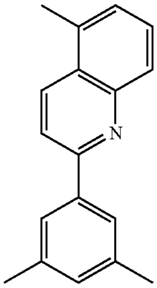
Lc009
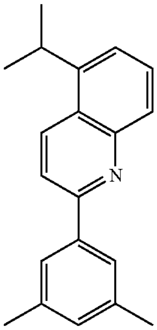
Lc010
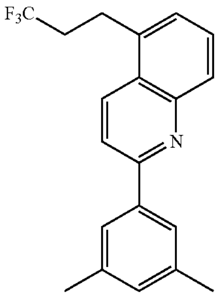
Lc011
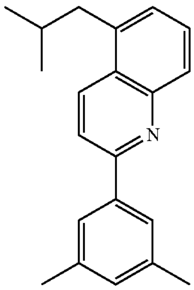

-continued
Lc012
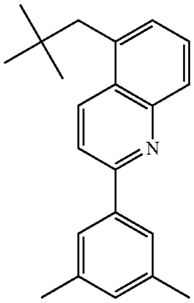
Lc013
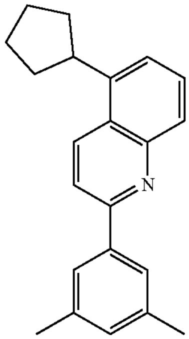
Lc014
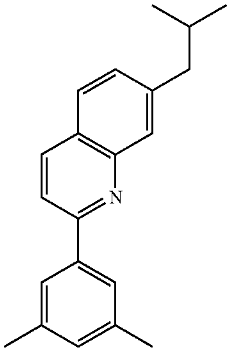
Lc015
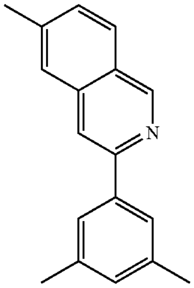
Lc016
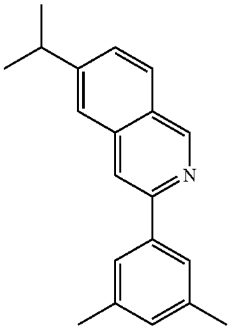
-continued
Lc017
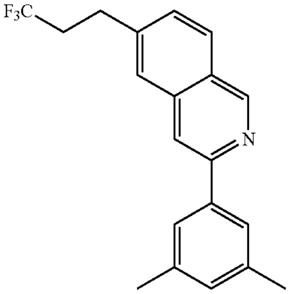
Lc018
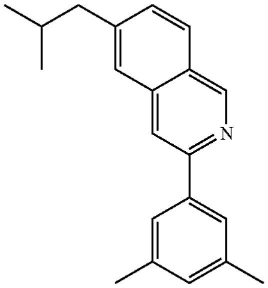
Lc019
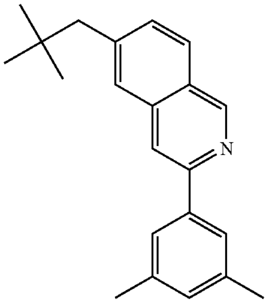
Lc020
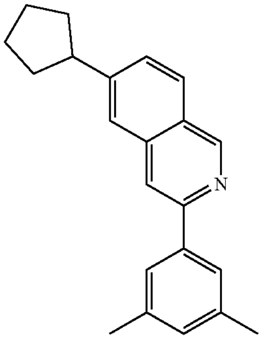

-continued
Lc021
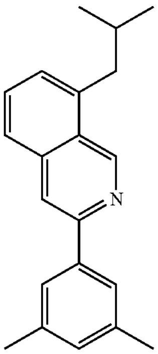
Lc022
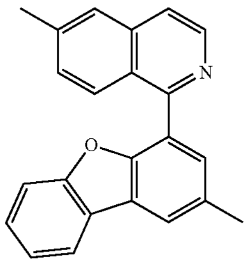
-continued
Lc023
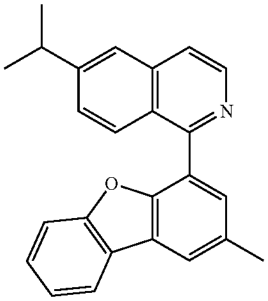
Lc024
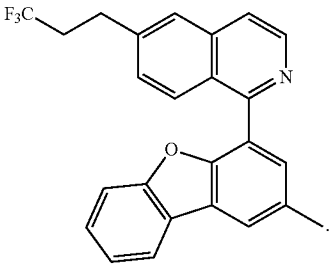
17. An organicelectroluminescent device, wherein the device comprises the organometallic compound of claim 1.
18. The organicelectroluminescent device of claim 17, comprising a light-emitting layer, wherein the light-emitting layer comprises the organometallic compound of claim 1.
* * * * *